(12) United States Patent
Dair et al.

(10) Patent No.: US 6,952,532 B2
(45) Date of Patent: Oct. 4, 2005

(54) METHOD AND APPARATUS FOR MULTIBOARD FIBER OPTIC MODULES AND FIBER OPTIC MODULE ARRAYS

(75) Inventors: Edwin Dair, Los Angeles, CA (US); Wenbin Jiang, Thousand Oaks, CA (US); Cheng Ping Wei, Gilbert, AZ (US)

(73) Assignee: JDS Uniphase Corporation, San Jose, CA (US)

( * ) Notice: Subject to any disclaimer, the term of this patent is extended or adjusted under 35 U.S.C. 154(b) by 661 days.

(21) Appl. No.: 09/833,107

(22) Filed: Apr. 10, 2001

(65) Prior Publication Data

US 2002/0028048 A1 Mar. 7, 2002

Related U.S. Application Data

(63) Continuation-in-part of application No. 09/321,308, filed on May 27, 1999.

(51) Int. Cl.$^7$ .............................................. H04B 10/00
(52) U.S. Cl. ........................ 398/139; 398/135; 385/92; 385/88
(58) Field of Search ............................... 398/135–139; 385/14, 88–92

(56) References Cited

U.S. PATENT DOCUMENTS

| | | |
|---|---|---|
| 3,792,284 A | 2/1974 | Kaelin |
| 3,809,908 A | 5/1974 | Clanton |
| 3,870,396 A | 3/1975 | Racki et al. |

(Continued)

FOREIGN PATENT DOCUMENTS

EP        0 652 696 A1    11/1994

OTHER PUBLICATIONS

Buczynski, et al., Fast Optical Thresholding with an Array of Optoelectronic Transceiver Elements, IEEE Photonics Technology Letters, vol. 11, No. 3, Mar. 1999.
Heinrich, et al., Low–Cost VCSEL–Transceiver Module for Optical Data Busses, IEEE, 1997.
Rosinskie, et al., Multichannel Transmission of a Mulitcore Fiber Coupled with Vertical–Cavity Surface–Emitting Lasers, Journal of Lightwave Tech, vol. 17, No. 5, May 1999.
Crow, et al., The Jitney Parallel Optical Interconnect, 1996 Electronic Components and Technology Conference.
R.T. Chen and P.S. Gulfoyle (Eds.) Optoelectronic Interconnects and Packaging, Critical Reviews, vol. CR62 (1996), pp. 48–63, 64–67, 229–243, 393–404, 405–414, 442–460, Spic Optical Engineering Press, Washington.

(Continued)

*Primary Examiner*—Jason Chan
*Assistant Examiner*—Agustin Bello
(74) *Attorney, Agent, or Firm*—Allen, Dyer, Doppelt, Milbrath & Gilchrist, P.A.

(57) ABSTRACT

Multiple board fiber optic modules and methods related thereto. Fiber optic modules include one or more vertical printed circuit boards and/or one or more horizontal printed circuit boards and/or one or more slanted printed circuit boards. The one or more printed circuit boards are parallel to optical axis of one or more optoelectronic devices such as a receiver or transmitter. The one or more printed circuit boards may include a ground plane to minimize electrical cross talk. A shielded housing or cover provides shielding for electromagnetic interference. The base or shielded housing or cover may include a septum to separate the fiber optic modules into a first side and a second side and provide additional shielding to minimize crosstalk. Horizontal, vertical, and NxN arrays of fiber optic channels in fiber optic modules. Fiber optic modules including a mini back plane for edge connecting printed circuit boards.

29 Claims, 68 Drawing Sheets

U.S. PATENT DOCUMENTS

| | | |
|---|---|---|
| 3,976,877 A | 8/1976 | Thillays |
| 4,149,072 A | 4/1979 | Smith et al. |
| 4,161,650 A | 7/1979 | Caouette et al. |
| 4,229,067 A | 10/1980 | Love |
| 4,273,413 A | 6/1981 | Bendikens et al. |
| 4,347,655 A | 9/1982 | Zory et al. |
| 4,432,604 A | 2/1984 | Schwab |
| 4,446,515 A | 5/1984 | Sauer et al. |
| 4,449,244 A | 5/1984 | Kopainsky |
| 4,461,537 A | 7/1984 | Raymer, II et al. |
| 4,493,113 A | 1/1985 | Forrest et al. |
| 4,533,209 A | 8/1985 | Segerson et al. |
| 4,534,616 A | 8/1985 | Bowen et al. |
| 4,535,233 A | 8/1985 | Abraham |
| 4,539,476 A | 9/1985 | Donuma et al. |
| 4,542,076 A | 9/1985 | Bednarz et al. |
| 4,549,782 A | 10/1985 | Miller |
| 4,549,783 A | 10/1985 | Schmachtenberg, III |
| 4,553,811 A | 11/1985 | Becker et al. |
| 4,580,295 A | 4/1986 | Richman |
| 4,595,839 A | 6/1986 | Braun et al. |
| 4,612,670 A | 9/1986 | Henderson |
| 4,625,333 A | 11/1986 | Takezawa et al. |
| 4,647,148 A | 3/1987 | Katagiri |
| 4,678,264 A | 7/1987 | Bowen et al. |
| 4,720,630 A | 1/1988 | Takeuchi et al. |
| 4,727,248 A | 2/1988 | Meur et al. |
| 4,807,955 A | 2/1989 | Ashman et al. |
| 4,840,451 A | 6/1989 | Sampson et al. |
| 4,844,581 A | 7/1989 | Turner |
| 4,856,091 A | 8/1989 | Taska |
| 4,881,789 A | 11/1989 | Levinson |
| 4,897,711 A | 1/1990 | Blonder et al. |
| 4,912,521 A | 3/1990 | Almquist et al. |
| 4,913,511 A | 4/1990 | Tabalba et al. |
| 4,945,229 A | 7/1990 | Daly et al. |
| 4,979,787 A | 12/1990 | Lichtenberger |
| 4,986,625 A | 1/1991 | Yamada et al. |
| 4,989,934 A | 2/1991 | Zavracky et al. |
| 5,005,939 A | 4/1991 | Arvanitakis et al. |
| 5,011,246 A | 4/1991 | Corradetti et al. |
| 5,039,194 A | 8/1991 | Block et al. |
| 5,043,775 A | 8/1991 | Lee |
| 5,093,879 A | 3/1992 | Bregman et al. |
| 5,099,307 A | 3/1992 | Go et al. |
| 5,104,243 A | 4/1992 | Harding |
| 5,109,453 A | 4/1992 | Edwards et al. |
| 5,109,454 A | 4/1992 | Okuno |
| 5,117,476 A | 5/1992 | Yingst et al. |
| 5,122,893 A | 6/1992 | Tolbert |
| 5,136,152 A | 8/1992 | Lee |
| 5,155,786 A | 10/1992 | Ecker et al. |
| 5,159,190 A | 10/1992 | Hohberg et al. |
| 5,168,537 A | 12/1992 | Rajasekharan et al. |
| 5,202,943 A | 4/1993 | Carden et al. |
| 5,241,614 A | 8/1993 | Ecker et al. |
| 5,259,054 A | 11/1993 | Benzoni et al. |
| 5,280,191 A | 1/1994 | Chang |
| 5,285,512 A | 2/1994 | Duncan et al. |
| 5,289,345 A | 2/1994 | Corradetti et al. |
| 5,295,214 A | 3/1994 | Card et al. |
| 5,337,391 A | 8/1994 | Lebby |
| 5,337,396 A | 8/1994 | Chen et al. |
| 5,337,398 A | 8/1994 | Benzoni et al. |
| 5,345,524 A | 9/1994 | Lebby et al. |
| 5,361,244 A | 11/1994 | Nakamura et al. |
| 5,414,787 A | 5/1995 | Kurata |
| 5,416,668 A | 5/1995 | Benzoni |
| 5,416,870 A | 5/1995 | Chun et al. |
| 5,416,871 A | 5/1995 | Takahashi et al. |
| 5,416,872 A | 5/1995 | Sizer, II et al. |
| 5,428,704 A | 6/1995 | Lebby et al. |
| 5,432,630 A | 7/1995 | Lebby et al. |
| 5,434,747 A | 7/1995 | Shibata |
| 5,446,814 A | 8/1995 | Kuo et al. |
| 5,452,387 A | 9/1995 | Chun et al. |
| 5,455,703 A | 10/1995 | Duncan et al. |
| 5,473,715 A | 12/1995 | Schofield et al. |
| 5,475,783 A | 12/1995 | Kurashima |
| 5,482,658 A | 1/1996 | Lebby et al. |
| 5,499,311 A | 3/1996 | DeCusatis |
| 5,499,312 A | 3/1996 | Hahn et al. |
| 5,515,468 A | 5/1996 | DeAndrea et al. |
| 5,528,408 A | 6/1996 | McGinley et al. |
| 5,535,296 A | 7/1996 | Uchida |
| 5,546,281 A | 8/1996 | Poplawski et al. |
| 5,548,677 A | 8/1996 | Kakii et al. |
| 5,550,941 A | 8/1996 | Lebby et al. |
| 5,561,727 A | 10/1996 | Akita et al. |
| 5,596,663 A | 1/1997 | Ishibashi et al. |
| 5,636,298 A | 6/1997 | Jiang et al. |
| 5,687,267 A | 11/1997 | Uchida |
| 5,708,743 A | 1/1998 | DeAndrea et al. |
| 5,717,533 A | 2/1998 | Poplawski et al. |
| 5,734,558 A | 3/1998 | Poplawski et al. |
| 5,736,782 A | 4/1998 | Schairer |
| 5,751,471 A | 5/1998 | Chen et al. |
| 5,767,999 A | 6/1998 | Kayner |
| 5,774,614 A | 6/1998 | Gilliland et al. |
| 5,778,127 A | 7/1998 | Gilliland et al. |
| 5,812,582 A | 9/1998 | Gilliland et al. |
| 5,812,717 A | 9/1998 | Gilliland et al. |
| 5,815,623 A | 9/1998 | Gilliland et al. |
| 5,864,468 A | 1/1999 | Poplawski et al. |
| 5,879,173 A | 3/1999 | Poplawski et al. |
| 6,061,493 A | 5/2000 | Gilliland et al. |
| 6,071,017 A | 6/2000 | Gilliland et al. |
| 6,086,265 A * | 7/2000 | Kuribayashi et al. ......... 385/92 |
| RE63,820 | 8/2000 | McGinley et al. |
| 6,369,924 B1 * | 4/2002 | Scharf et al. ............... 398/117 |

OTHER PUBLICATIONS

R.G. Hunsperger, Integrated Optics: Theory and Technology (2nd Ed.), 1985, pp. 89–106, 236–245, Springer–Verlag Berlin Heidelberg, Germany.

A. Chatak and K. Thyagarajan, Introduction to Fiber Optics, 1998, pp. 411–413, 447–449, 467–473, Cambridge University Press, United Kingdom.

R.C. Dorf, Electrical Engineering Handbook, 1993, pp. 1682–1684, CRC Press, Inc., Florida.

* cited by examiner

FIG. 2

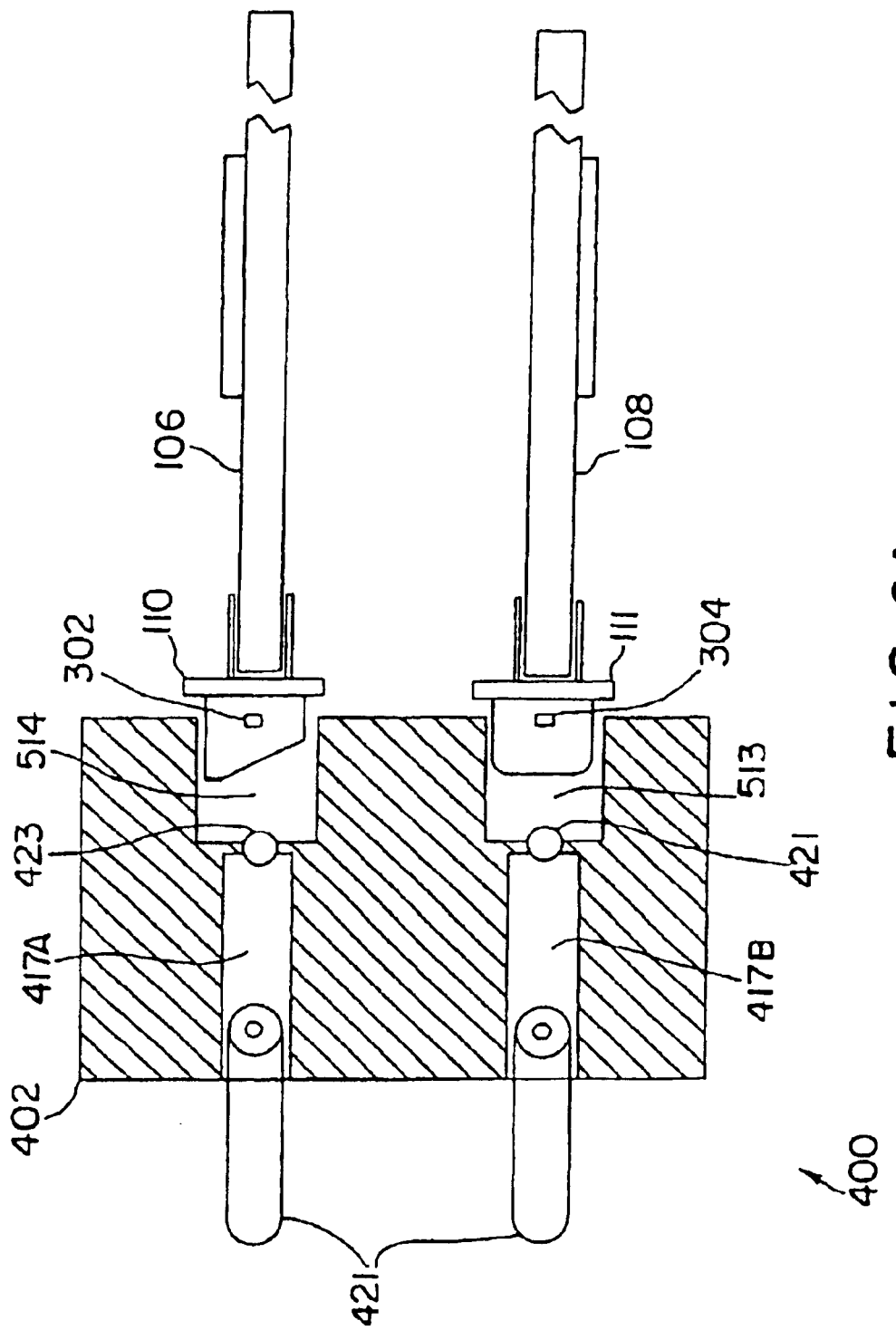

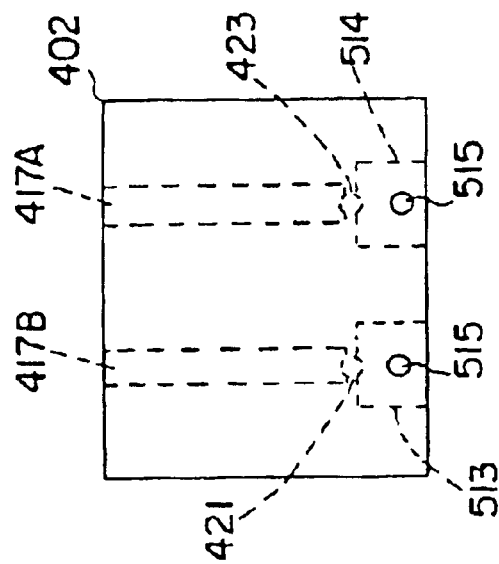
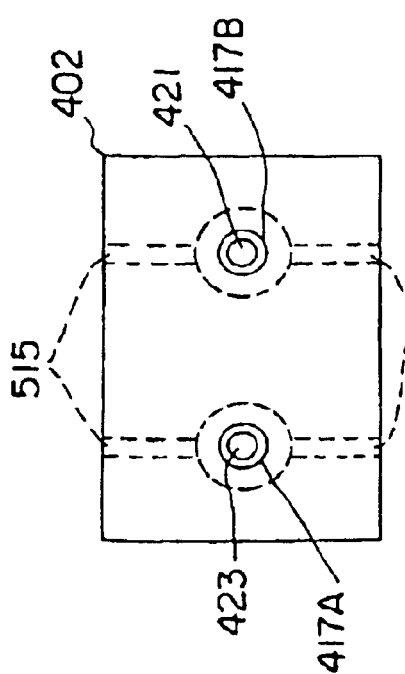
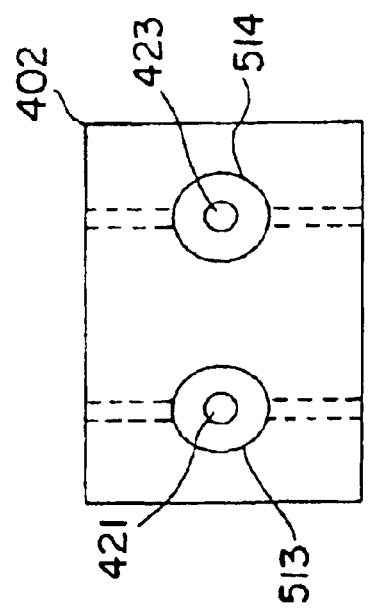

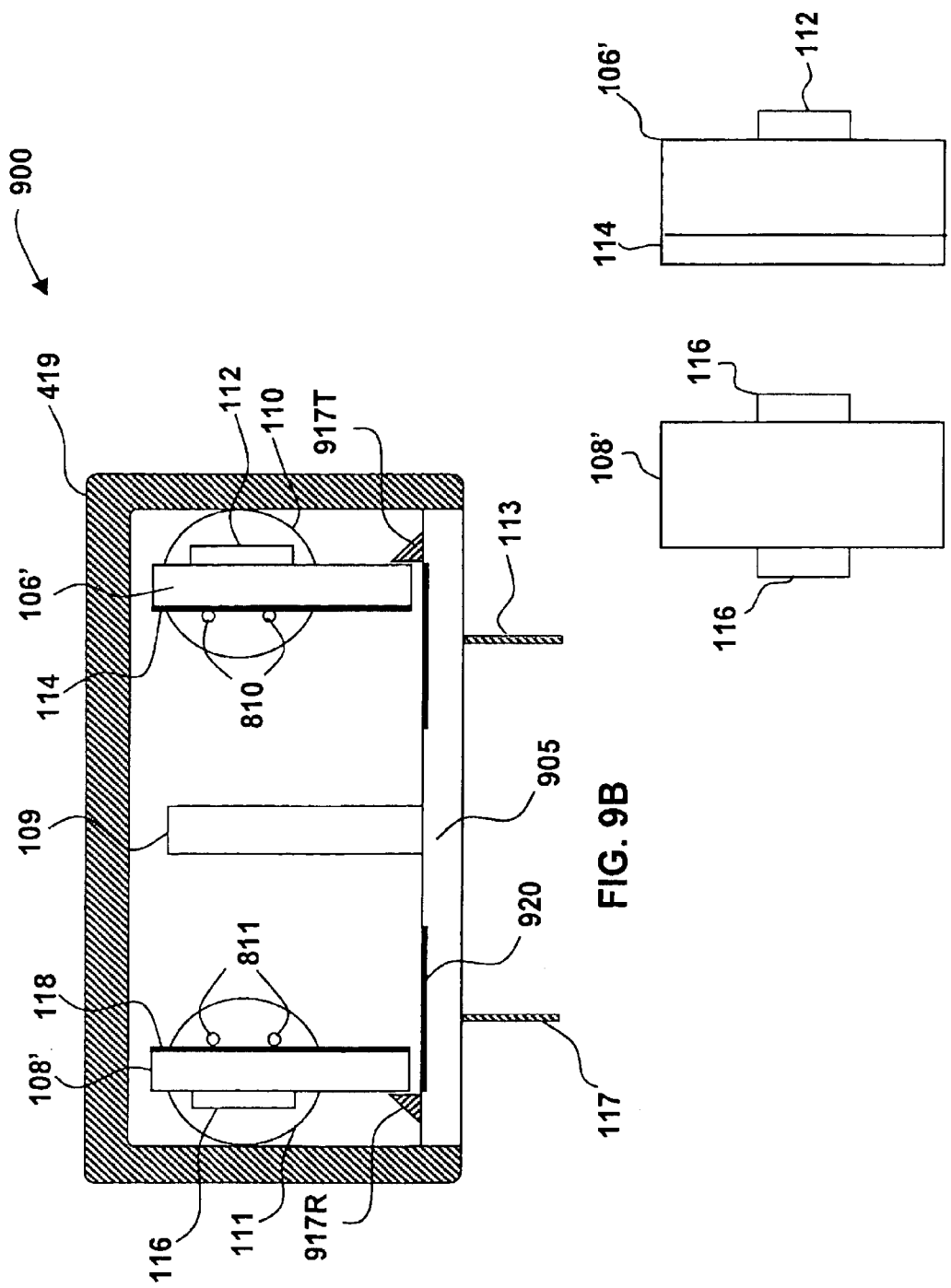

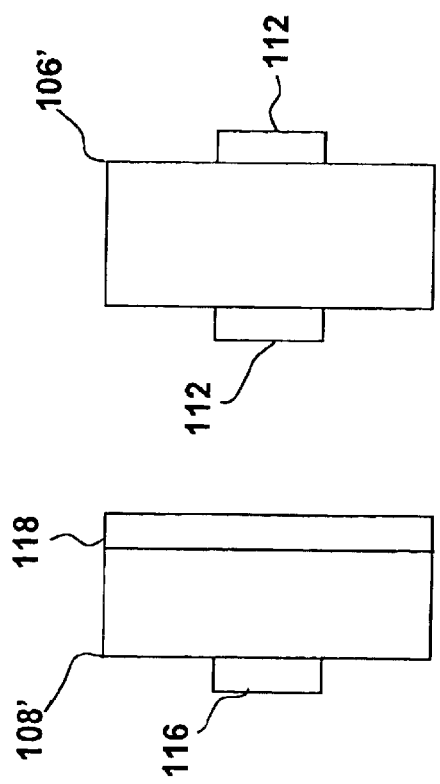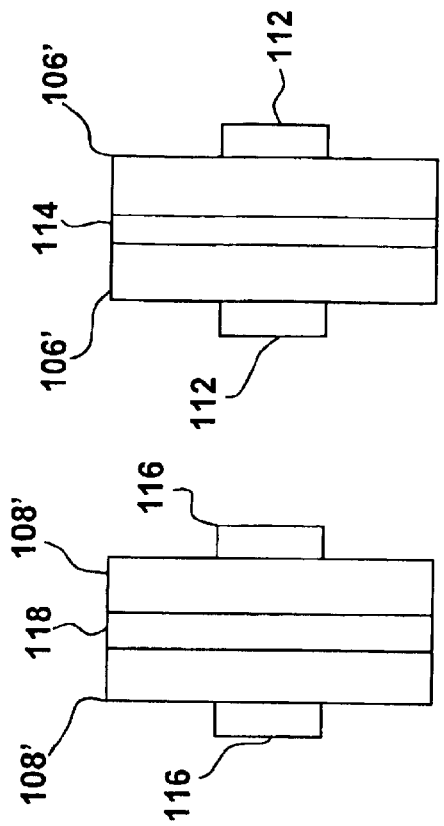
FIG. 9D
FIG. 9E

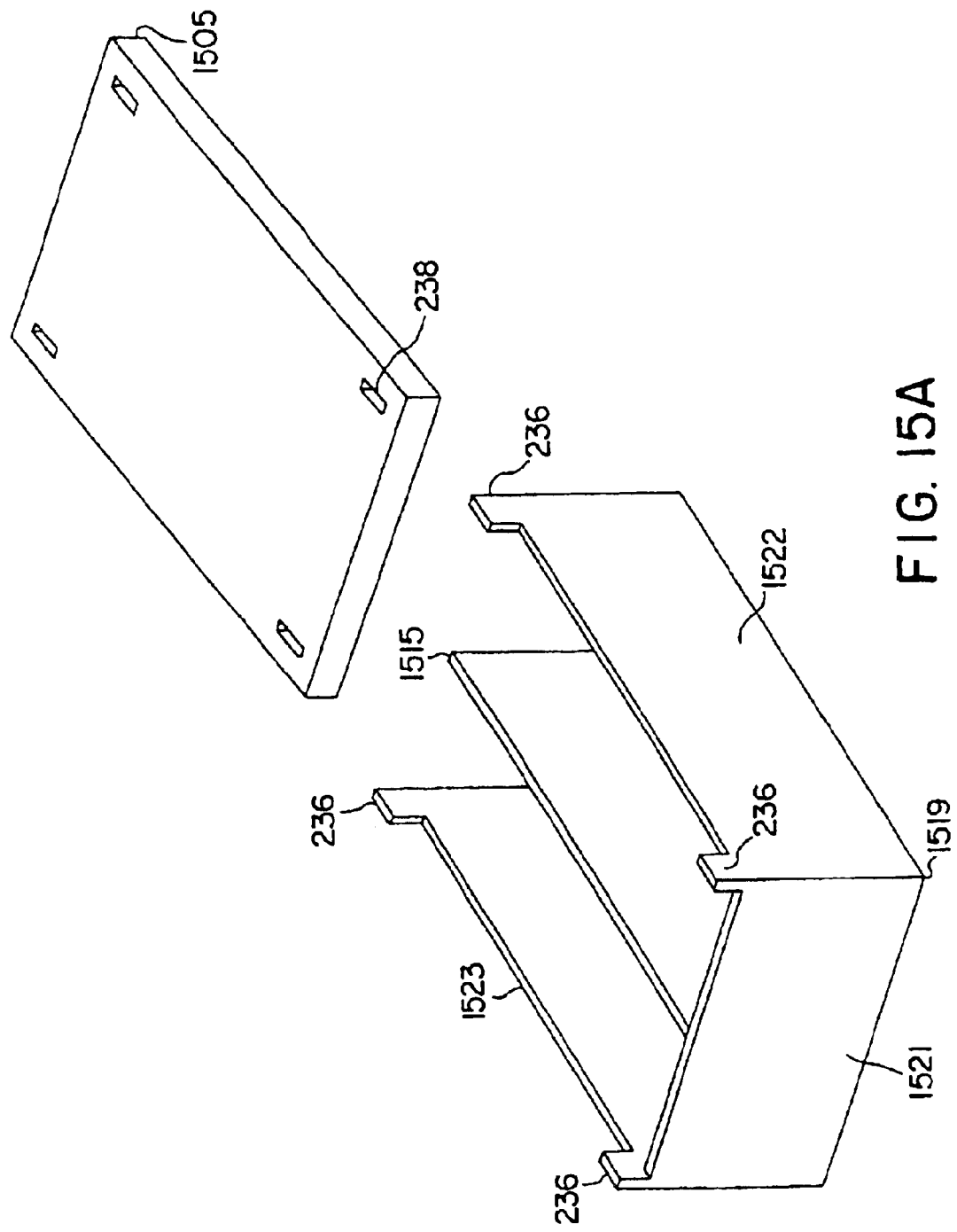

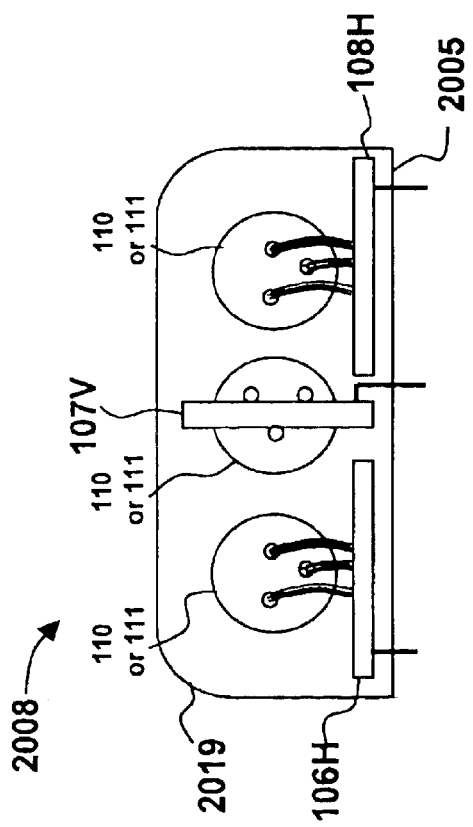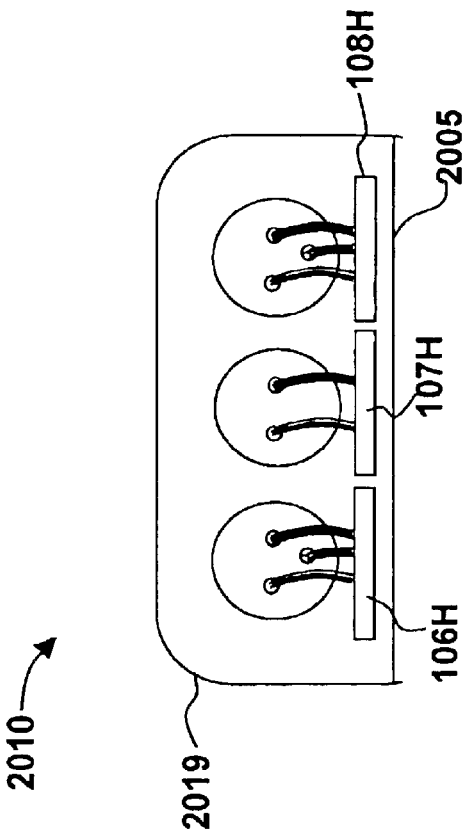

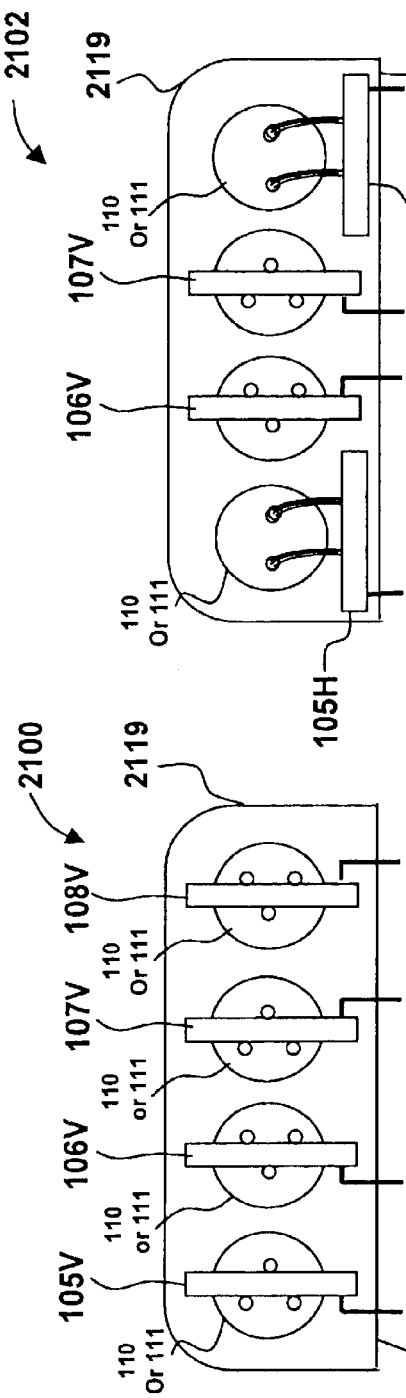

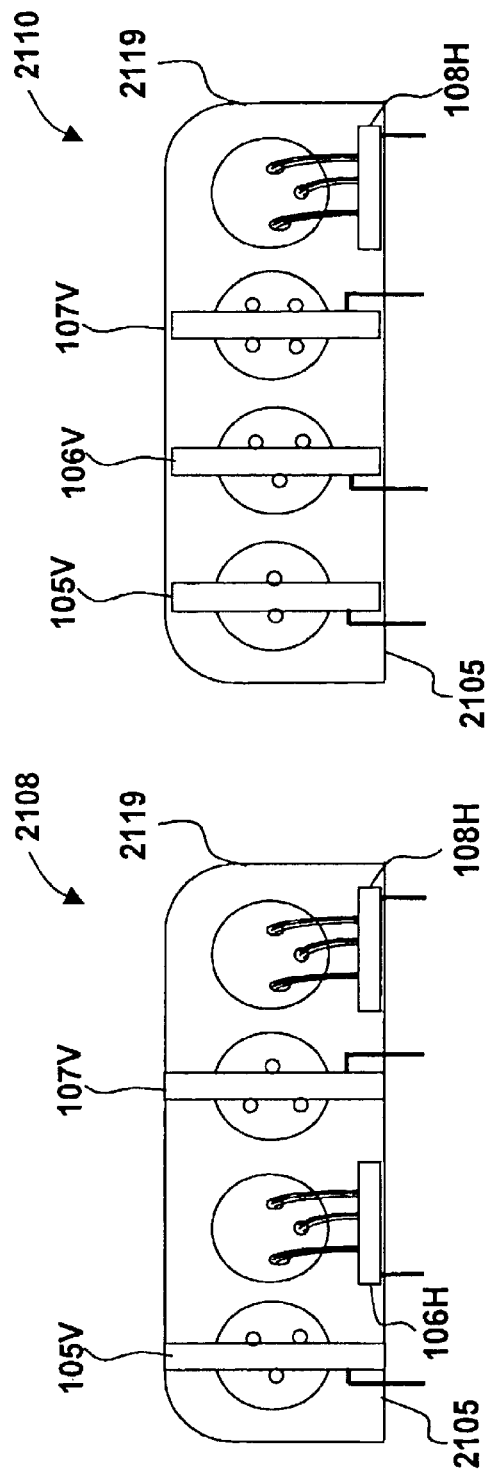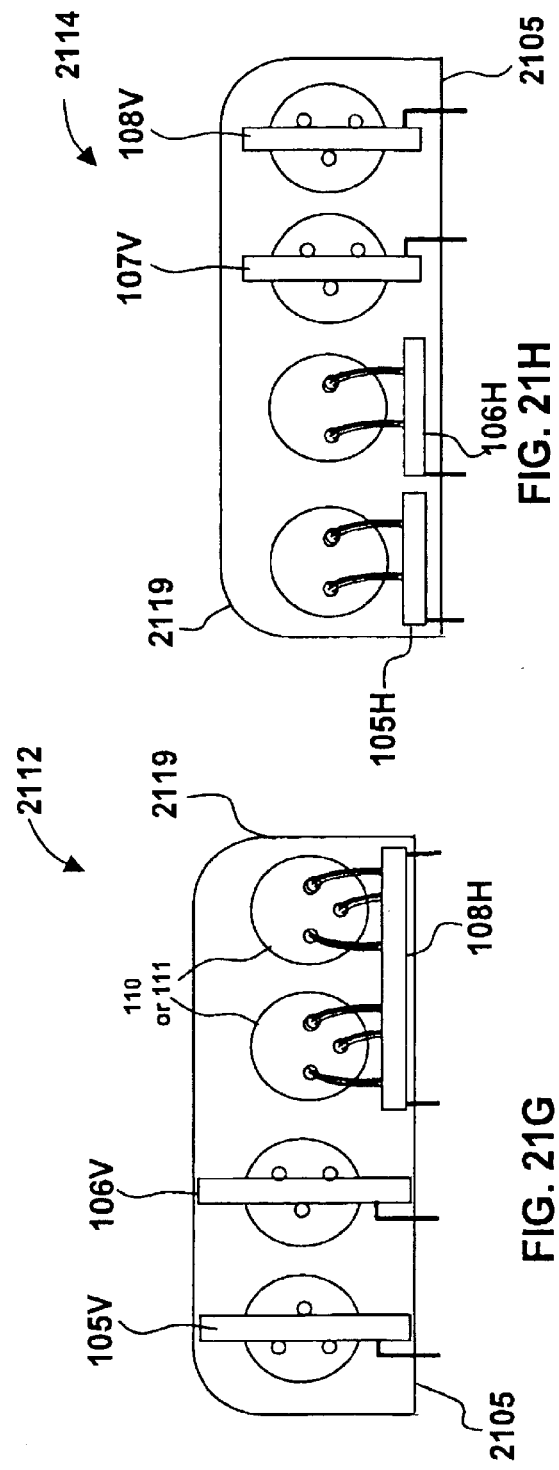

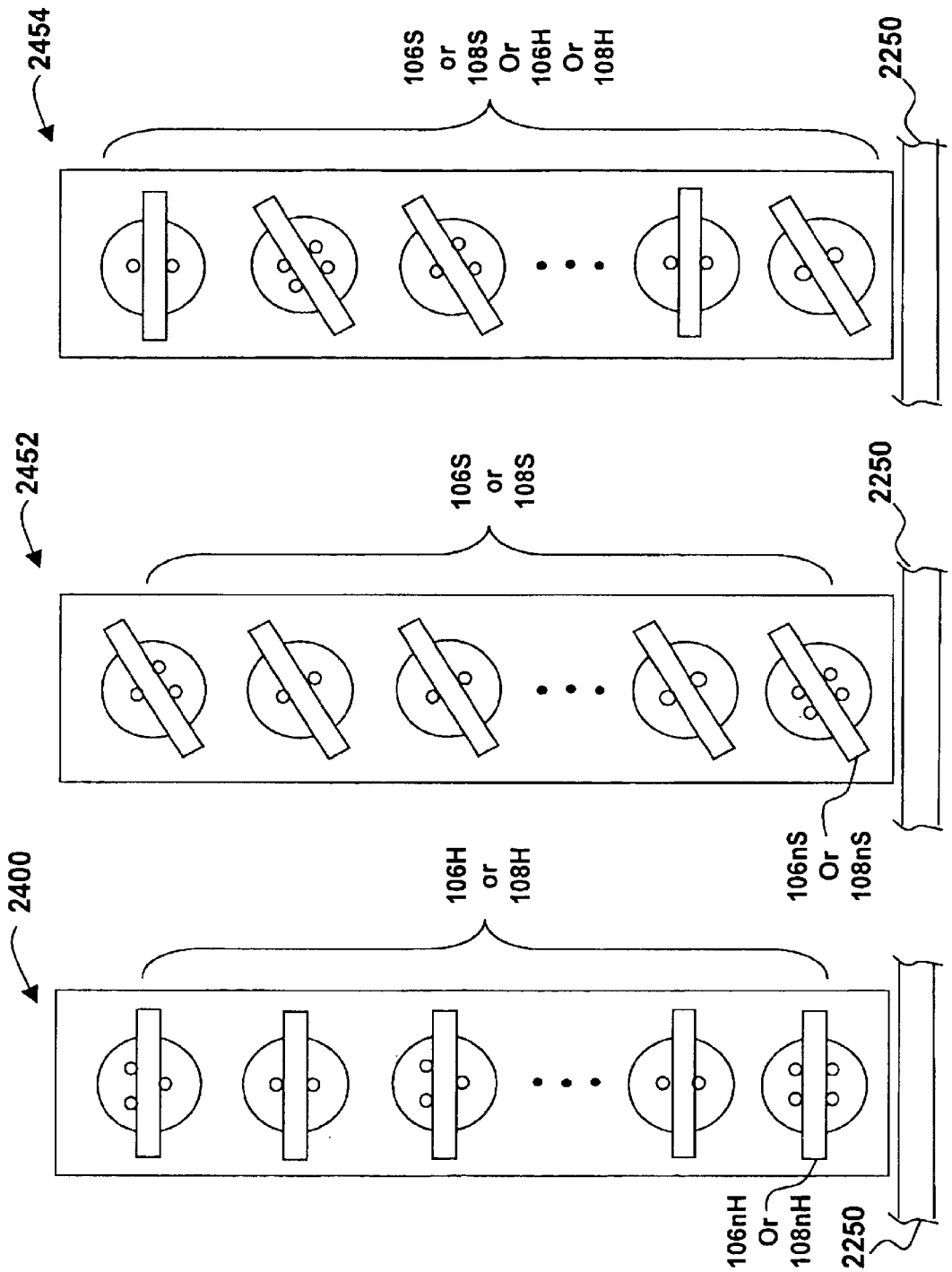

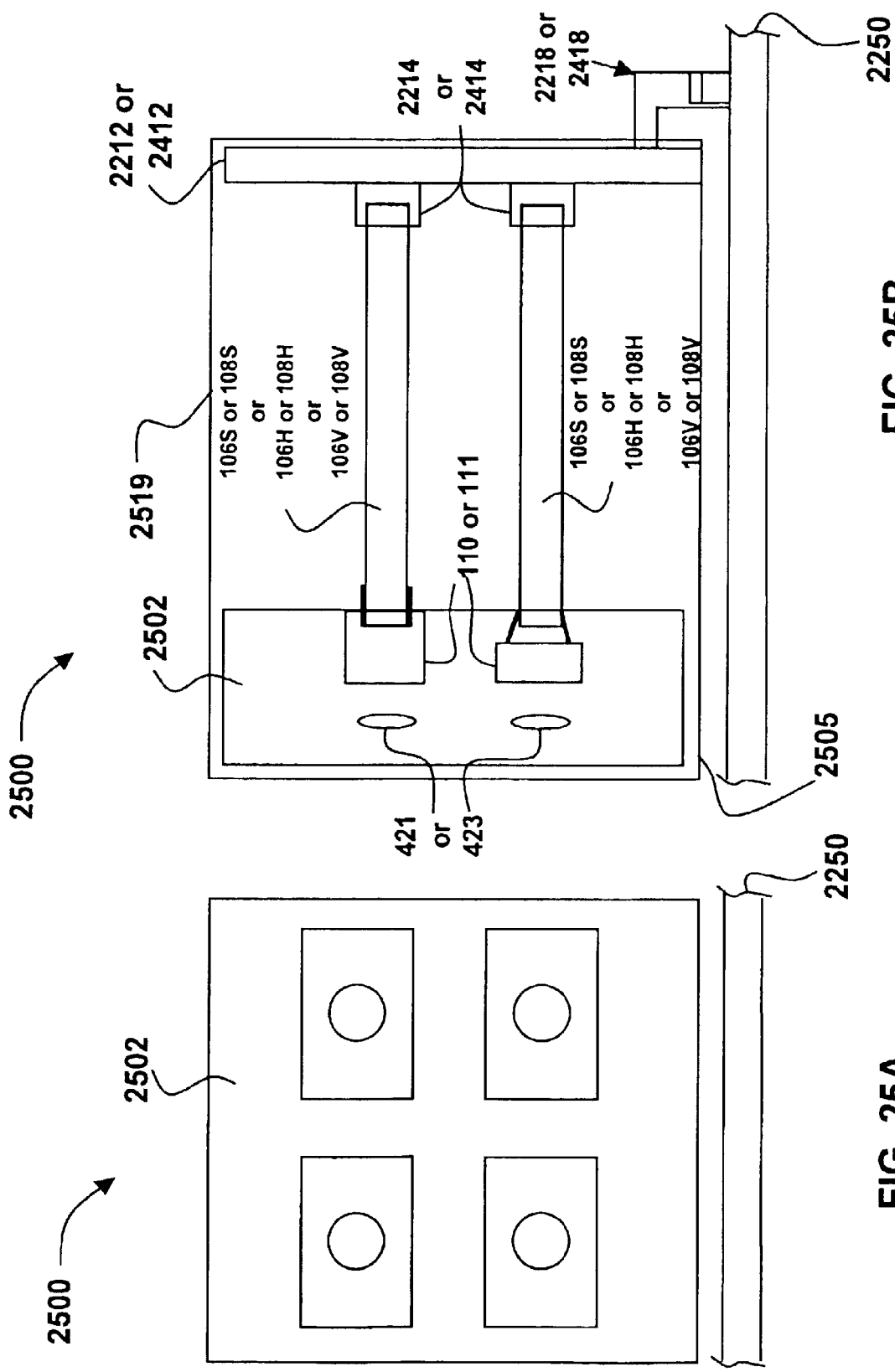

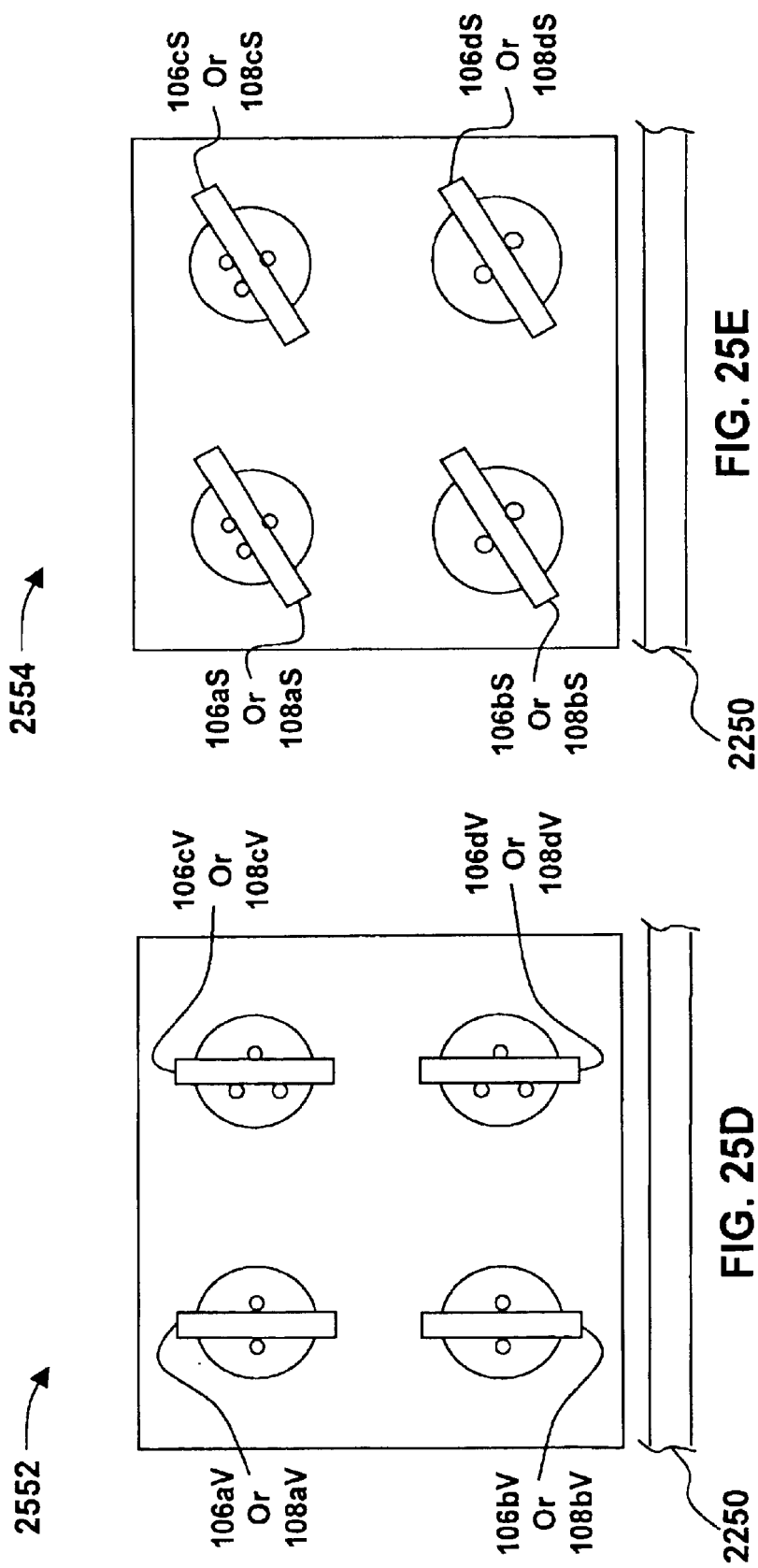

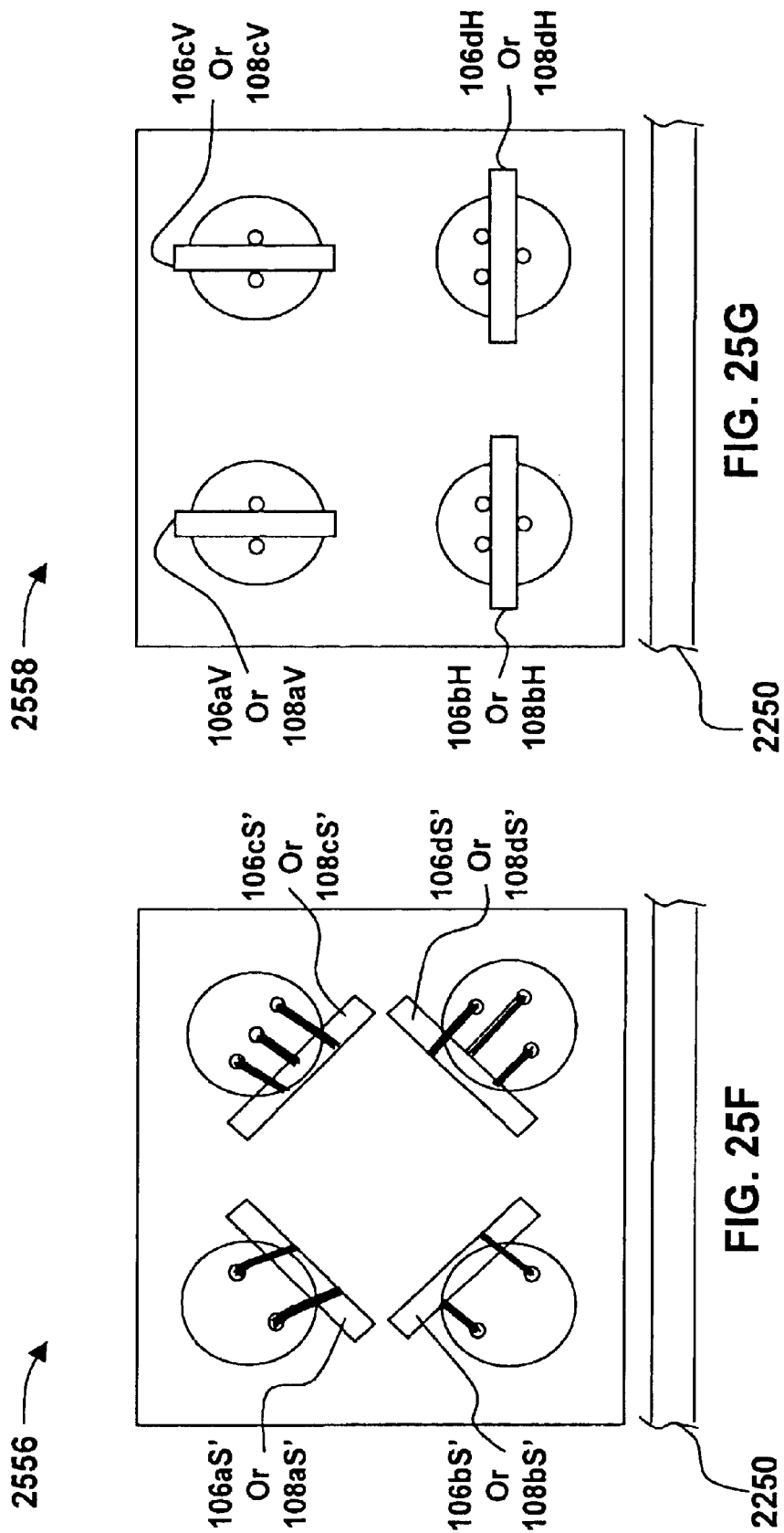

METHOD AND APPARATUS FOR MULTIBOARD FIBER OPTIC MODULES AND FIBER OPTIC MODULE ARRAYS

CROSS REFERENCE TO RELATED APPLICATIONS

This application is a continuation-in-part application and claims the benefit of U.S. application Ser. No. 09/321,308, filed May 27, 1999 by inventors Wenbin Jiang et al, both of which are to be assigned to E2O Communications, Inc.

This application is also related to U.S. application Ser. No. 09/320,409, filed May 26, 1999 by inventors Wenbin Jiang et al, now issued as U.S. Pat. No. 6,213,651; and U.S. application Ser. No. 09/816,319, filed Mar. 22, 2001 by inventors Wenbin Jiang et al, pending, both of which are also to be assigned to E2O Communications, Inc.

FIELD OF THE INVENTION

This invention relates to fiber optic modules.

BACKGROUND OF THE INVENTION

Fiber optic modules interface optical fibers to electronic circuitry transducing communication by light or photons with communication by electrical signals. A fiber optic module may be a fiber optic receiver, transmitter or transceiver including both receive and transmit functions. The fiber optic receiver, transmitter and transceiver each have optical elements (OE) and electrical elements (EE). The fiber optic transmitter OE includes an emitter (such as a semiconductor LED or Laser) mounted in a package and an optical coupling element for coupling light or photons from the OE into the optical fiber. The type of semiconductor laser (light amplification by stimulated emission of radiation) may be a vertical cavity surface emitting laser (VCSEL). The fiber optic receiver OE includes a photodetector (such as a photodiode) mounted in a package and an optical coupling element for coupling light or photons from the optical fiber into the photodetector. The EE for each includes integrated circuits and passive elements mounted on a substrate such as a printed circuit board (PCB) or ceramic. The OE and EE are connected electrically at the emitter and photodetector.

Because of the high transmission frequencies utilized in fiber optic communication, crosstalk between receive and transmit signals is of concern. Additionally, electromagnetic interference (EMI) is of concern due to the high frequency of operation of the fiber optic modules. In order to reduce EMI, shielding of the electrical components is required which is usually accomplished by attaching a metal shield to the substrate of the fiber optic module and connecting it to ground. In order to avoid electronic crosstalk and EMI, the fiber optic transceiver usually employs separate components and separate shielding of fiber optic receiver and fiber optic transmitter components. In order to avoid optical crosstalk where light or photons can interfere between communication channels, the fiber optic transceiver usually employs separate optical elements for coupling light or photons into and out of the optical fiber for fiber optic receiver and fiber optic transmitter. Using separate optical elements requires additional components and increases the costs of fiber optic transceivers. It is desirable to reduce the component count of fiber optic transceivers such that they are less expensive to manufacture.

The form factor or size of the fiber optic module is of concern. Previously, the fiber optic transceiver, receiver, and transmitter utilized horizontal boards or substrates which mounted parallel with a system printed circuit board utilized significant footprint or board space. The horizontal boards provided nearly zero optical crosstalk and minimal electronic crosstalk when properly shielded. However, the horizontal boards, parallel to the system printed circuit board, required large spacing between optical fiber connectors to make the connection to the optical fibers. While this may have been satisfactory for early systems using minimal fiber optic communication, the trend is towards greater usage of fiber optic communication requiring improved connectivity and smaller optical fiber connectors to more densely pack them on a system printed circuit board. Thus, it is desirable to minimize the size of system printed circuit boards (PCBs) and accordingly it is desirable to reduce the footprint of the fiber optic module which will attach to such system PCBs. Additionally, the desire for tighter interconnect leads of fiber optic cables, restricts the size of the OE's. For example, in the common implementation using TO header and can, the header dimension of the interconnect lead is normally 5.6 mm. In small form factor optical modules, such as the MT family, the two optical fibers are separated by a distance of only 0.75 mm. This severely restricts the method of coupling light or photons from the OE into and out of fiber optic cables.

BRIEF DESCRIPTIONS OF THE DRAWINGS

FIG. 2 is an exploded view of the first embodiment of the invention.

FIG. 6A is a cross-sectional view from the top of the optic block for embodiments of the invention.

FIG. 6B is a front side view of the optic block for the embodiments of the invention.

FIG. 6C is a back side view of the optic block for the embodiments of the invention.

FIG. 6D is a top side view of the optic block for the embodiments of the invention.

FIG. 9B is a rear cross sectional view of the assembled invention illustrated in FIG. 9A.

FIG. 9C illustrates an alternate embodiment of a single ground plane for a printed circuit board.

FIG. 9D illustrates an alternate embodiment of a single ground plane for a printed circuit board.

FIG. 9E illustrates an alternate embodiment of a ground plane sandwiched between layers in a multilayer printed circuit board.

FIG. 15A illustrates a bottom perspective view of an alternate embodiment of the shielded housing or cover and base of the invention.

FIGS. 20A–20F illustrate rear cross sectional views of assembled embodiments of the invention including a redundant transmitter or receiver channel.

FIGS. 21A–21H illustrate rear cross sectional views of alternate embodiments of the invention including multiple printed circuit boards.

FIGS. 24A–24J illustrate alternate embodiments of the horizontal array of fiber optics channels.

FIGS. 25A–25I illustrate rear cross sectional views of assembled alternate embodiments of the invention illustrated in FIGS. 25A–25C.

FIGS. 25A illustrates a front view of a 2×2 array of fiber optic channels for an assembled alternate embodiment of the invention.

FIG. 25B illustrates a cut-away side view of the invention of 25A.

FIG. 25C illustrates a rear cut-away view of the invention illustrated in FIG. 25A.

DETAILED DESCRIPTION OF THE PREFERRED EMBODIMENT

In the following detailed description of the invention, numerous specific details are set forth in order to provide a thorough understanding of the invention. However, it will be obvious to one skilled in the art that the invention may be practiced without these specific details. In other instances well known methods, procedures, components, and circuits have not been described in detail so as not to unnecessarily obscure aspects of the invention.

The invention includes a method, apparatus and system for method, apparatus and system for vertical board construction of fiber optic transmitters, receivers and transceivers. Briefly, fiber optic transmitter and receiver electrical elements are implemented on at least two separate printed circuit boards (PCBs) in a fiber optic module. The separate boards are arranged within the fiber optic module to reduce the footprint of the fiber optic module. In one embodiment, bending light or photons through ninety degrees, the light transmitter (a packaged type of emitter) and a light receiver (a packaged type of photodetector) are each mounted substantially perpendicular to the transmit and receive boards respectively such that their active areas are nearly facing each other but offset. A single optical block can be used to implement lenses and reflecting surfaces to minimize manufacturing costs. In one embodiment, the light receiver and light transmitter are mounted offset from each other in the optical block in order to avoid optical cross talk. In a second embodiment, the light transmitter (emitter) and the light receiver (photodetector) are each mounted substantially parallel with the transmit and receive boards respectively, the optical axis of transmitter and receiver and the connection to the optical fibers. The separate receive and transmit boards can be provided with ground planes in order to minimize electrical cross talk. Preferably the ground planes on the back sides of the printed circuit boards face each other. A module outer shielded housing or cover, manufactured out of metal or metal plated plastic, provides further shielding for EMI. The separate boards may be extended to support multiple channels or multiple parallel fibers such as in a ribbon optical fiber cable. Manufacturing steps of the boards for the fiber optic module are disclosed to provide reduced manufacturing costs.

Figure 1:
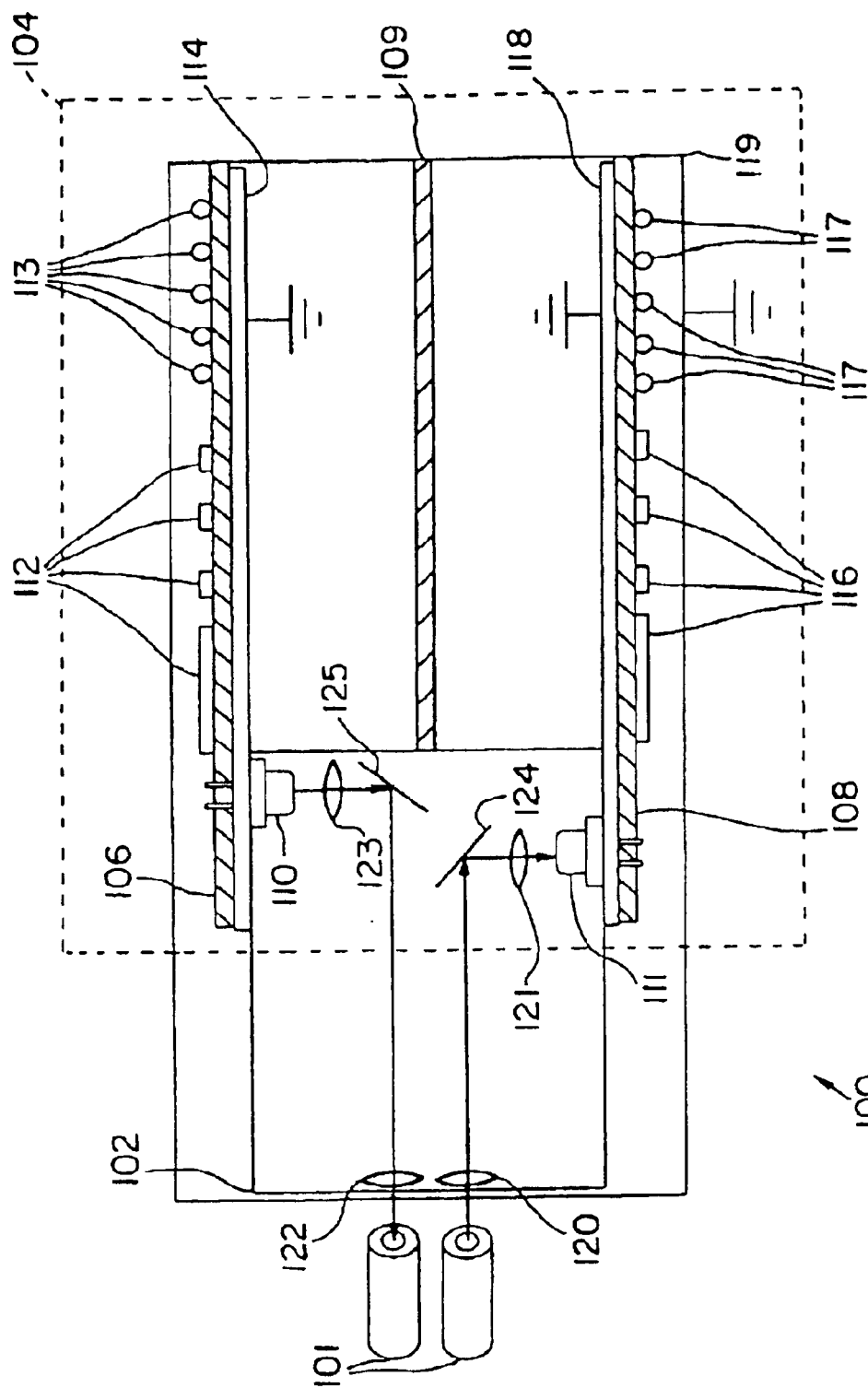
FIG. 1 is a simplified top cutaway view of a first embodiment of the invention.

Referring now to FIG. 1, a simplified cutaway view of the first embodiment of the invention is illustrated. FIG. 1 illustrates a fiber optic module 100 coupling to a pair of fiber optic cables 101. Fiber optic module 100 includes an optical block 102 and an electrical element 104. The optical block 102 may also be referred to as a nose, an optical port, an alignment block, an optical connector, an optical receptacle or receptacle. The optical block 102 can interface to an optical connector such as an LC, MT-RJ or VF-45 optical connector. The electrical element 104 includes a transmit printed circuit board (PCB) 106, a receive PCB 108, an optional internal shield 109, a light transmitter 110, a light receiver 111, and a shielded housing or cover 119. The light transmitter 110 and light receiver 111 are optoelectronic devices for communicating with optical fibers using light of various wavelengths or photons. An optoelectronic device is a device which can convert or transduce light or photons into an electrical signal or an electrical signal into light or photons. The transmitter 110 is a packaged emitter, that converts an electrical signal into emitting light or photons, such as a semiconductor laser or LED, preferably packaged in a TO can. The receiver 111 is a packaged photodetector, that detects or receives light or photons and converts it into an electrical signal, such as a photo diode, preferably package in a TO can. However other packages, housings or covers, or optoelectronic devices for receiving and transmitting light or photon may be used for the receiver 111 or transmitter 110.

Each of the optoelectronic devices, receiver 111 and transmitter 110, have terminals. In one embodiment, terminals of one or more optoelectronic devices couple to thruholes of the PCB 106 or PCB 108 or both. In another embodiment, terminals of one or more optoelectronic devices couple to an edge connector of the PCB 106 or PCB 108 or both. In one embodiment, the transmit PCB 106 includes electrical components 112 (transmitter integrated circuit (laser driver), resistors, capacitors and other passive or active electrical components), pins 113, and a ground plane 114. The electrical components 112 control the transmitter 110 and buffer the data signal received from a system for transmission over an optical fiber. In one embodiment, the receive PCB 108 includes electrical components 116 (receiver integrated circuit (transimpedance amplifier and post amplifier), resistors, capacitors and other passive or active electrical components), pins 117, and a ground plane 118. The electrical components 116 control the receiver 111 and buffer the data signal received from an optical fiber. The ground planes 114 and 118 and the shielded housing or cover 119 are coupled to ground. In another embodiment, a pin header consisting of a dielectric medium that is molded over a plurality of pins, is used to couple to through holes in the PCB 108 or PCB 106. The electrical components 116 and pins 117 are sandwiched between the ground plane 118 and the shielding 119 to shunt electromagnetic fields to ground and avoid crosstalk in the receive PCB 108. Electrical components 112 and pins 113 are sandwiched between the ground plane 114 and the shielded housing or cover 119 to shunt electromagnetic fields generated by these components to ground and avoid crosstalk in the transmit PCB 106. Optional internal shielding 109 further provides additional crosstalk protection between printed circuit boards. If ground planes 114 and 118 are not used, then internal shielding 109 is required to reduce the electromagnetic fields that may be generated.

The optical block 102 includes lenses 120–123 and reflectors 124–125. Lenses 120–123 may be any collimating lenses including aspheric lenses, ball lenses, and GRIN lenses. Lenses 121–123 may be symmetric (circular symmetry) or asymmetric to provide optical steering. Lens 123 is for collimating the light or photons diverging from the transmitter 110 and lens 122 is for focussing the collimated light or photons into an optical fiber. Lens 120 is for collimating the light or photons diverging out from the end of an optical fiber and lens 121 is for focusing the collimated light or photons into the receiver 111. Reflectors 124–125 may be facets formed in the optical block having angles to provide total internal reflection between the optical block material and the atmosphere. Preferably they are forty five degree angle facets. Alternatively, they may be facets coated with a reflective surface or mirror surface to reflect light or photons off the reflective coated surface or facets having an optical grating surface to reflect photons. The optical block 102 is preferably constructed of a thermoplastic or polycarbonate which is clear to the desired wavelengths of light or photons. The reflectors 124–125, lenses 120–123 and other elements of the optical block 102 described below are preferably formed through injection molding of the desired material.

Figure 2:
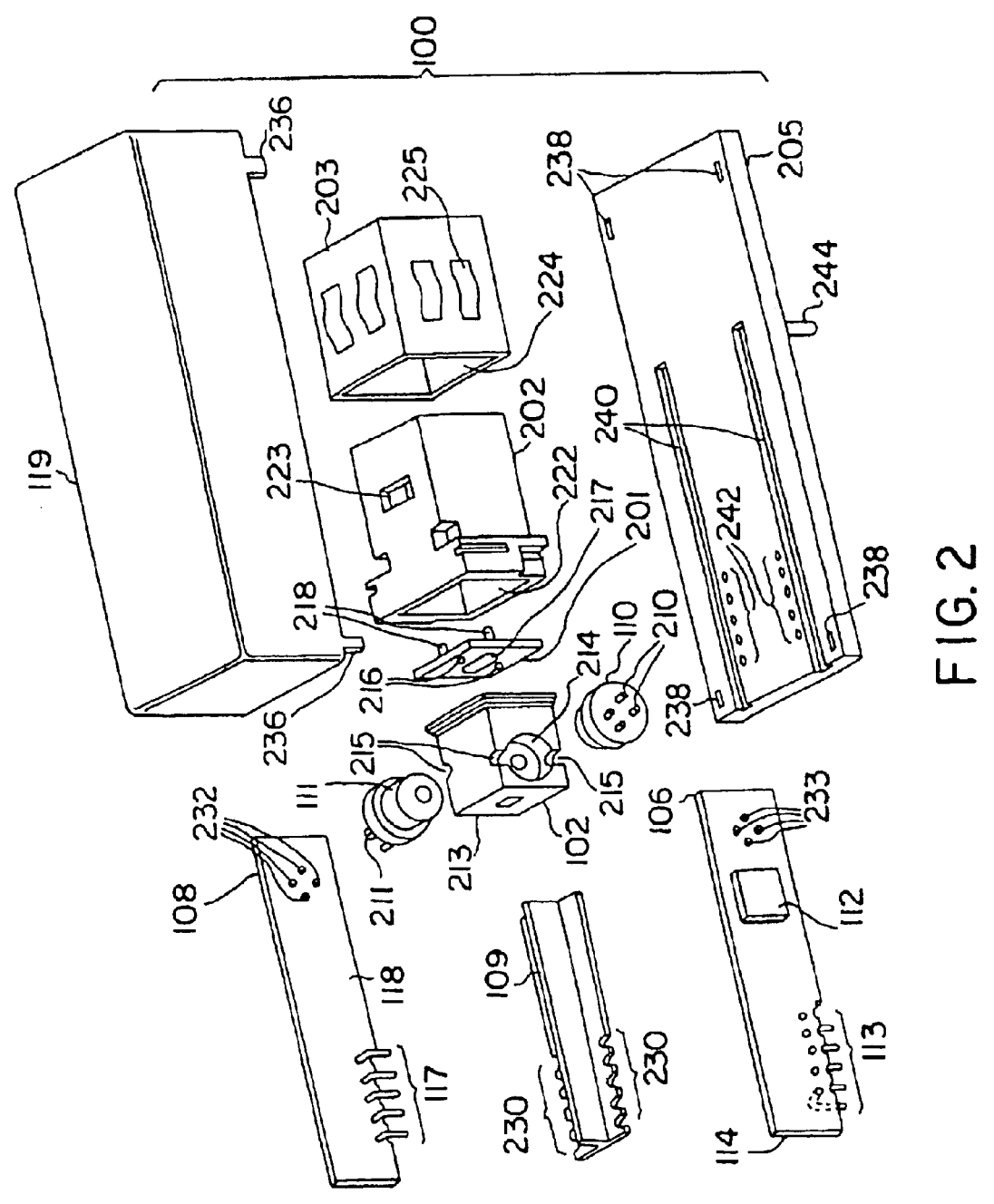

Referring to FIG. 2, an exploded diagram of the fiber optic module 100 is illustrated and its assembly is described.

Transmitter 110 is inserted into an opening 214 in the optical block 102. Receiver 111 is inserted into an opening 213 in optical block 102. An epoxy is injected into top and bottom tacking holes 215 in order to hold the transmitter 110 and receiver 111 in openings 214 and 213 respectively. An MT alignment plate 201 has optical block alignment holes 216, an optical opening 217 and fiber optic connector alignment pins 218 for alignment purposes. The optical block holes 216 couple to optical block alignment pins in the optical block 102, not illustrated in FIG. 2. The fiber optic connector alignment pins 218 are for aligning optical fibers that couple to the fiber optic module 100.

For coupling to a fiber optic connector, the fiber optic module 100 has a nose 202 and a nose shield 203. The nose 202 includes a optical fiber opening 222 and a latch opening 223. The latch opening 223 receives the optical fiber connector and holds the optical fiber substantially fixed in place and aligned with the optical opening 217 of the alignment plate 201. The nose shield 203 includes an opening 224 for insertion over the nose 202 and shield tabs 225 for coupling to the ground plane of the package. The nose shielding 203 further reduces EMI.

After assembling the nose pieces to the optical block 102, the transmitter 110 and receiver 111 may be aligned to provide optimal light or photon output and reception. Alignment of the transmitter 110 and receiver 111 in optical block 102 is performed by active alignment where the receiver 111 and transmitter 110 are powered up to detect and emit photons. The receiver 111 and transmitter 110 are properly aligned in the optical block 102 to provide maximum photon detection from or coupling into fiber 101. The tacking holes 215 extend into the openings 213 and 214 such that epoxy may poured in to hold the optoelectronic devices to the optical block. After alignment is complete, the epoxy is UV cured and allowed to set such that the receiver 111 and transmitter 110 are substantially coupled to the optical block 102.

After the epoxy has set, the receive PCB 108 and the transmit PCB 106 may be attached to the receiver 111 and transmitter 110 respectively. Receiver thruholes 232 in the receive PCB 108 are aligned and slid over terminals 211 of the receiver 111. The terminals 211 are then soldered to make an electrical connection on the component side (opposite the side of the ground plane 118) of the receive PCB 108. Transmitter thruholes 233 in the transmit PCB 106 are aligned and then slid over the terminals 210 of the transmitter 110. The terminals 210 are then soldered to make an electrical connection on the component side (opposite the side of the ground plane 114) of transmit PCB 106. Ground planes 114 and 118 have sufficient material removed around the transmitter thruholes 233 and the receiver thruholes 232 respectively to avoid shorting the terminals of the transmitter 110 and receiver 111 to ground.

After coupling the PCBs 108 and 106 to the receiver 111 and transmitter 110 respectively, the assembly is inserted into the shielded housing or cover 119. The optional internal shield 109 is next assembled into the shielded housing or cover 119 between the PCBs 106 and 108. The optional internal shield 109 has pin slots 230 to surround the pins 113 and 117 and avoid shorting thereto.

The shielded housing or cover 119 includes clips or tabs 236 at each corner for mating to a base 205. The base 205 includes PCB slots 240, clip openings or slots 238 into which the clips or tabs 236 may be inserted, and base pin holes 242 into which the PCB pins 113 and 117 may be inserted. The base 205 includes a guide post 244 for mounting the fiber optic module into a system printed circuit board. The bottom of the base mounts parallel to the printed circuit board of the system such that when horizontal, the receive PCB 108 and the transmit PCB 106 are vertical and substantially perpendicular in reference to the printed circuit board of the system and the base 205. Next in assembly, the base 205 has its base pin holes 242 slid over the PCB pins 113 and 117, the printed circuit boards 106 and 108 are guided to mate with the PCB slots 240, and the clips or tabs 236 of the shielded housing or cover 119 are guided into the clip openings or slots 238. The receive PCB pins 113 and the transmit PCB pins 117 are vertical and substantially perpendicular in reference to the printed circuit board of the system and the base 205. After coupling the base 205 to the shielded housing or cover 119, the clips or tabs 236 are bent, twisted, or otherwise changed in order to hold the base 205 in place. As an alternative to clips or tabs 236 and clip openings or slots 238, the shielded housing or cover 119 may use plastic clips, or a ridge, integrated into each side that couples to base 205 appropriately. The shielded housing or cover 119, which is coupled to ground, encases the PCBs 106 and 108 to reduce the electro-magnetic fields generated by the electrical components coupled thereto by shunting the electric fields to ground to reduce electromagnetic interference (EMI).

Figure 3A:
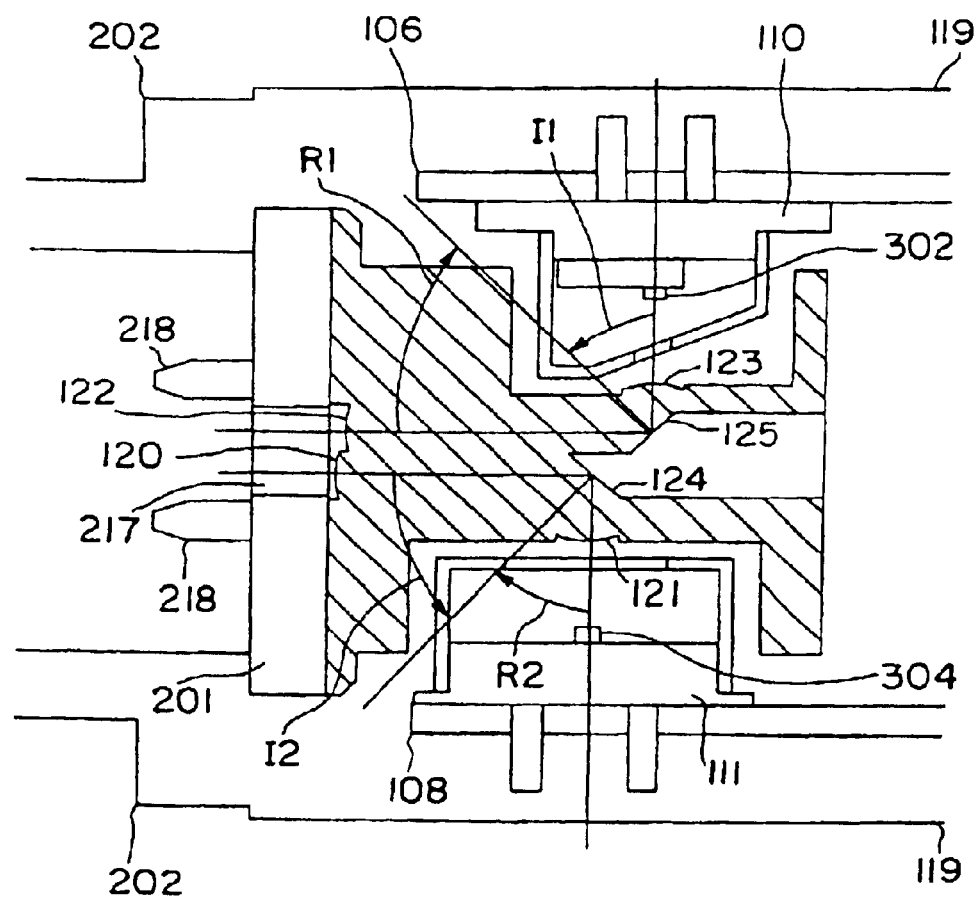
FIG. 3A is a cross-sectional view from the top of the optic block for the first embodiment of the invention.

Referring now to FIG. 3A, a cross-sectional view of the optical block 102 for the first embodiment is illustrated. The transmitter 110, the receiver 111, and the MT alignment plate 201 are coupled to the optical block 102. The light transmitter 110 includes an emitter 302 for generation of light or photons in response to electrical signals from the transmit PCB 106. The light receiver 111 includes a detector 304 to receive light or photons and generate electrical signals in response to light or photons coupled thereto. Light or photons emitted by the emitter 302 are coupled into lens 123 and collimated onto the reflector 125 at an incident angle I1 (angle with the perpendicular to reflector 125 surface) preferably of substantially forty five degrees. Reflector 125 reflects the incident light or photons on a refraction angle R1 (angle with the perpendicular to reflector 125 surface) equivalent to incident angle I1 preferably of substantially forty five degrees. The reflected light or photons preferably travel perpendicular to the incident light or photons towards the lens 122. Lens 122 focuses the light or photons from the emitter 302 into an aligned optical fiber through the optical port 217 in the MT alignment plate 201. Thus, light or photons coupled or launched into an optical fiber, defining a first optical axis, are preferably substantially perpendicular to the light or photons emitted and incident upon lens 123 from the emitter 302 of the transmitter 110.

Light or photons, incident from a fiber optic cable coupled to the fiber optic module 100, is received through the optical port 217 of the MT alignment plate 201. Light or photons from the fiber optic cable are aligned to be incident upon the lens 120. Lens 120 collimates the incident light or photons from a fiber optic cable onto the reflector 124 at an incident angle I2 of preferably substantially forty five degrees. Reflector 124 reflects incident light or photons at a refractive angle R2 equivalent to incident angle I2 of preferably substantially forty five degrees towards lens 121. Lens 121 focuses the light or photons received from a fiber optical cable onto the detector 304. Light or photons incident from a fiber optic cable, defining a second optical axis, are preferably substantially perpendicular to the light or photons incident upon the detector 304.

Figure 3I:
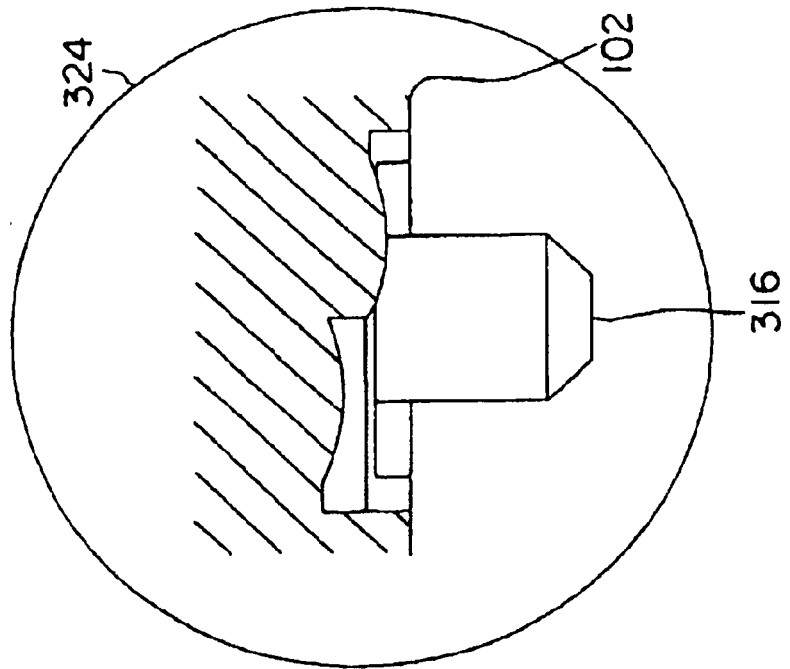
FIG. 3I is a magnified cross-sectional view of the alignment post of the optic block.
Figure 3B:
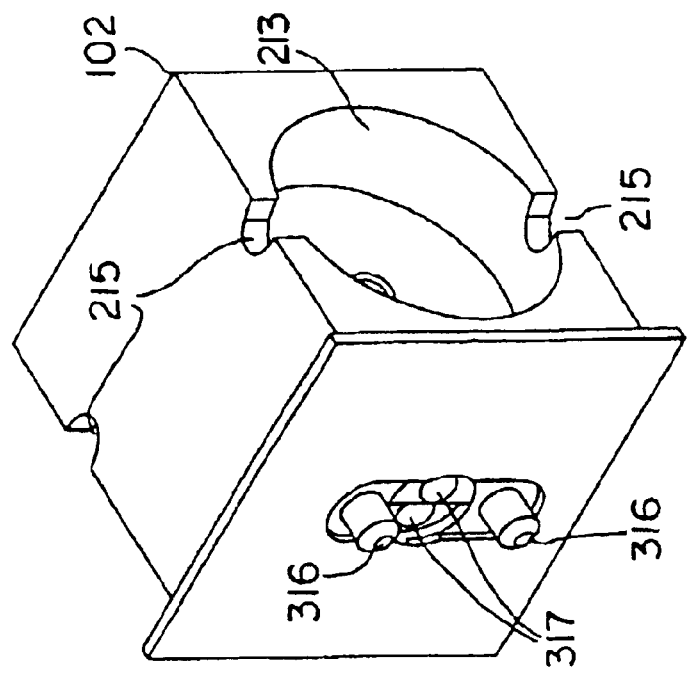
FIG. 3B is a front side perspective view from the left of the optic block for the first embodiment of the invention.

FIG. 3B illustrates a frontal perspective view from the left side of the optical block 102. The front side of the optical block 102 includes optical block alignment pins 316 and an optical output opening 317. The optical block alignment pins 316 couple to the alignment holes 216 of the alignment plate 201 such that the optical output opening 317 is aligned with the optical port 217 in the alignment plate 201. FIG. 3C illustrates the front side of the optical block 102. The optical output opening 317 is indicated.

Figure 3F:
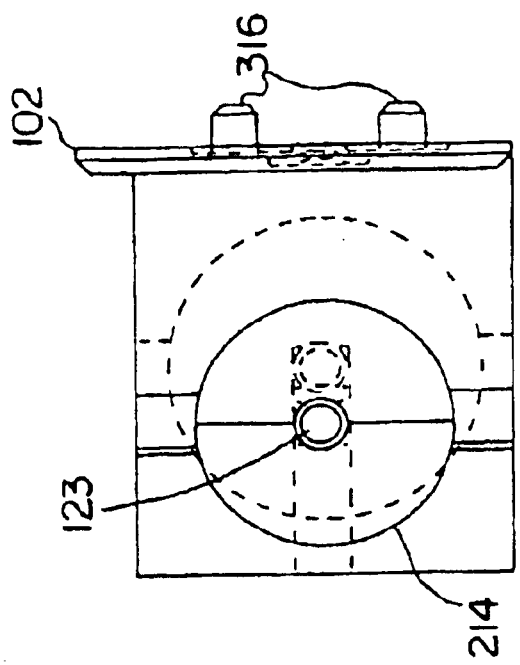
FIG. 3F is a right side view of the optic block for the first embodiment of the invention.
Figure 3C:
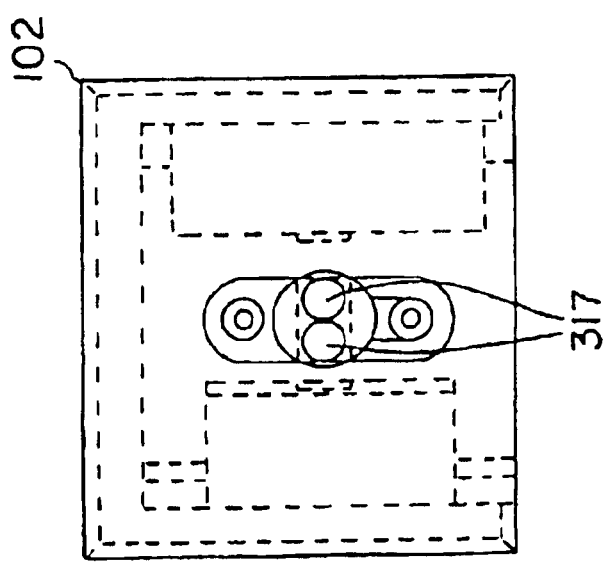
FIG. 3C is a frontal view of the optic block for the first embodiment of the invention.
Figure 3H:
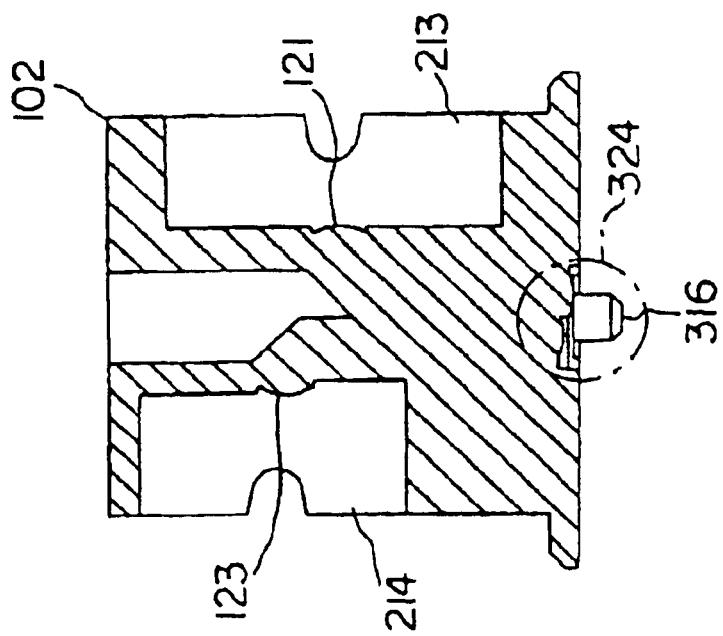
FIG. 3H is a cross-sectional view of the optic block for the first embodiment of the invention.
Figure 3D:
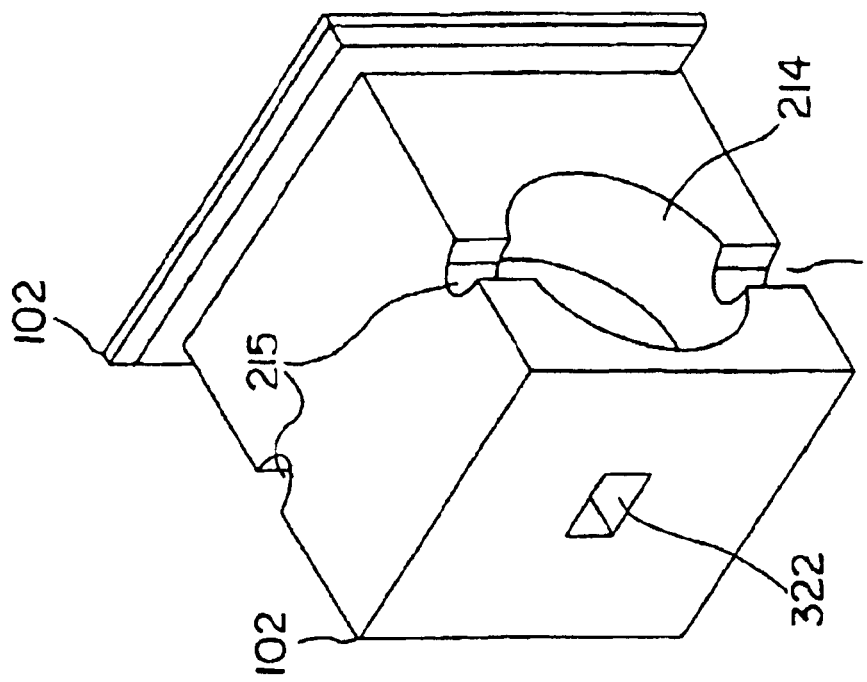
FIG. 3D is a back side perspective view from the right of the optic block for the first embodiment of the invention.
Figure 3E:
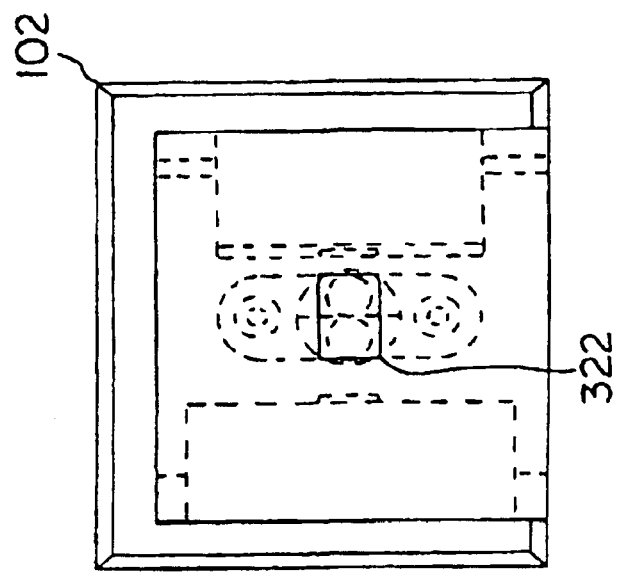
FIG. 3E is a back view of the optic block for the first embodiment of the invention.

FIG. 3D is a back side perspective view from the right of the optical block 102. The back side of the optical block 102 includes a cavity 322 that is used to form the shape of the reflective surfaces 124–125 during manufacturing of the optical block 102. FIG. 3E is a back view of the optic block illustrating the opening into the cavity 322.

Figure 3G:
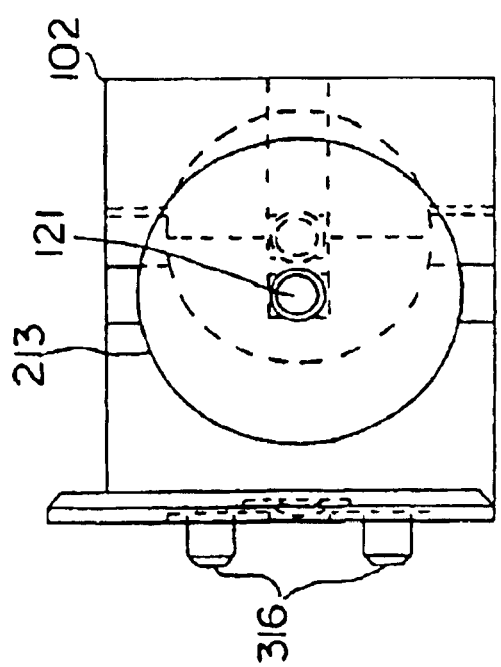
FIG. 3G is a left side view of the optic block for the first embodiment of the invention.

FIG. 3F illustrates the right side of the optical block 102 which has the opening 214 to mate with the type of housing of the transmitter 110. The lens 123 can be viewed near the center of the opening 214. FIG. 3G illustrates the left side of the optical block 102. which has the opening 213 to mate with the type of housing of the receiver 111. The lens 121 can be viewed near the center of the opening 213. Comparing FIGS. 3F and 3G, the offset between openings 213 and 214 to avoid optical crosstalk is visible. In the preferred embodiment, receiver 111 is closer to the optical opening 317 in order to minimize the loss of incoming received optical power. However, the position of receiver 111 and transmitter 110 can be interchanged. FIG. 3H is a cross-sectional view of the optical block 102 illustrating the relative position of the optical block alignment posts 316. The area 324 surrounding the alignment post 316 is magnified in FIG. 3I. FIG. 3I provides a magnified cross-sectional view of the alignment post 316.

Figure 4:
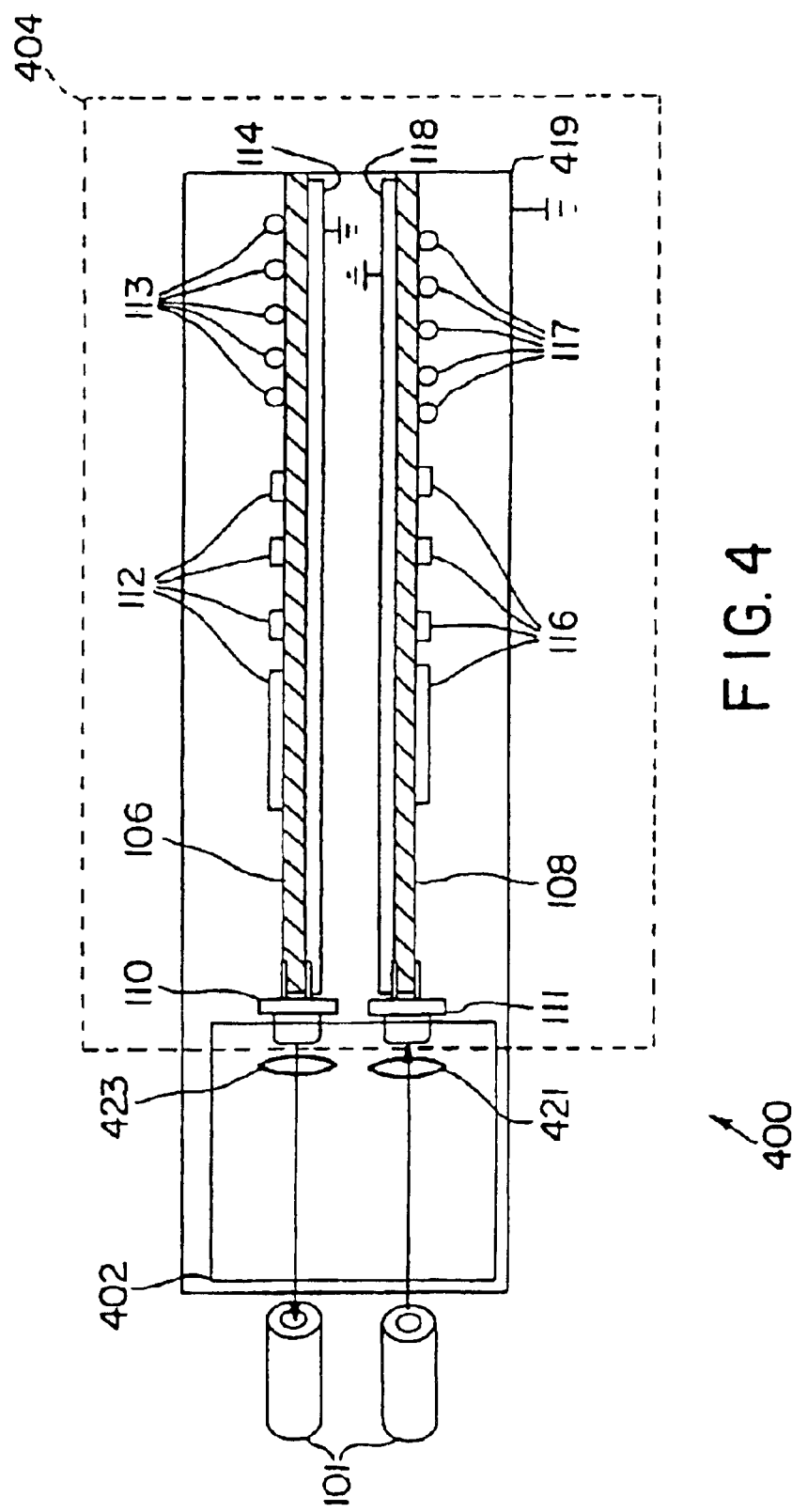
FIG. 4 is a simplified top cutaway view of another embodiment of the invention.

FIG. 4 illustrates another embodiment of the invention. To couple to the optical fibers 101, a fiber optic module 400 includes an optical block 402 and electrical elements 404. The optical block 402 may also be referred to as a nose, an optical port, an alignment block, an optical connector, an optical receptacle or receptacle. The optical block 402 can interface to an optical connector such as an LC, MT-RJ or VF-45 optical connector. Electrical elements 404 include transmitter PCB 106, receiver PCB 108, light receiver 111, light transmitter 110, and a shielded housing or cover 419. Shielded housing or cover 419 may be narrower than shielded housing or cover 119 due to receiver 111 and transmitter 110 being parallel with the PCBs 108 and 106. The optical or alignment block 402 may include lens 423 and lens 421 for coupling light or photons into and out of the fiber optic cable 101. Alternatively the lens 423 and 421 may be coupled to the receiver 111 and transmitter 110. Lens 423 and 421 may be spherical lenses or each may be a pair of aspheric lenses on the same optical axis. Light or photons emitted by the transmitter 110 are collected and focused by lens 423 into a transmit fiber optic cable. Light or photons on a receive fiber optic cable are collected and focused by lens 421 into the receiver 111. In this manner, fiber optic module 400 preferably keeps light or photons substantially in parallel and does not have to reflect the light or photons to couple it with receiver 111 or transmitter 110.

Figure 5A:
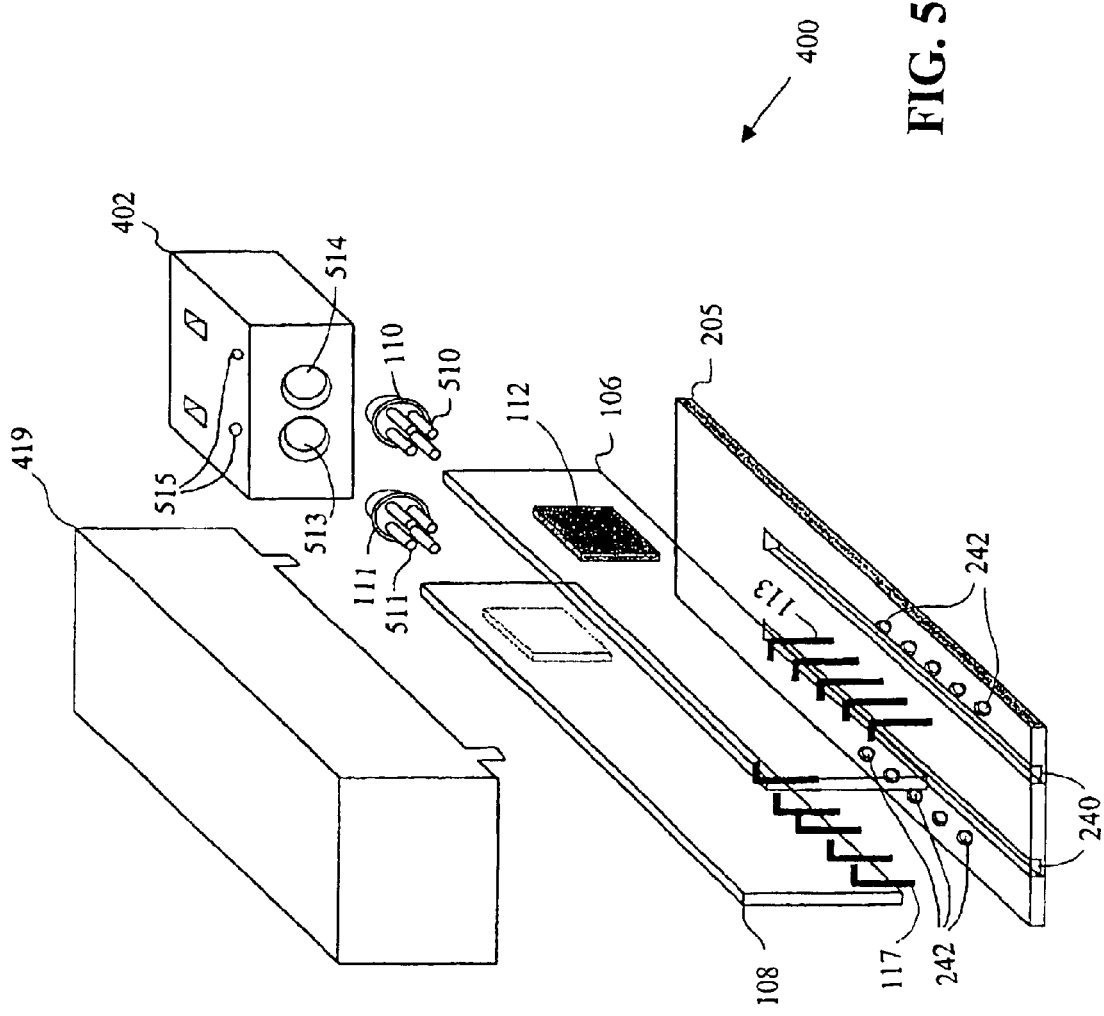
FIG. 5A is an exploded view of the embodiment of the invention of FIG. 4.

FIG. 5A illustrates an exploded diagram of the fiber optic module 400. Fiber optic module 400 is assembled similar to fiber optic module 100 as previously described with reference to FIG. 2. However, optical or alignment block 402 differs from optical block 102. Receiver 111 and transmitter 110 are inserted into openings 513 and 514 respectively in the optical or alignment block 402. The receiver and transmitter may be held in place by a press fit or glued in place. To glue in place, an epoxy or glue is injected in top and bottom tacking holes 515 of the optical or alignment block 402 while the receiver 111 and transmitter 110 are tested and aligned to substantially couple light or photons into and out of fiber optic cables. After the epoxy is set and the receiver and transmitter are substantially fixed in the optical block 102, the transmit PCB 106 and the receive PCB 108 are coupled respectively to the transmitter 110 and the receiver 111. The terminals 511 and 510 of the receiver 111 and the transmitter 110 respectively are soldered directly onto the PCB. The high frequency pins associated with the receiver 111 and transmitter 110 are preferably soldered on the component side of the printed circuit boards in order to provide proper shielding. The alignment plate 201, the nose 202 and the nose shielding 203 are unnecessary in this embodiment of the invention. Fiber ferrules are utilized instead for alignment between the optical or alignment block 402 and the optical fibers 101.

Figure 5B:
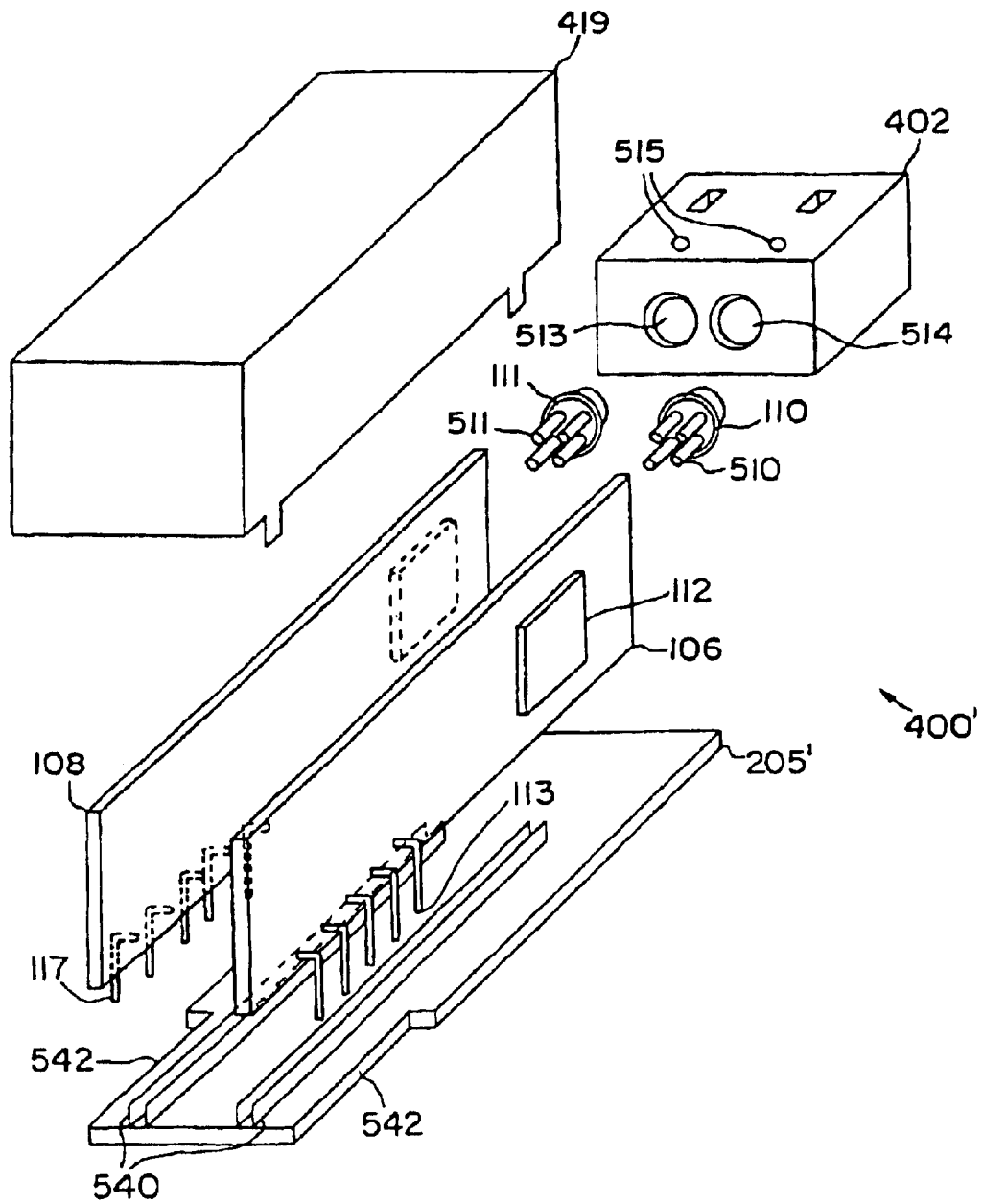
FIG. 5B is an exploded view of an alternate embodiment of the invention of FIG. 4.

Referring now to FIG. 5B, an exploded view of a fiber optic module 400' is illustrated. Fiber optic module 400' is assembled similar to fiber optic module 400 as previously described with reference to FIG. 5A but a different base 205' is utilized. The base 205' differs from base 205 in that it has a pair of guide rails 540 to hold the PCBs 106 and 108 in place and a pair of cutouts or open slots 542 for the pins 113 and 117 to extend through. In this manner, the PCBs 106 and 108 may slide into place onto the base 205'.

Figure 5C:
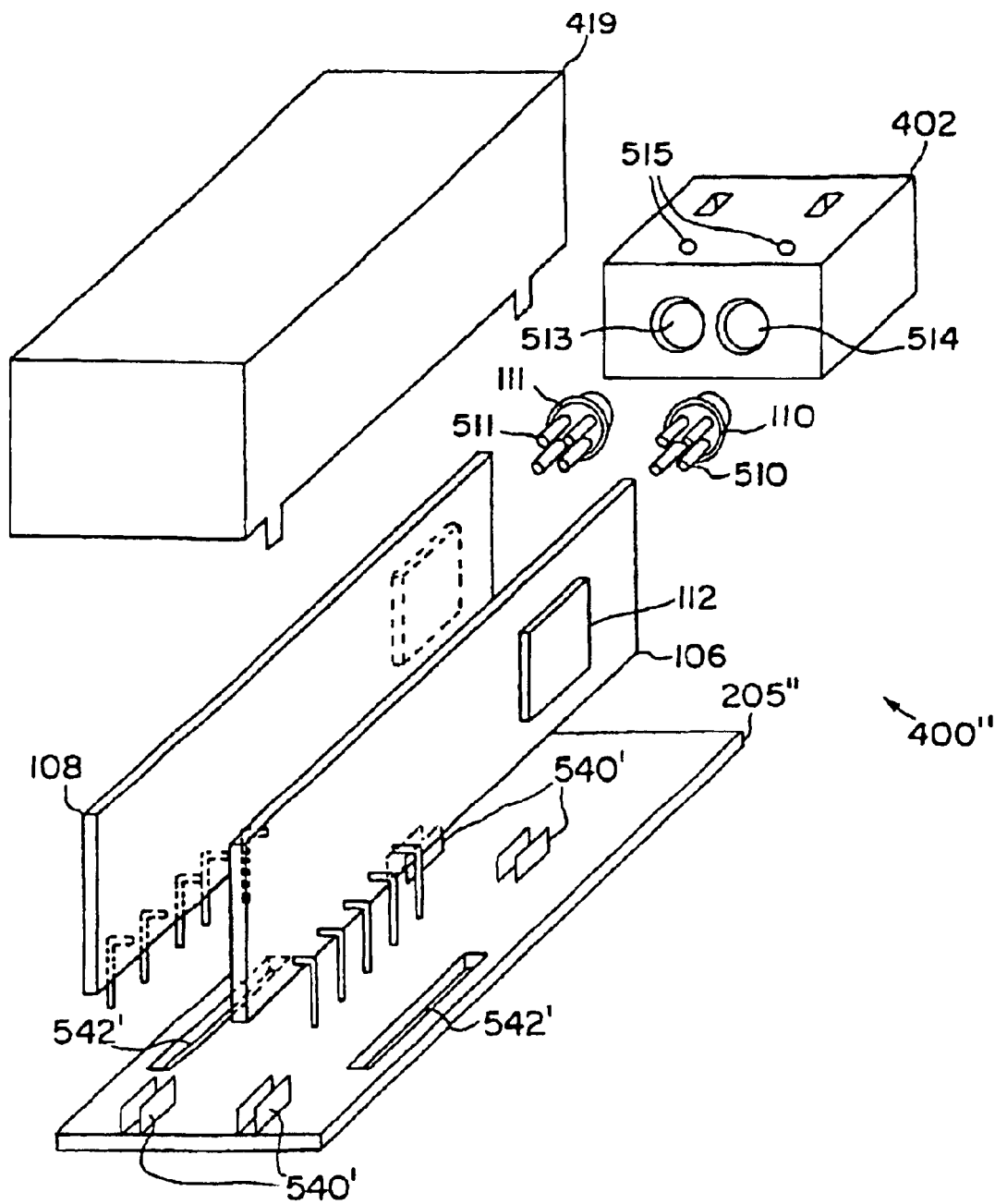
FIG. 5C is an exploded view of another alternate embodiment of the invention of FIG. 4.

Referring now to FIG. 5C, an exploded view of a fiber optic module 400" is illustrated. Fiber optic module 400" is assembled similar to fiber optic module 400 as previously described with reference to FIG. 5A but a different base 205" is utilized. The base 205" differs from base 205 in that it has pairs of mounting brackets 540' to hold the PCBs 106 and 108 in place and a pair of openings 542' for the pins 113 and 117 to extend through.

Figure 5D:
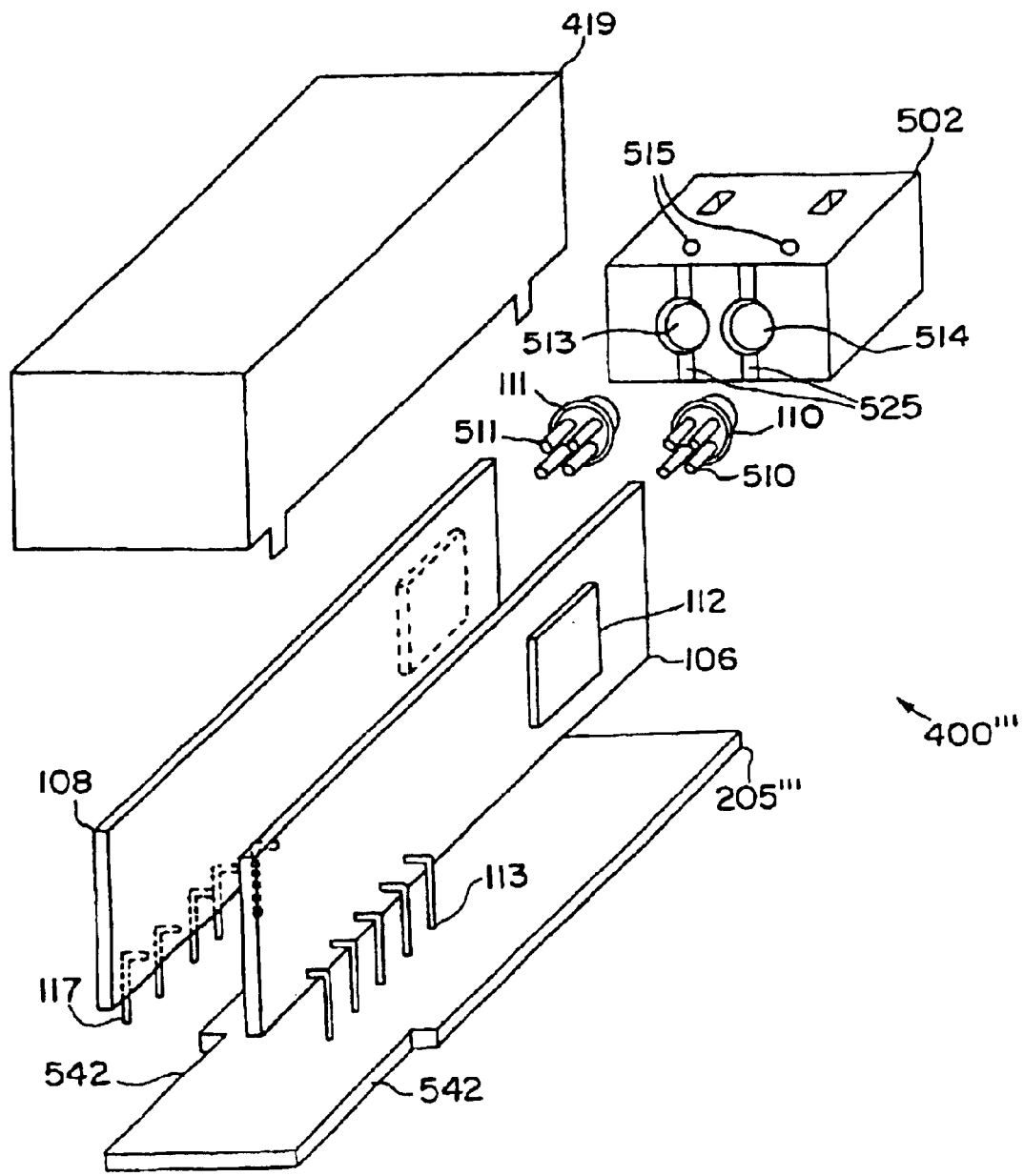
FIG. 5D is an exploded view of another alternate embodiment of the invention of FIG. 4.

The PCB slots 240, guide rails 540 or brackets 540' can be replaced by slots, brackets or guide rails of the optical block 402 to align the PCBs thereto. Additionally, it is to be understood that alternate bases may be formed by combining the elements of the bases 205, 205', and 205" in different ways. For example, refer to FIG. 5D. FIG. 5D illustrates an exploded view of a fiber optic module 400'''. Fiber optic module 400''' is assembled similar to fiber optic module 400 as previously described with reference to FIG. 5A but a different base 205''' is utilized and a slightly different optical block 502 is utilized. The base 205''' differs from base 205 in that there are no slots 240 and that there are a pair of cutouts or open slots 542 for the pins 113 and 117 to extend through. The optical block 502 differs from the optical block 402 in that a pair of slots 525 are provided to align the PCBs 106 and 108 with the optical block.

Referring now to FIG. 6A, a cross-sectional view of the optical or alignment block 402 for the second embodiment is illustrated. The transmitter 110 and the receiver 111 are coupled to the optical or alignment block 402. The transmitter 110 includes an emitter 302 for generation of light or photons. The receiver 111 includes a detector 304 to receive light or photons. Light or photons emitted by the emitter 302 are coupled into lens 423, collected and focused into the optical fiber through the optical port 417A. Light or photons, incident from a fiber optic cable coupled to the fiber optic module 400, is received through the optical port 417B. Photons from the fiber optic cable are incident upon the lens 421. Lens 421 collects and focuses the incident light or photons from the fiber optic cable onto the detector 304 of the receiver 111. In order to keep the optical fibers 101 in alignment with the optical or alignment block 402, a pair of fiber ferrules 421 are provided. The fiber ferrules 421 are inserted into the optical ports 417A and 417B.

FIG. 6B illustrates the front side of the optical or alignment block 402. The front side of the optical or alignment block 402 includes optical output ports 417A and 417B. In FIG. 6B, the lens 421 is visible through the optical output port 417B and lens 423 is visible through the optical output port 417A. FIG. 6C is an illustration of the back side of the optical or alignment block 402. In Figure GC, the lens 421 is visible through opening 513 and lens 423 is visible through opening 514. FIG. 6D illustrates the top side of the optical or alignment block 402 which has the tacking holes 515 coupling to the openings 513 and 514. Epoxy may be inserted into the top and bottom tacking holes 515 to hold the transmitter 110 and receiver 111 in position in the optical or alignment block 402.

Figure 7A:
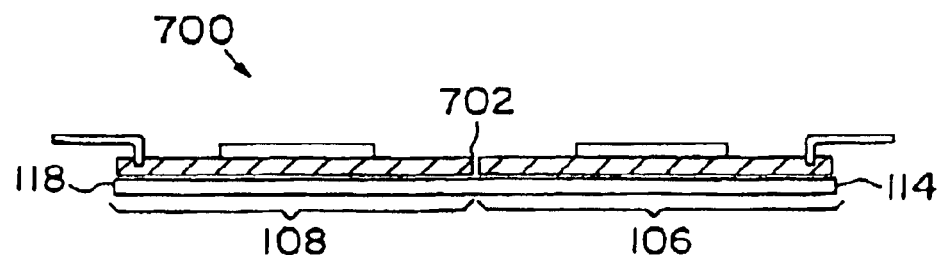
FIG. 7A is a top view of a manufacturing step of the invention.
Figure 7B:
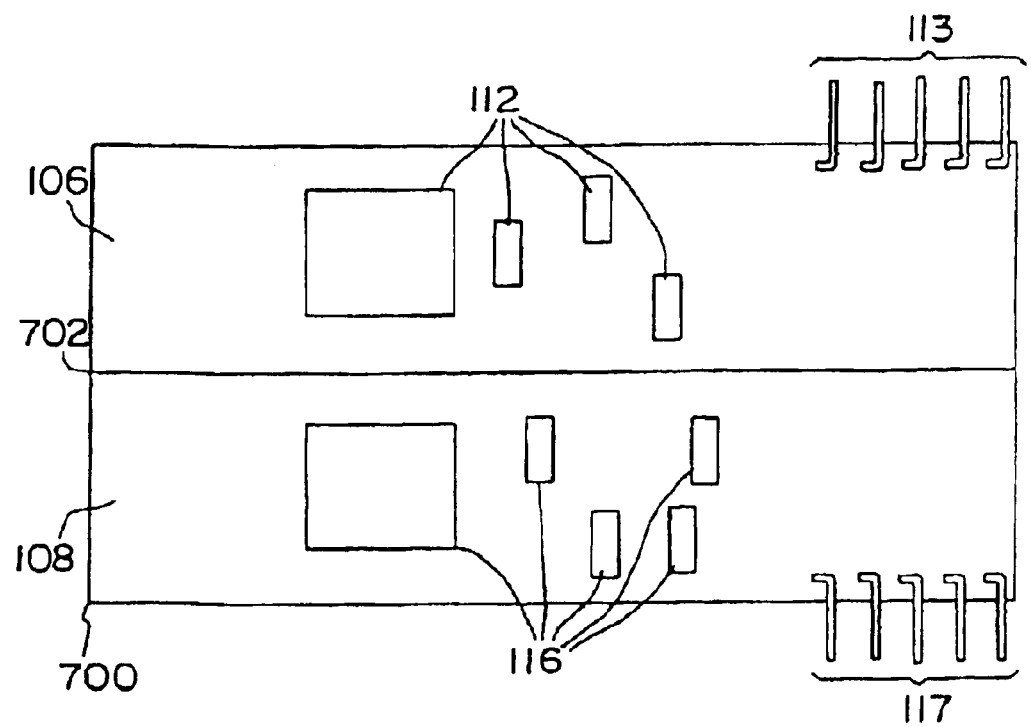
FIG. 7B is a side view of a manufacturing step of the invention.

Referring now to FIGS. 7A–7B, final steps of the assembly of printed circuit boards 106 and 108 are illustrated. Transmit PCB 106 and receive PCB 108 are assembled as one unit on one printed circuit board 700 with a center score 702 defining a boundary line between transmit and receive components. After all components have been attached and assembled onto the unitary PCB 700, the PCB 700 is flexed along the score 702 such that the transmit PCB 106 and the receive PCB 108 may be separated. Transmit PCB 106 and the receive PCB 108 may thereafter be assembled as part of the fiber optic module 100 and the fiber optic module 400. The transmit PCB 106 and the receive PCB 108 may each be approximately 6.5 mm in height excluding pins 113 and 117.

Figure 8A:
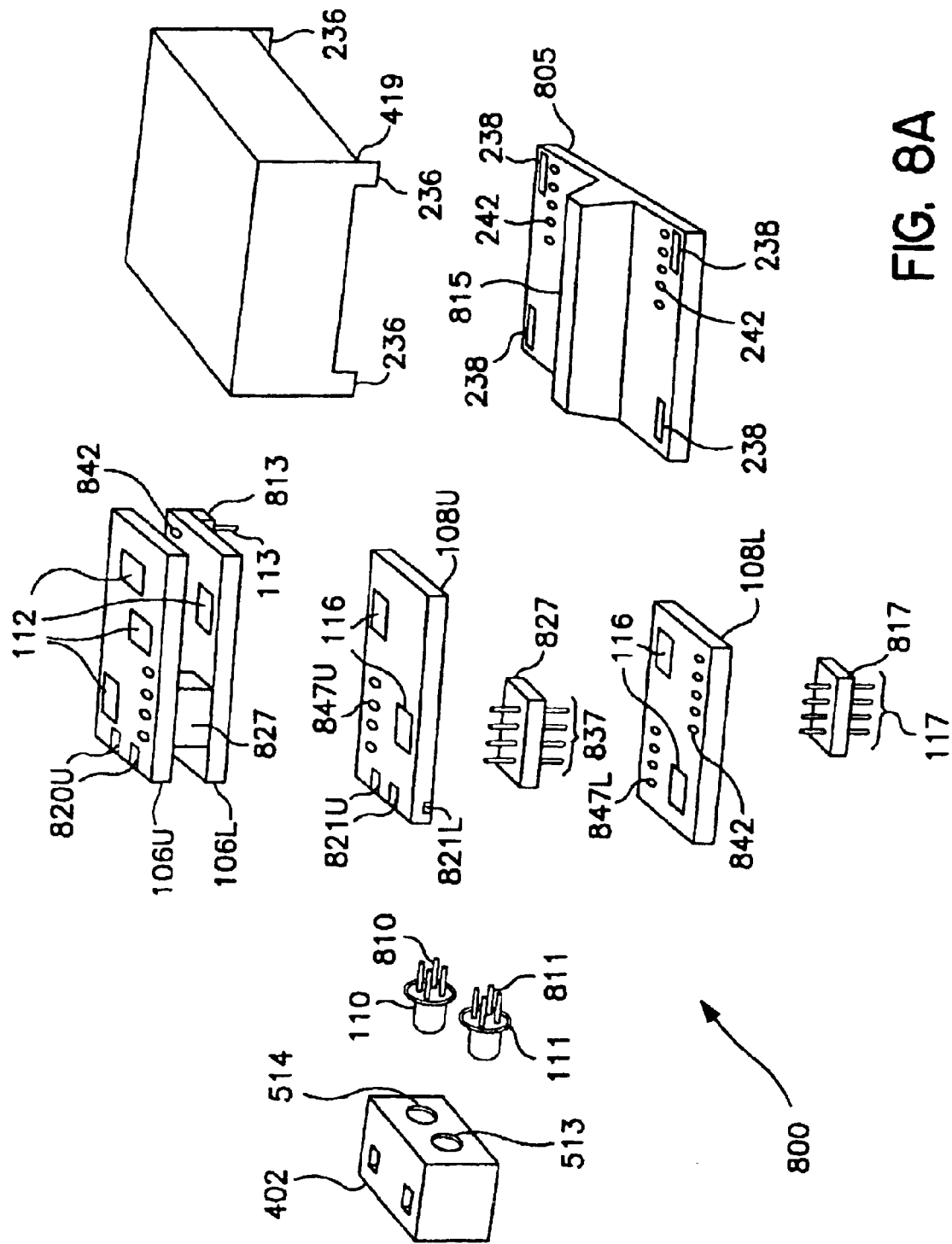
FIG. 8A is an exploded view of another embodiment of the invention.

Referring now to FIG. 8A, another embodiment of the invention is illustrated. FIG. 8A illustrates an exploded view of a fiber optic module 800. The fiber optic module 800 includes an upper transmit PCB 106U, a lower transmit PCB 106L, an upper receive PCB 108U, a lower receive PCB 108L, the transmitter 110, the receiver 111, the optical block 402, the shielded housing or cover 419, a first and second PCB interconnect pin headers 827, a first terminal pin header 813 for the transmitter, a second terminal pin header 817 for the receiver, and a baseplate 805.

The transmitter 110 is a transmit optical subassembly (Tx OSA) that includes a VCSEL or other semiconductor device that transduces electrical signals into photons or a light output. The receiver 111 is a receive optical subassembly (Rx OSA) including a PIN diode or other device that converts photons or light input into electrical signals. The Tx OSA and Rx OSA are attached to physically separated transmit and receive electrical subassemblies (ESA's). In one embodiment, the transmit ESA includes an upper and lower transmit PCBs 106U and 106L with components 116 mounted thereto. In one embodiment, the receive ESA includes an upper and lower receive PCBs 108U and 108L with components 112 mounted thereto.

The lower transmit PCB 106L and the upper transmit PCB 106U provide similar functionality to that of the transmit PCB 106 and include components 112. The lower receive PCB 108L and the upper receive PCB 108U provide similar functionality to that of the receive PCB 108 and include components 116. The upper and lower transmit PCBs 106U and 106L are parallel to each other in a horizontal plane and parallel with the optical axis of the transmitter 110. The upper and lower receive PCBs 108U and 108L are parallel to each other in a horizontal plane and parallel with the optical axis of the receiver 111. This configuration of parallel horizontal boards for each of the transmit and receive capability can be referred to as dual-stack horizontal modular PCBs.

The first and second pin interconnect headers 827 include the conductive signal pins 837 molded into a non-conductive medium. The first and second pin interconnect headers 827 are used to interconnect lower and upper PCB's. The first pin header 827 provides signal interconnection between the upper and lower transmit PCBs 106U and 106L. The first pin header 827 provides signal interconnection between the upper and lower transmit PCBs 106U and 106L. The second pin header 827 provides signal interconnection between the upper and lower receive PCBs 108U and 108L. The second pin header 827 has pins 837 that couple into upper throughholes 847U in the upper receive PCB 108U and lower through holes 847L in the lower receive PCB 108L. The first pin header 827 similarly has pins 837 that couple into upper and lower throughholes in the upper and lower transmit PCBs 106U and 106L respectively.

The first and second terminal pin headers 817 and 813 include conductive signal pins molded into a non-conductive medium. The first and second terminal pin headers 817 and 813 are used to route electrical signals to and from the fiber optic module 800 to a host system. The first terminal pin header 813 has pins 113 that couple to through holes 842 in the lower transmit PCB 106L. Similarly, the second terminal pin header 817 has pins 117 that couple to through holes 842 in the lower receive PCB 108L.

The transmitter 110 couples to the upper transmit PCB 106U in one embodiment. The terminals 810 of the transmitter 110 couple to the upper transmit PCB 106U in one embodiment. Using a straddle mount, one or more terminals couple to upper edge traces 820U on a top side of the upper transmit PCB 10GU and one or more terminals couple to lower edge traces 820L on a back side of the upper transmit PCB 106U. In a straddle mount, the optoelectronic device (i.e. the transmitter 110 or the receiver 111) has its optical axis nearly in-line and parallel with a plane of the printed circuit board. In an alternate embodiment, the terminals 810 may couple to the lower transmit PCB 106U. In another alternate embodiment, the terminals 810 may couple between the upper and lower receive PCBs so that one or more couple to the upper PCB and one or more couple to the lower PCB. In yet another alternate embodiment using a through hole mount, the terminals 810 may couple into holes of the upper or lower transmit PCBs or both upper and lower transmit PCBs. In a through hole mount, the optoelectronic device (i.e. the transmitter 110 or the receiver 111) has its optical axis nearly parallel with a plane of the printed circuit board.

The receiver 111 couples to the upper receive PCB 108U in one embodiment. The terminals 811 of the receiver 111 couple to the upper receive PCB 108U in one embodiment. Using a straddle mount, one or more terminals couple to upper edge traces 821U on a top side of the upper receive PCB 108U and one or more terminals couple to lower edge traces 821L on a back side of the upper receive PCB 108U. In an alternate embodiment, the terminals 811 may couple to the lower receive PCB 108U. In another alternate embodiment, the terminals 811 may couple between the upper and lower receive PCBs so that one or more couple to the upper PCB and one or more couple to the lower PCB. In yet another alternate embodiment, the terminals 811 may couple into holes of the upper or lower receive PCBs or both upper and lower receive PCBs.

Included with the fiber optic module 800 is a baseplate 805. The baseplate 805 may include an inner septum 815 that divides the transceiver and receiver into two separate cavities, for EMI and electrical isolation of the transmitter from the receiver or between channels. The baseplate 805 acts like a chassis or frame to provide support for the shielded housing or cover 419 and the receiver and transmit subassemblies. The baseplate 805 may include an inner septum 815, one or more openings 242 to receive the pins 113 and 117, and one or more clip openings or slots 238 to receive the clips or tabs 236. The baseplate 805 in one embodiment is plastic in other embodiments that baseplate may be metal or a metalized plastic to provide shielding. The inner septum 815 provides separation between the transmitter and the receiver or between channels.

Figure 8B:
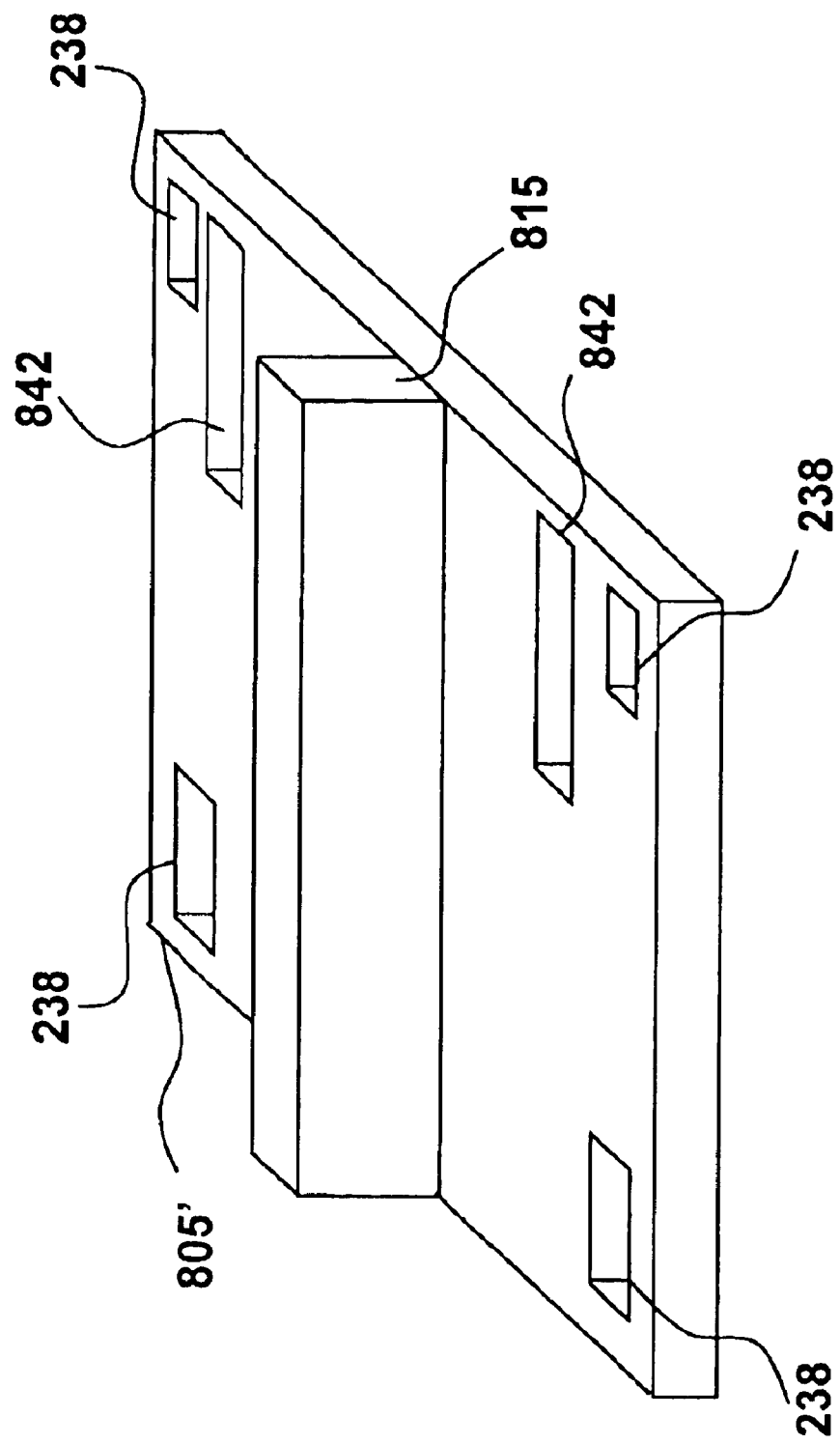
FIG. 8B is perspective view of an alternate baseplate for embodiments of the invention.

Referring now to FIG. 8B, an alternate baseplate 805' is illustrated. Baseplate 805' differs from baseplate 805 in that it includes slots 842 for pins 113 and 117. Baseplate 805' may similarly include clip openings or slots 238 and the inner septum 815.

Figure 8C:
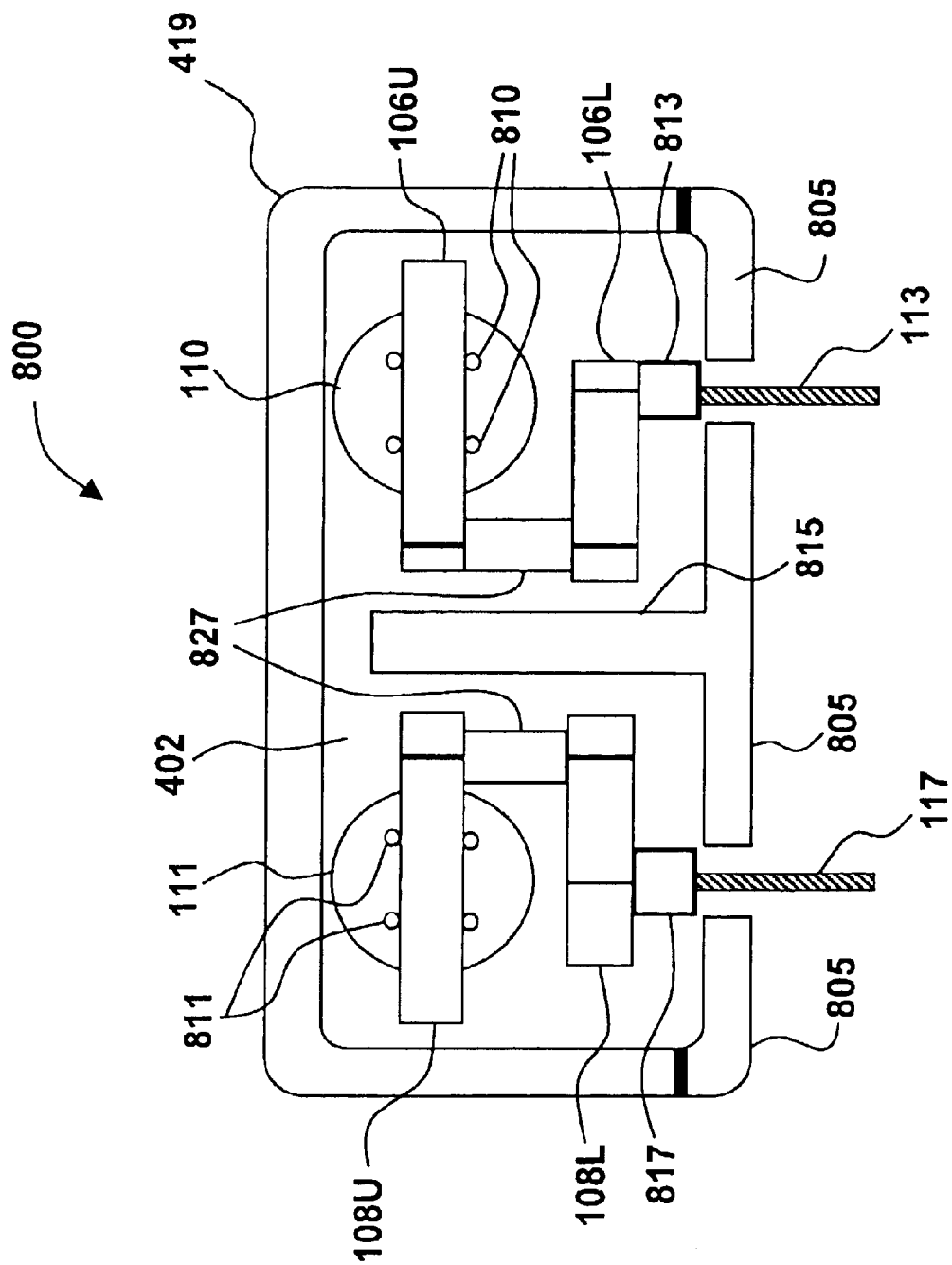
FIG. 8C is a rear cross sectional view of the assembled invention illustrated in FIG. 8A.

Referring now to FIG. 8C, a rear cross sectional view of the assembled fiber optic module 800 is illustrated. The baseplate 805 with the inner septum 815 can divide the fiber optic module 800 into two separate cavities. The separate cavities can improve EMI and electrical isolation of the transmitter from the receiver. The receiver 111 couples to the upper receive PCB 108U with its terminals 811 using a straddle mount in one embodiment. The transmitter 111 couples to the upper transmit PCB 106U with its terminals 810 using a straddle mount in one embodiment.

In FIG. 8C, the upper and lower transmit PCBs 106U and 106L are parallel to each other in a horizontal plane and parallel with the optical axis of the transmitter 110. The upper and lower receive PCBs 108U and 108L are parallel to each other in a horizontal plane and parallel with the optical axis of the receiver 111. This configuration of parallel horizontal boards for each channel can be referred to as dualstack horizontal modular PCBs. The dual stacked horizontal PCB's allow an increase in component surface mounting area for a given volume. Both sides of the upper and lower transmit and receive PCB's can be utilized to mount electronic components. This increased surface area can provide increased functionality in a fiber optic module by allowing additional components such as integrated circuits and passive components such as filters, capacitors, and inductors to be utilized.

Figure 9A:
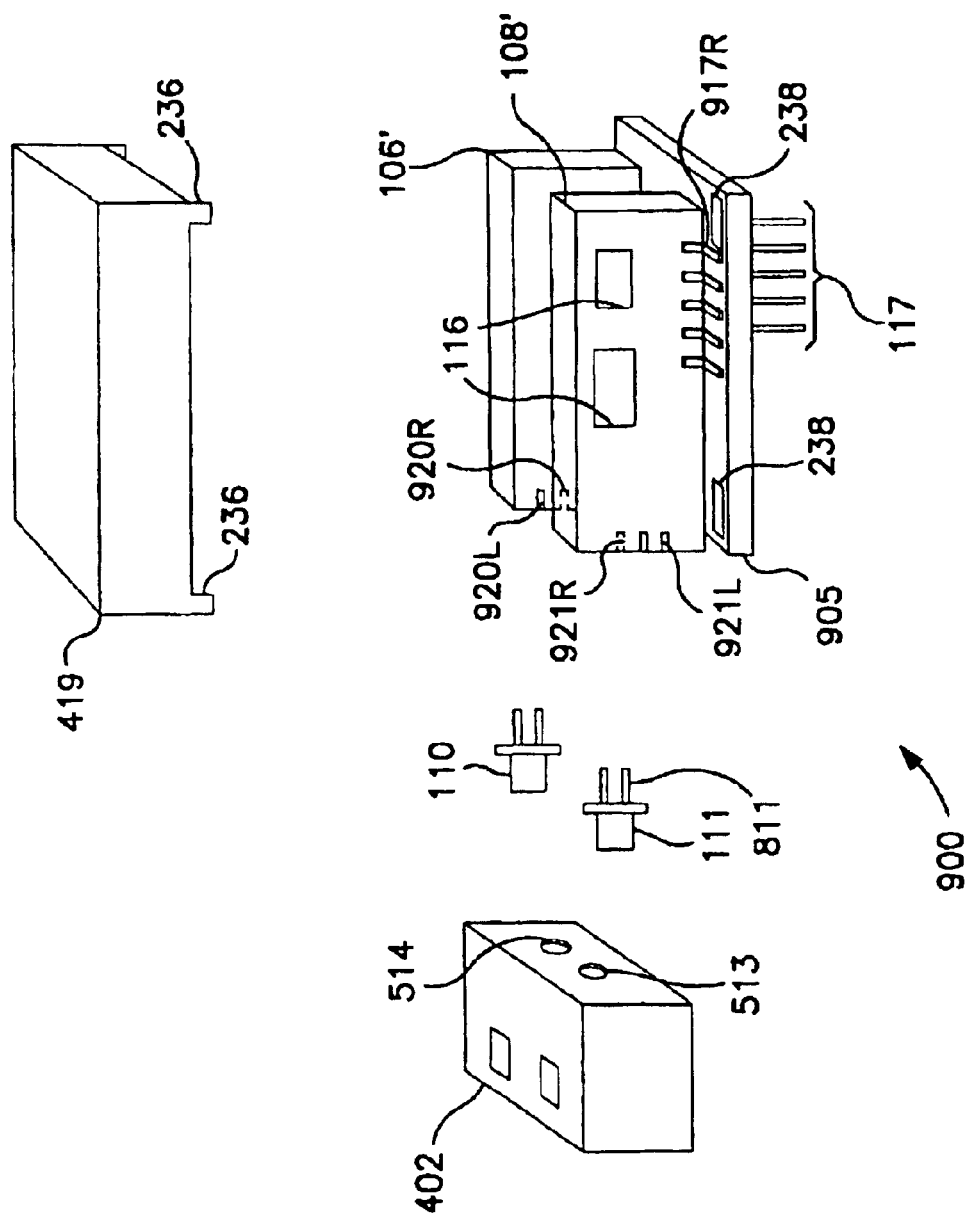
FIG. 9A is an exploded view of another embodiment of the invention.

Referring now to FIG. 9A, another embodiment of the invention is illustrated. FIG. 9A illustrates an exploded view of a fiber optic module 900. The fiber optic module 900 utilizes a motherboard which is common to daughtercards PCBs which are substantially perpendicular to the motherboard. Assuming the motherboard is horizontal, the daughtercard PCBs are substantially vertical to the motherboard and can be also be referred to as vertical PCBs. The substantially vertical PCB's couple to the common motherboard.

The fiber optic module 900 includes a vertical transmit PCB 106' and a vertical receive PCB 108' in parallel coupled to a horizontal motherboard PCB 905. The motherboard PCB 905 can separate ground and power planes between receiver and transmitter channels in order to maximize isolation and minimize cross talk. The vertical transmit PCB and the vertical receive PCB may have traces soldered to traces of the motherboard for electrical connectivity or otherwise include pins that plugged into holes or sockets of the motherboard to ease replacement or to expand the number of transmit or receive channels with additional transmit PCBs or receive PCBs. Alternatively, the electrical connection between the vertical transmit PCB and the vertical receive PCB and motherboard PCB may be made with electrical connectors in lieu of solder joints. The mother board PCB includes Input/Output Pins (I/O Pins) or an I/O socket connector to couple to holes or a socket of a host system PCB to interface with a host system.

In order to further minimize the form factor of the fiber optic module 900, the vertical transmit PCB and the vertical receive PCB provides mounting surfaces for components on both the left and right side surfaces (or front and back surfaces). Additionally, a top surface of the motherboard PCB 905 may also be used to mount components or circuits for increased electrical functionality such as a clock/data recovery (CDR) function and minimize the form factor of the fiber optic module.

To minimize EMI and crosstalk between the vertical transmit PCB and the vertical receive PCB, an inner shield similar to the shield 109 may be used. Alternatively, one or both of the vertical transmit PCB and the vertical receive PCB may have a ground plane on of its left or right side surfaces (sometimes referred to as a backside ground plane).

The vertical PCBs 106' and 108' are similar to PCBs 106 and 108 but for the coupling to the horizontal motherboard PCB 905. The vertical PCBs 106' and 108' have signal traces soldered to signal traces of the horizontal motherboard PCB 905 which can also mechanically support the vertical PCBs 106' and 108'. Solder joints 917R couple the receive PCB 108' to the horizontal motherboard PCB 905. Solder joints 917T couple the transmit PCB 106' to the horizontal motherboard PCB 905 (see FIG. 9B). The fiber optic module 900 can be referred to as having vertical PCB's with a horizontal motherboard PCB.

The horizontal motherboard PCB 905 includes input/output (I/O) pins 113 and 117 to couple to a host system and wire traces to route power, ground and signals between the pins 113 and 117 and the vertical PCBs 106' and 108'.

The fiber optic module 900 further includes the transmitter 110, the receiver 111, the optical block 402, and the shielded housing or cover 419. The shielded housing or cover 419 has clips or tabs 236 that couple into clip openings or slots 238 in the motherboard PCB 905. The clips or tabs 236 can be held in place in the slots by a friction fit or glued in place or they may extend through the motherboard PCB 905 and be turned and or bent to couple the shielded housing or cover 419 and the motherboard PCB 905 together. Alternatively, the clips or tabs 236 of the shielded housing or cover 419 can wrap around the motherboard PCB 905 to couple them together.

The transmitter 110 couples into the opening 514 of the optical block 402. The receiver 111 couples into the opening 513 of the optical block. They are held in place by either a friction fit or a glue such as an epoxy.

The transmitter 110 couples to the transmit PCB 106'. The terminals 810 of the transmitter 110 couple to the transmit PCB 106'. In one embodiment using a straddle mount, one or more terminals 810 couple to left edge traces 920L on a left side and one or more terminals 810 couple to right edge traces 920R on a right side of the transmit PCB 106'. In alternate embodiment, the terminals 810 may couple to one side of the transmit PCB 106'. In yet another alternate embodiment, the terminals 810 may couple into holes of the transmit PCB 106'.

The receiver 111 couples to the receive PCB 108'. The terminals 811 of the receiver 111 couple to the receive PCB 108'. Using a straddle mount, one or more terminals 811 couple to left edge traces 921L on a left side and one or more terminals 811 couple to right edge traces 921R on a right side of the receive PCB 108'. In an alternate embodiment, the terminals 811 may couple to one side of the receive PCB 108'. In yet another alternate embodiment, the terminals 811 may couple into holes of the receive PCB 108'.

Referring now to FIG. 9B, a rear cross-sectional view of the assembled fiber optic module 900 is illustrated. Traces 920 on the motherboard PCB route signals to components on the motherboard PCB, the I/O pins 113 and 117, and the solder joints 917R and 917T. A ground plane 118 can be coupled to a side the vertical receive PCB 108' or a ground plane 114 can be coupled to a side of the vertical transmit PCB 106' or both. Referring to FIG. 9C, the vertical transmit PCB 106' includes the ground plane 114 and the vertical receive PCB 108' is without a ground plane to allow room for added components 116 on each side. Referring to FIG. 9D, the vertical receive PCB 108' includes the ground plane 118 and the vertical transmit PCB 106' is without a ground plane to allow room for added components 112 on each side. An optional inner shield 109 can also be used for further isolation between channels to reduce cross-talk and EMI as illustrated in FIG. 9B. In any case, the ground plane 114 and 118 will have cutouts for traces to coupled to the terminals 810 and 811 and may have additional cutouts for components 112 or 116 as the case may be. Referring now to FIG. 9E, the ground plane 118 or the ground plane 114 may be alternatively sandwiched between layers of either the vertical receive PCB 108' or the vertical transmit PCB 106' or both as a part of a multilayer PCB as illustrated by FIG. 9C. This can allow for further components 116 and 112 to be added to both sides of the vertical receive PCB 108' and the vertical transmit PCB 106'.

Figure 10A:
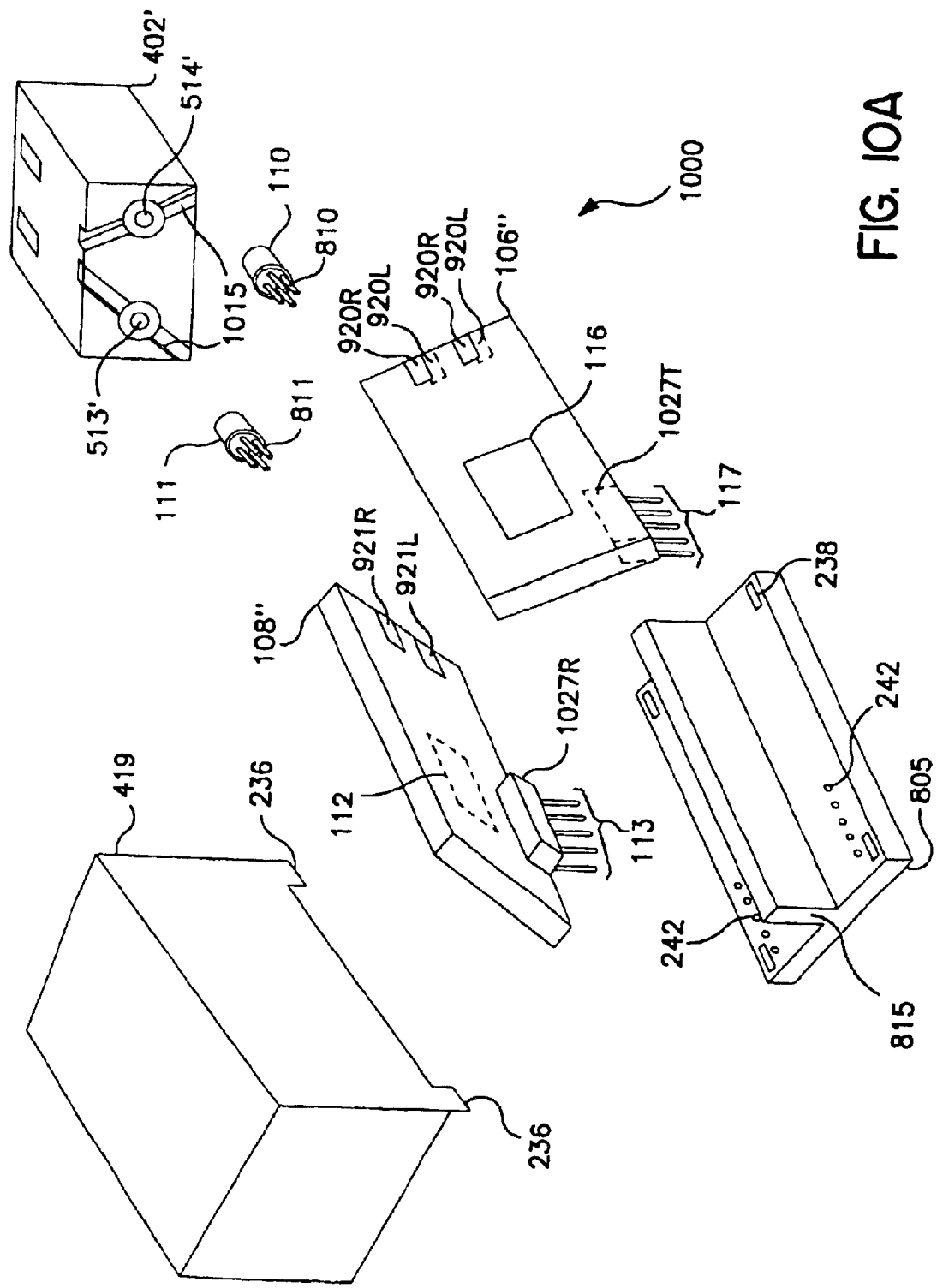
FIG. 10A is an exploded view of another embodiment of the invention.

Referring now to FIG. 10A, another embodiment of the invention is illustrated. FIG. 10A illustrates an exploded view of a fiber optic module 1000. The fiber optic module 1000 has angled PCBs with respect to a horizontal or vertical axis of the fiber optic module 1000. The length of the PCBs remain parallel to the optical axis of the receiver 111 and transmitter 110. By angling the PCBs with the horizontal or vertical axis, the PCBs may be made smaller to fit a smaller form factor or alternatively the surface area can be increased. That is the available PCB surface area for mounting components can be increased for a given volume by angling the PCBs. The increased surface area can give the final assembled fiber optic module increased functionality by allowing components such as integrated circuits and passive components such as filters, capacitors, and inductors to be added. More room can also be provided in the fiber optic is module 1000 for mounting larger components by angling the PCBs.

The fiber optic module 1000 includes an angled transmit PCB 106", an angled receive PCB 108", the transmitter 110, the receiver 111, an optical block 402', the shielded housing or cover 419, a first terminal pin header 1027T for the transmitter, a second terminal pin header 1027R for the receiver, and the baseplate 805 or 805'.

The angled transmit PCB 106" and the angled receive PCB 108" are arranged within the fiber optic module at an angle with respect to the horizontal axis thereof as defined by a line normal to both receiver and transmitter optical axes. The angled transmit PCB 106" and the angled receive PCB 108" are held in place having a width that is on an angle with respect to a horizontal or vertical axis of the fiber optic module 1000. The length of the angled transmit PCB 106" and the angled receive PCB 108" are parallel to the optical axis of the receiver 111 and transmitter 110. The angled transmit PCB 106" includes components 116 and left and right edge traces 921L and 921R. The first terminal pin header 1027T has pins 117 that couple to holes of the angled transmit PCB 106" on one end. The angled receive PCB 108" includes components 112 and left and right edge traces 920L and 920R. The second terminal pin header 1027R has pins 113 that couple to holes of the angled receive PCB 108" on one end.

The transmitter 110 is a transmit optical subassembly (Tx OSA) that includes a VCSEL or other semiconductor device that transduces electrical signals into photons or a light output. The receiver 111 is a receive optical subassembly (Rx OSA) including a PIN diode or other device that converts photons or light input into electrical signals. The Tx OSA and Rx OSA are attached to physically separated transmit and receive electrical subassemblies (ESA's). In one embodiment, the transmit ESA includes the angled transmit PCB 106" with components 116 and the first terminal pin header 1027T mounted thereto. In one embodiment, the receive ESA includes the angled receive PCB 108" with components 112 and the second terminal pin header 1027R mounted thereto.

The optical block 402' is similar to the optical block 402 but has some modifications to accommodate the angled transmit PCB 106" and the angled receive PCB 108". The optical block 402' includes openings 513' and 514' to receive the receiver 111 and transmitter 110 respectively and angled slots 1015 to receive the angled transmit PCB 106" and the angled receive PCB 108". The angled slots 1015 can provide a friction fit with the angled transmit PCB 106" and the angled receive PCB 108" or glue or epoxy can be used to couple them together. The angled slots 1015 can also serve to tack the receiver 111 and transmitter 110 in place within the optical block 402'.

The transmitter 110 couples into the opening 514' of the optical block 402'. The receiver 111 couples into the opening 513' of the optical block 402'. They can be held in place by either a friction fit or a glue such as an epoxy.

The transmitter 110 also couples to the transmit PCB 106". The terminals 810 of the transmitter 110 couple to the transmit PCB 106" in one embodiment. Using a straddle mount, one or more terminals 810 couple to left edge traces 920L on a left side and one or more terminals 810 couple to right edge traces 920R on a right side of the transmit PCB 106". In an alternate embodiment, the terminals 810 may couple to one side of the transmit PCB 106". In yet another alternate embodiment, the terminals 810 may couple into holes of the transmit PCB 106".

The receiver 111 also couples to the receive PCB 108". The terminals 811 of the receiver 111 couple to the receive PCB 108". Using a straddle mount, one or more terminals 811 couple to left edge traces 921L on a left side and one or more terminals 811 couple to right edge traces 921R on a right side of the receive PCB 108". In an alternate embodiment, the terminals 811 may couple to one side of the receive PCB 108". In yet another alternate embodiment, the terminals 811 may couple into holes of the receive PCB 108".

Figure 10B:
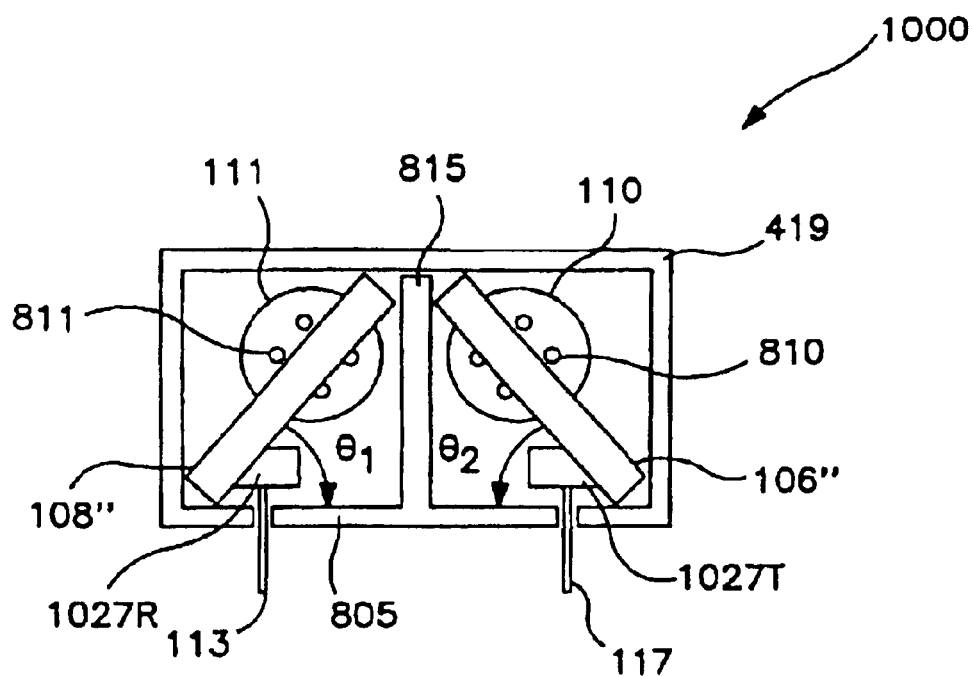
Figure 10B is a rear cross sectional view of the assembled invention illustrated in FIG. 10A.

Referring now to FIG. 10B, a rear cross-sectional view of the assembled fiber optic module 1000 is illustrated. The first terminal pin header 1027T is coupled to the angled transmit PCB 1027T so that pins 117 are vertical with the reference axis. The second terminal pin header 1027R is coupled to the angled receive PCB 108" so that pins 113 are vertical with the reference axis. A ground plane 118 can be coupled to a side the angled receive PCB 108" or a ground plane 114 can be coupled to a side of the angled transmit PCB 106" or both similar to previously described with reference to the vertical boards and FIGS. 9B-9E. The shield housing or cover 419 couples to the base or baseplate 805 or 805' around the printed circuit boards. Depending upon the width of the printed circuit boards 106' and 108' and the width of the fiber optic module 1000, the angles θ1 and θ2 which the printed boards make with the base or baseplate 805 or 805' can vary between zero and ninety degrees.

Figure 11B:
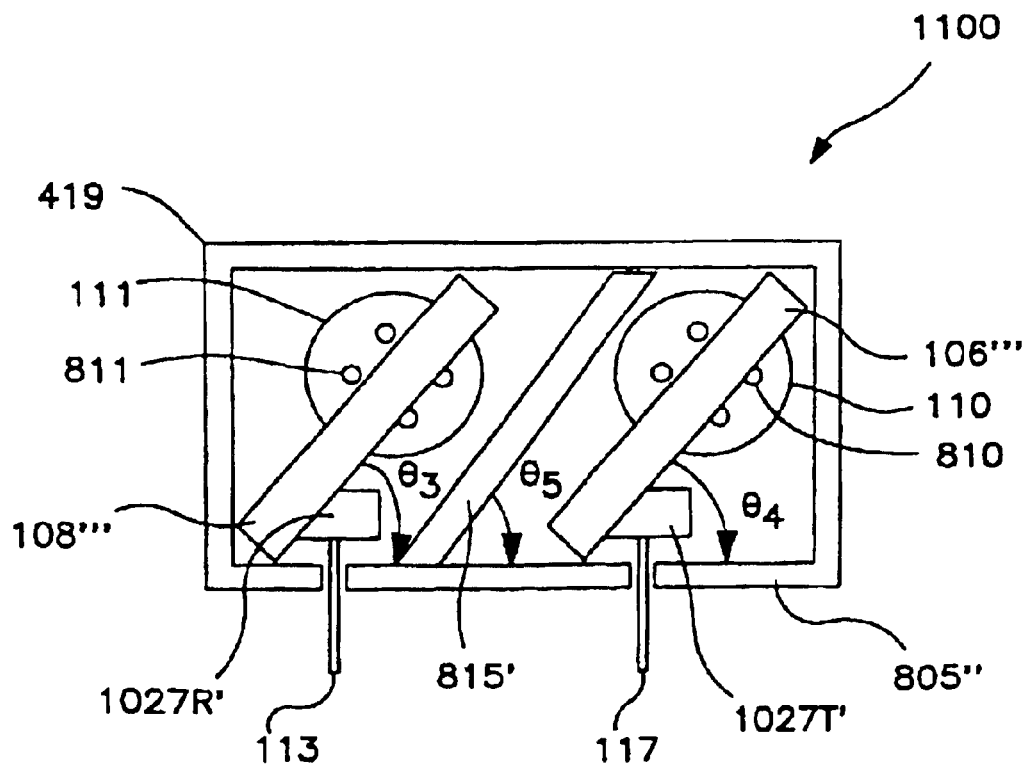
FIG. 11B is a rear cross sectional view of the assembled invention illustrated in FIG. 11A.
Figure 11A:
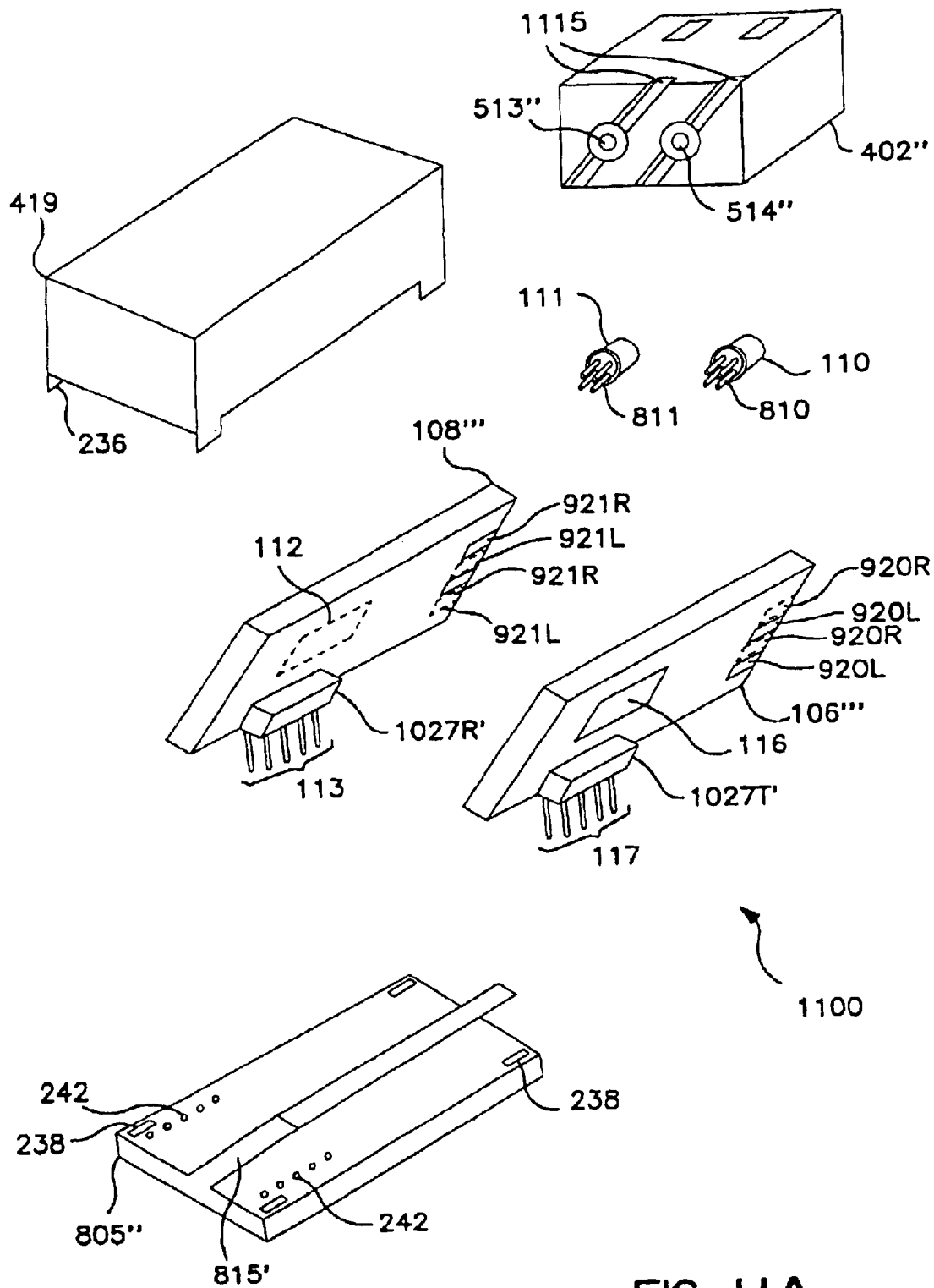
FIG. 11A is an exploded view of another embodiment of the invention.

Referring now to FIG. 11A, another embodiment of the invention is illustrated. FIG. 11A illustrates an exploded view of a fiber optic module 1100. The fiber optic module 1100 has parallel angled or slanted PCBs with respect to a horizontal or vertical axis of the fiber optic module 1100. The length of the PCBs remain parallel to the optical axis of the receiver 111 and transmitter 110. By parallel angling the PCBs with the horizontal or vertical axis, the PCBs may be made smaller to fit a smaller form factor or alternatively the surface area can be increased. That is the available PCB surface area for mounting components can be increased for a given volume by angling the PCBs. The increased surface area can give the final assembled fiber optic module increased functionality by allowing components such as integrated circuits and passive components such as filters, capacitors, and inductors to be added. More room can also be provided in the fiber optic module 1100 for mounting larger components by angling the PCBs in parallel together.

The fiber optic module 1100 includes an angled transmit PCB 106''', an angled receive PCB 108''', the transmitter 110, the receiver 111, an optical block 402'', the shielded housing or cover 419, a first terminal pin header 1027T' for the transmitter, a second terminal pin header 1027R' for the receiver, and a baseplate 805''.

The angled transmit PCB 106''' and the angled receive PCB 108''' are arranged in parallel and at an angle with respect to a horizontal datum plane that passes through and is normal to receiver and transmitter optical axes. The angled transmit PCB 106''' and the angled receive PCB 108''' are slanted in parallel to the right but can be easily arranged so as to slant in parallel to the left. The angled transmit PCB 106''' and the angled receive PCB 108''' are held in place having a width that is on an angle with respect to a horizontal or vertical axis of the fiber optic module 1100. The length of the angled transmit PCB 106''' and the angled receive PCB 108''' are parallel to the optical axis of the receiver 111 and transmitter 110. The angled transmit PCB 106''' includes components 116 and left and right edge traces 921L and 921R. The first terminal pin header 1027T' has pins 117 that couple to holes of the angled transmit PCB 106''' on one end. The angled receive PCB 108''' includes components 112 and left and right edge traces 920L and 920R. The second terminal pin header 1027R' has pins 113 that couple to holes of the angled receive PCB 108''' on one end.

The transmitter 110 is a transmit optical subassembly (Tx OSA) that includes a VCSEL or other semiconductor device that transduces electrical signals into photons or a light output. The receiver 111 is a receive optical subassembly (Rx OSA) including a PIN diode or other device that converts photons or light input into electrical signals. The Tx OSA and Rx OSA are attached to physically separated transmit and receive electrical subassemblies (ESA's). In one embodiment, the transmit ESA includes the angled transmit PCB 106''' with components 116 and the first terminal pin header 1027T' mounted thereto. In one embodiment, the receive ESA includes the angled receive PCB 108''' with components 112 and the second terminal pin header 1027R' mounted thereto.

The baseplate 805'' is similar to the baseplate 805 and 805' but has angled inner septum 815' to be angled in parallel with the angled transmit PCB 106''' and the angled receive PCB 108'''. The baseplates 805, 805', 805'' in one embodiment may be a dielectric to isolate components and insulate them from one another. In another embodiment, baseplates 805, 805', 805'' may be an insulator. In another embodiment, baseplates 805, 805', 805'' may have their septum 815 or 815' metalized so as to provide EMI and crosstalk shielding.

Alternatively, a metal shield my be placed on top of the septum 815 or 815' such as shield 109.

The optical block 402'' is similar to the optical block 402 but has some modifications to accommodate the angled transmit PCB 106''' and the angled receive PCB 108'''. The optical block 402'' includes openings 513'' and 514'' to receive the receiver 111 and transmitter 110 respectively and angled slots 1115 to receive the angled transmit PCB 106''' and the angled receive PCB 108'''. The angled slots 1115 can provide a friction fit with the angled transmit PCB 106''' and the angled receive PCB 108''' or glue or epoxy can be used to couple them together. The angled slots 1115 can also serve to tack the receiver 111 and transmitter 110 in place within the optical block 402''.

The transmitter 110 couples into the opening 514'' of the optical block 402''. The receiver 111 couples into the opening 513'' of the optical block 402''. They can be held in place by either a friction fit or a glue such as an epoxy.

The transmitter 110 also couples to the transmit PCB 106'''. The terminals 810 of the transmitter 110 couple to the transmit PCB 106''' in one embodiment. Using a straddle mount, one or more terminals 810 couple to left edge traces 920L on a left side and one or more terminals 810 couple to right edge traces 920R on a right side of the transmit PCB 106'''. In an alternate embodiment, the terminals 810 may couple to one side of the transmit PCB 106'''. In yet another alternate embodiment, the terminals 810 may couple into holes of the transmit PCB 106'''.

The receiver 111 also couples to the receive PCB 108'''. The terminals 811 of the receiver 111 couple to the receive PCB 108'''. Using a straddle mount, one or more terminals 811 couple to left edge traces 921L on a left side and one or more terminals 811 couple to right edge traces 921R on a right side of the receive PCB 108'''. In an alternate embodiment, the terminals 811 may couple to one side of the receive PCB 108'''. In yet another alternate embodiment, the terminals 811 may couple into holes of the receive PCB 108'''.

Referring now to FIG. 11B, a rear cross-sectional view of the assembled fiber optic module 1100 is illustrated. The angled receive PCB 108''' and the angled transmit PCB 106''' of the fiber optic module 1100 are angled in parallel together with respect to a horizontal or vertical axis thereof. The first terminal pin header 1027T' is coupled to the angled transmit PCB 1027T' so that pins 117 are vertical with the reference axis. The second terminal pin header 1027R' is coupled to the angled receive PCB 108''' so that pins 113 are vertical with the reference axis. A ground plane 118 can be coupled to a side the angled receive PCB 108''' or a ground plane 114 can be coupled to a side of the angled transmit PCB 106''' or both similar to previously described with reference to the vertical boards and FIGS. 9B–9E. The shield housing or cover 419 couples to the baseplate 805'' around the printed circuit boards. Depending upon the width of the printed circuit boards 106''' and 108''' and the width of the fiber optic module 1100, the angles $\theta_3$ and $\theta_4$ which the printed boards make with the base or baseplate 805'' and the angle $\theta_5$ which the septum 815' makes with the base or baseplate 805'' can vary between zero and ninety degrees.

Figure 12A:
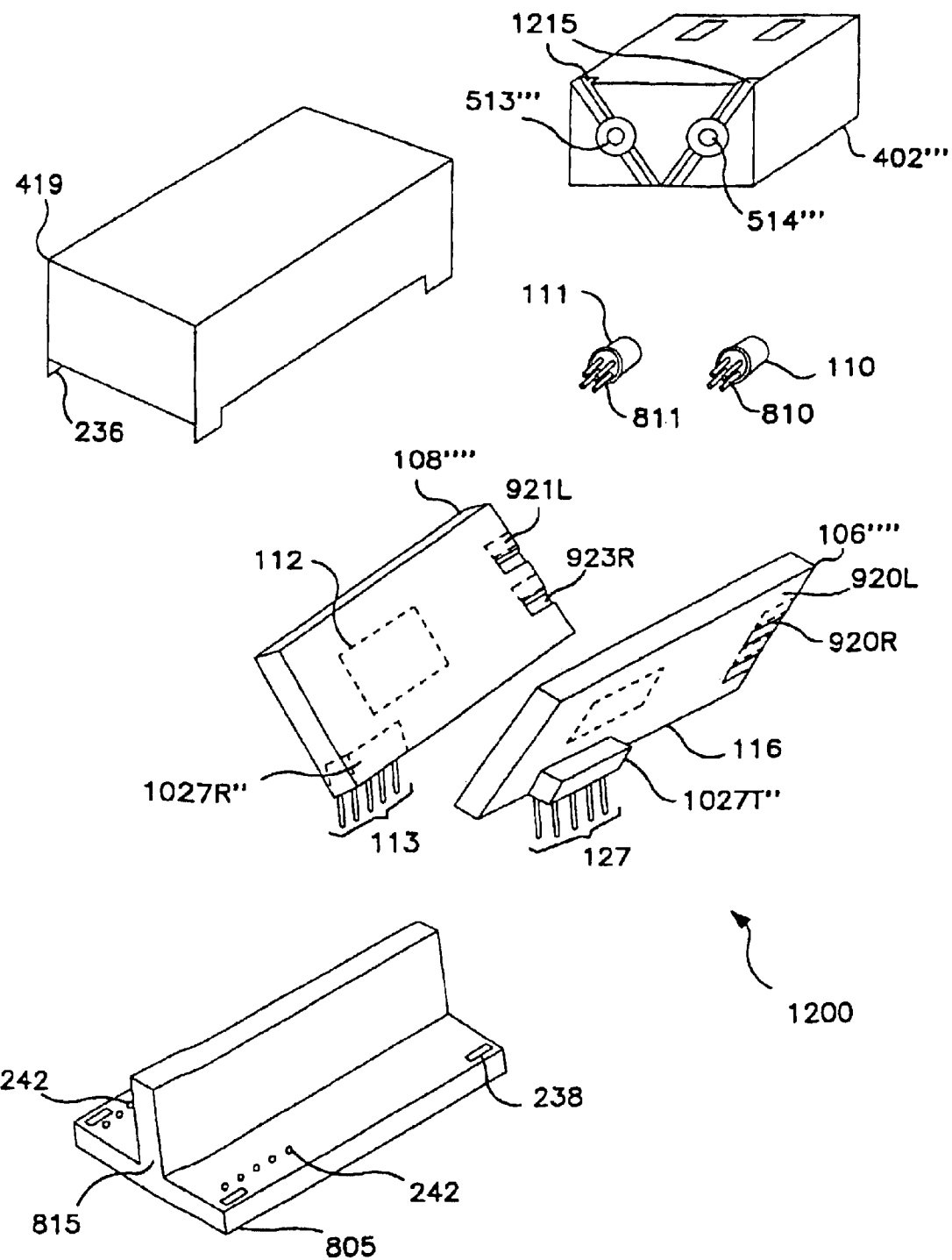
FIG. 12A is an exploded view of another embodiment of the invention.

Referring now to FIG. 12A, another embodiment of the invention is illustrated. FIG. 12A illustrates an exploded view of a fiber optic module 1200. The fiber optic module 1200 has angled or slanted PCBs with respect to a horizontal or vertical axis of the fiber optic module 1200. The PCBs are angled or slanted away at top edges to form a V configuration of PCB orientation. The length of the PCBs remain parallel to the optical axis of the receiver 111 and transmitter 110. By angling the PCBs with the horizontal or vertical axis, the PCBs may be made smaller to fit a smaller form factor or alternatively the surface area can be increased. That is the available PCB surface area for mounting components can be increased for a given volume by angling the PCBs. The increased surface area can give the final assembled fiber optic module increased functionality by allowing components such as integrated circuits and passive components such as filters, capacitors, and inductors to be added. More room can also be provided in the fiber optic module 1200 for mounting larger components by angling the PCBs.

The fiber optic module 1200 includes an angled transmit PCB 106"", an angled receive PCB 108"", the transmitter 110, the receiver 111, an optical block 402''', the shielded housing or cover 419, a first terminal pin header 1027T" for the transmitter, a second terminal pin header 1027R" for the receiver, and the baseplate 805 or 805'.

The angled transmit PCB 106"" and the angled receive PCB 108"" are arranged at an angle with respect to the horizontal axis of the fiber optic module as defined by a line normal to both receiver and transmitter optical axes. The angled transmit PCB 106"" and the angled receive PCB 108"" slant away from each other to form the V configuration. The angled transmit PCB 106"" and the angled receive PCB 108"" are held in place having a width that is on an angle with respect to a horizontal or vertical axis of the fiber optic module 1200. The length of the angled transmit PCB 106"" and the angled receive PCB 108"" are parallel to the optical axis of the receiver 111 and transmitter 110. The angled transmit PCB 106"" includes components 116 and left and right edge traces 921L and 921R. The first terminal pin header 1027T" has pins 117 that couple to holes of the angled transmit PCB 106"" on one end. The angled receive PCB 108"" includes components 112 and left and right edge traces 920L and 920R. The second terminal pin header 1027R" has pins 113 that couple to holes of the angled receive PCB 108"" on one end.

The transmitter 110 is a transmit optical subassembly (Tx OSA) that includes a VCSEL or other semiconductor device that transduces electrical signals into photons or a light output. The receiver 111 is a receive optical subassembly (Rx OSA) including a PIN diode or other device that converts photons or light input into electrical signals. The Tx OSA and Rx OSA are attached to physically separated transmit and receive electrical subassemblies (ESA's). In one embodiment, the transmit ESA includes the angled transmit PCB 106"" with components 116 and the first terminal pin header 1027T" mounted thereto. In one embodiment, the receive ESA includes the angled receive PCB 108"" with components 112 and the second terminal pin header 1027R" mounted thereto.

The optical block 402''' is similar to the optical block 402 but has some modifications to accommodate the angled transmit PCB 106"" and the angled receive PCB 108"". The optical block 402''' includes openings 513''' and 514''' to receive the receiver 111 and transmitter 110 respectively and angled slots 1215 to receive the angled transmit PCB 1061"" and the angled receive PCB 108"". The angled slots 1215 can provide a friction fit with the angled transmit PCB 106"" and the angled receive PCB 108"" or glue or epoxy can be used to couple them together. The angled slots 1215 can also serve to tack the receiver 111 and transmitter 110 in place within the optical block 402'''.

The transmitter 110 couples into the opening 514''' of the optical block 402'''. The receiver 111 couples into the opening 513''' of the optical block 402'''. They can be held in place by either a friction fit or a glue such as an epoxy.

The transmitter 110 also couples to the transmit PCB 106"". The terminals 810 of the transmitter 110 couple to the transmit PCB 106"" in one embodiment. Using a straddle mount, one or more terminals 810 couple to left edge traces 920L on a left side and one or more terminals 810 couple to right edge traces 920R on a right side of the transmit PCB 106"". In an alternate embodiment, the terminals 810 may couple to one side of the transmit PCB 106"". In yet another alternate embodiment, the terminals 810 may couple into holes of the transmit PCB 106"".

The receiver 111 also couples to the receive PCB 108"". The terminals 811 of the receiver 111 couple to the receive PCB 108"". Using a straddle mount, one or more terminals 811 couple to left edge traces 921L on a left side and one or more terminals 811 couple to right edge traces 921R on a right side of the receive PCB 108"". In an alternate embodiment, the terminals 811 may couple to one side of the receive PCB 108"". In yet another alternate embodiment, the terminals 811 may couple into holes of the receive PCB 108"".

Figure 12B:
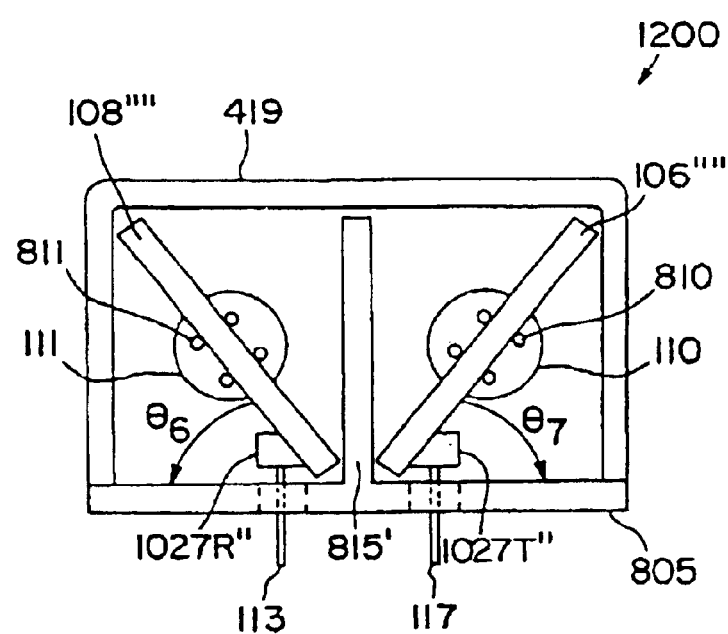
FIG. 12B is a rear cross sectional view of the assembled invention illustrated in FIG. 12A.

Referring now to FIG. 12B, a rear cross-sectional view of the assembled fiber optic module 1200 is illustrated. The angled receive PCB 108"" and the angled transmit PCB 106"" of the fiber optic module 1200 are angled away from each other with respect to a horizontal or vertical axis thereof. The first terminal pin header 1027T" is coupled to the angled transmit PCB 1027T" so that pins 117 are vertical with the reference axis. The second terminal pin header 1027R" is coupled to the angled receive PCB 108"" so that pins 113 are vertical with the reference axis. A ground plane 118 can be coupled to a side the angled receive PCB 108"" or a ground plane 114 can be coupled to a side of the angled transmit PCB 106"" or both similar to previously described with reference to the vertical boards and FIGS. 9B–9E. The shield housing or cover 419 couples to the baseplate 805 or 805' around the printed circuit boards. Depending upon the width of the printed circuit boards 106"" and 108"" and the width of the fiber optic module 1200, the angles $\theta_6$ and $\theta_7$ which the printed boards make with the base or baseplate 805 or 805' can vary between zero and ninety degrees.

Figure 16B:
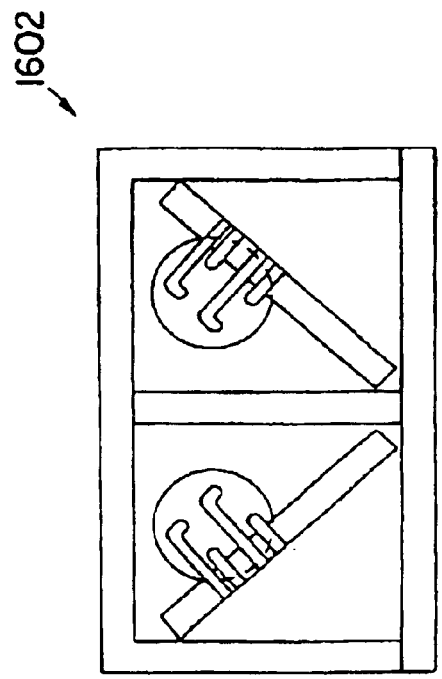
FIG. 16B illustrates a rear cross sectional view of an assembled alternate embodiment of the invention.
Figure 16A:
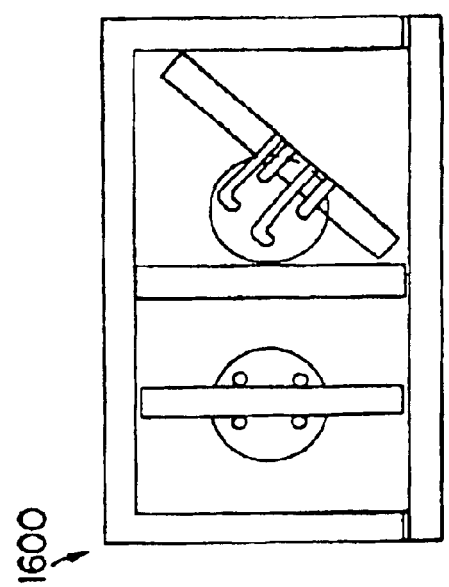
FIG. 16A illustrates a rear cross sectional view of an assembled alternate embodiment of the invention.

While symmetrical angles for the printed circuit boards have been illustrated, combinations can be utilized to form alternate embodiments. For example, one of the printed circuit boards may be arranged on an angle with the base so as to slant while the other printed circuit board may be arranged perpendicular to the base. FIG. 16A illustrates a fiber optic module 1600 with such an arrangement for an alternate embodiment of the invention.

Figure 13:
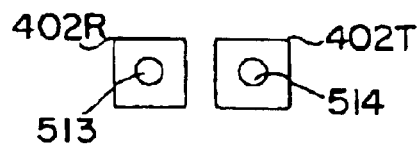
FIG. 13 illustrates a receive optical block and a transmit optical block as an alternative to a single optical block.

Referring now to FIG. 13, a receiver optical block 402R and a transmitter optical block 402T are illustrated as an alternative to the optical block 402 or 402'. Previously the fiber optic modules were described and illustrate using a single optical block 402 or 402'. However, the optical blocks 402R and 402T can provide similar functionality to the single optical block 402 or 402'. The receiver optical block 402R couples to the receiver 111 while the transmit optical block 402T couples to the transmitter 110. The receiver 111 and transmitter 110 can be press fit into the openings 513 and 514 or alternatively a glue or epoxy can inserted into the tacking holes to couple them together. Each optical receiver optical block 402R and transmit optical block 402T provides alignment to an optical fiber and may include a lens. If one more receiver channels are desired, one or more receiver optical blocks 402R can be utilized. If one or more transmit channels are desired, one or more transmit optical blocks 402T can be utilized.

Figure 14A:
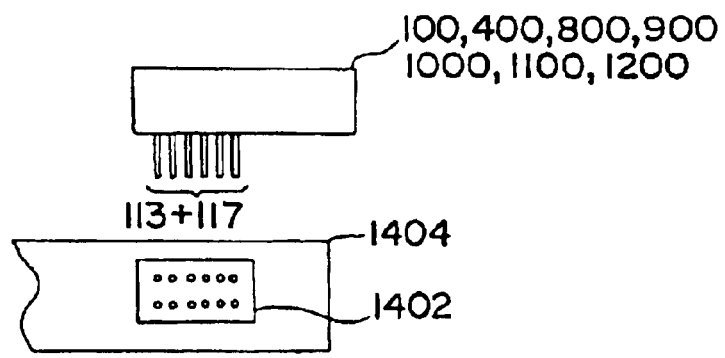
FIG. 14A illustrates how the pin configuration of the fiber optic modules can plug into a socket on a host printed circuit board.
Figure 14B:
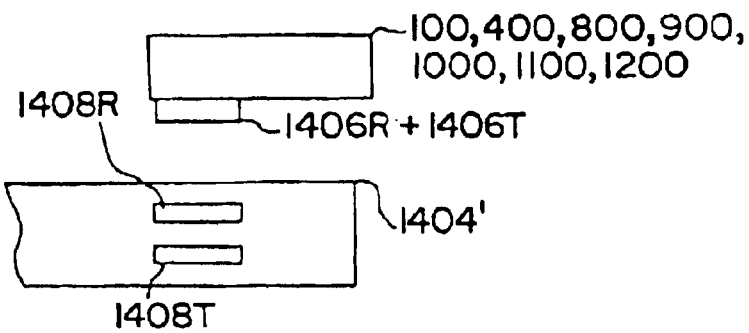
FIG. 14B illustrates how a socket configuration of the fiber optic modules can plug into a socket on a host printed circuit board.
Figure 14C:
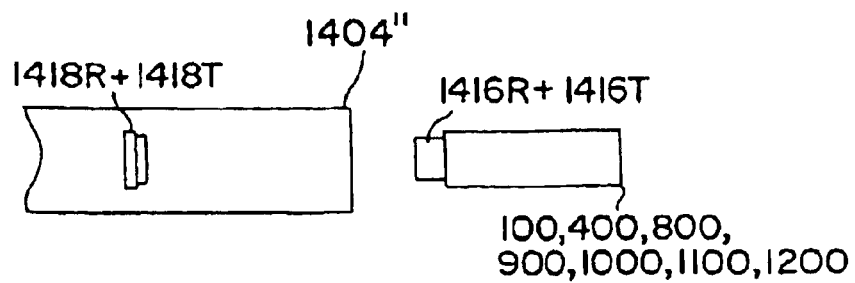
FIG. 14C illustrates how a socket configuration of the fiber optic modules can horizontally plug into a socket on a host printed circuit board.

While pins 113 and 117 of the fiber optic modules (100, 400, 800, 900, 1000, 1100, or 1200) facilitate soldering to a host printed circuit board, they can also be plugged into a socket 1402 on a host printed circuit board 1404 as illustrated in FIG. 14A. Alternatively, the pins 113 and 117 can each be replaced with one or more sockets 1406R and 1406T coupled to the printed circuit boards on the bottom edge or back edge. In the case of sockets 1406R and 1406T on the bottom edges of the printed circuit boards, the fiber optic module (100, 400, 800, 900, 1000, 1100, or 1200) plugs vertically or downward on sockets 1408R and 1408T for example of the host printed circuit board 1404' as illustrated by FIG. 14B. In the case of a socket or sockets 1416R and 1416T on the back edge of the printed circuit boards, the fiber optic module (100, 400, 800, 900, 1000, 1100, or 1200) plugs horizontally or inward into a socket or sockets 1418R and 1418T of the host printed circuit board 1404".

Referring now FIG. 15A, an alternate embodiment of a shielded housing or cover 1519 and an alternate base 1505. The shielded housing or cover 1519 includes a center inner septum 1515 incorporated as part of the housing or cover to isolate a transmit channel from a receive channel or one channel from another channel. The center inner septum 1515 splits the fiber optic module into a left side and a right side as does the other septums described herein. The housing or cover 1519 further includes a back side 1521, a left side 1522, a right side 1523 and clips or tabs 236. A front side 1524 of the housing or cover 1519 is open to couple to the optical block 402 and/or a nose.

Figure 15B:
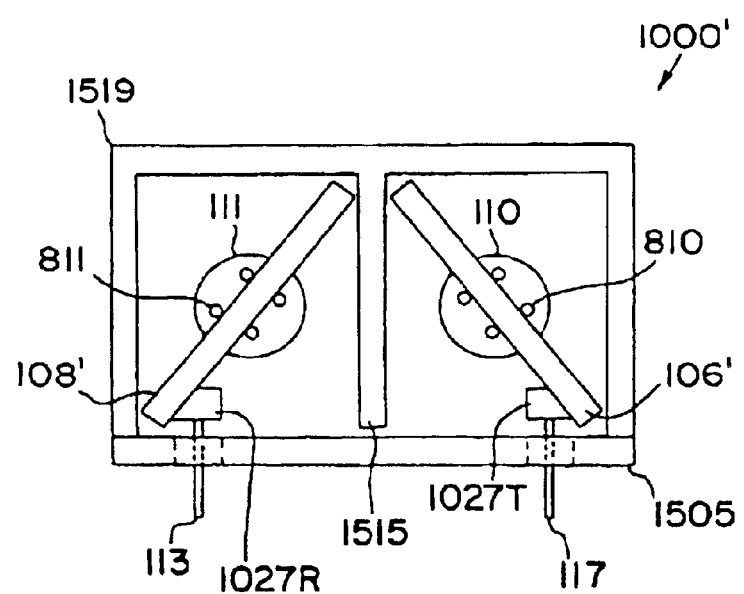
FIG. 15B illustrates a rear cross sectional view of the assembled invention illustrated in FIG. 10A substituting the alternate embodiment of the shielded housing or cover of FIG. 15A.

The alternate base 1505 has no septum and may include clip openings or slots 238. Alternately, a base is without the clip openings or slots 238 such that the clips or tabs 236 of the housing or cover are bent over and around the base. Referring now to FIG. 15B, a cross sectional view of a fiber optic module 1000' utilizing the alternate embodiment of the shielded housing or cover 1519 and base 1505 is illustrated. The fiber optic module 1000' is similar to fiber optic module 1000 as described with reference to FIGS. 10A–10B but for the alternate shielded housing or cover 1519 and the alternate base 1505.

Figure 15C:
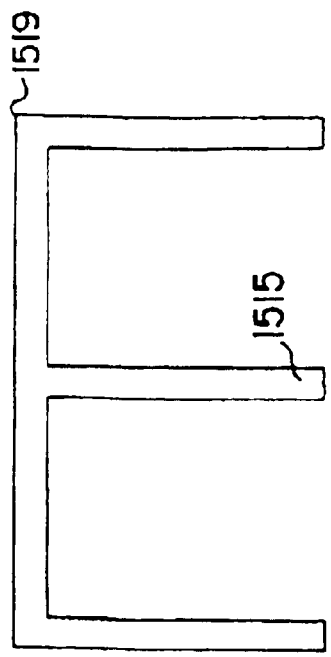
FIG. 15C illustrates a rear cross sectional view of the alternate embodiment of the shielded housing or cover of FIG. 15A.

Referring now to FIG. 15C, a cross sectional view of the alternate embodiment of the shielded housing or cover 1519 is illustrated. The shielded housing or cover 1519 is a monolithic or integrated shielded housing or cover incorporating the septum 1515. The shielded housing or cover 1519 can be formed of a metal, a plastic or other solid material. The shielded housing or cover 1519 if made of metal, can be formed by forging, stamping or machining. Lower costs methods to fabricate the shielded housing or cover 1519 include injection, transfer, or blow molding the shape out of plastic. The plastic can then be plated, painted or otherwise coated with a conductive material, if conductivity is desired. Likewise a metal part can be overcoated with a non-conductive material if conductivity is not desired.

Figure 15E:
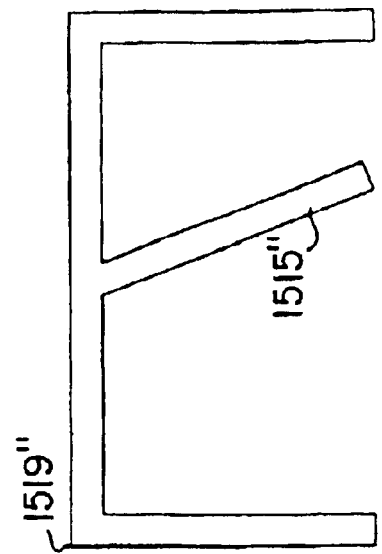
FIG. 15E illustrates a cross sectional view of another alternate embodiment of the shielded housing or cover.
Figure 15D:
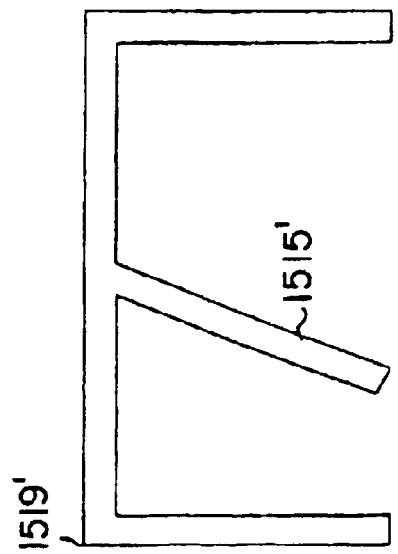
FIG. 15D illustrates a cross sectional view of another alternate embodiment of the shielded housing or cover.

Referring now to FIG. 15D and FIG. 15E, the septum can be angled as well to accommodate parallel angled PCB boards as illustrated by the septum 1515' of the shielded housing or cover 1519' and the septum 1515" of the shielded housing or cover 1519".

Figure 15G:
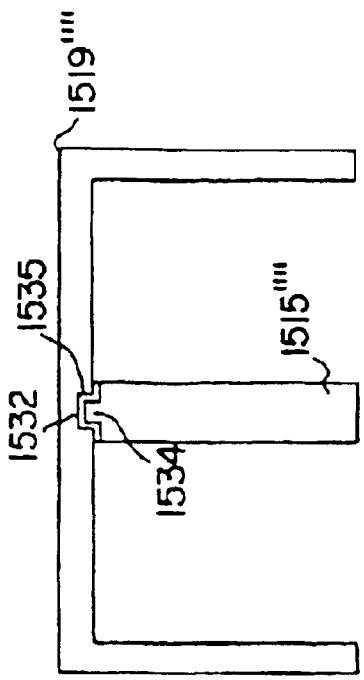
FIG. 15G illustrates a cross sectional view of another alternate embodiment of the shielded housing or cover.
Figure 15F:
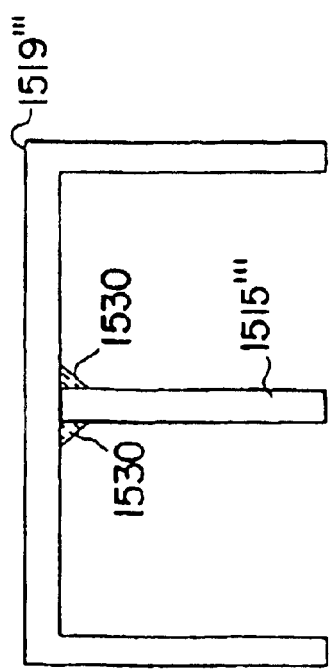
FIG. 15F illustrates a cross sectional view of another alternate embodiment of the shielded housing or cover.

Referring now to FIG. 15F, the septum can be formed separately from the housing or cover and coupled thereto. The shielded housing or cover 1519''' includes a septum 1515''' which is formed separately and coupled together. The septum 1515''' can be coupled to the outer housing by using fusion techniques such as soldering, welding, or melting. FIG. 15F illustrates the fuse links 1530 (solder, weld, etc) coupling the septum 1515''' to the outer housing of the shielded housing or cover 1519'''.

Referring now to FIG. 15G, the septum can be formed separately from the housing or cover and coupled thereto by alternate means. FIG. 15G illustrates the shielded housing or cover 1519'''' including a septum 1515'''' which is formed separately and coupled together. The outer cover of the shielded housing or cover 1519'''' includes a groove 1532 and the septum 1515'''' includes a tongue 1534 to form a tongue and groove system. A glue, adhesive or epoxy 1535 is applied between the tongue and groove system which may be conductive or non-conductive to couple the outer housing and the septum 1515'''' together to form the shielded housing or cover 1519''''.

The fiber optic modules previously described with reference to FIGS. 8A–15G were illustrated with the optoelectronic devices (transmitter 110 and receiver 111) having its terminals coupled to the printed circuit boards using a straddle mount. However, one or all of the optoelectronic devices may have their terminals coupled to the printed circuit boards using a through hole mount. In a straddle mount, the optoelectronic device (i.e. the transmitter 110 or the receiver 111) has its optical axis nearly in-line and parallel with a plane of the printed circuit board. In a through hole mount, the optoelectronic device (i.e. the transmitter 110 or the receiver 111) has its optical axis nearly parallel with a plane of the printed circuit board.

Referring now to FIG. 16A, a rear cross-section of a fiber optic module 1600 is illustrated having a first optoelectronic device with its terminals coupled to a first printed circuit board in a straddle mount configuration and a second optoelectronic device with its terminals coupled to a second printed circuit board in a through hole mount configuration. Alternatively, both the first optoelectronic device the second optoelectronic device may have their terminals coupled to their respective printed circuit boards in a through hole mount configuration as illustrated by the rear cross-section of fiber optic module 1602 of FIG. 16B.

Referring now to FIGS. 17A–17D, 18A–18B, and 19A–19B additional dual board embodiments of fiber optic modules are illustrated.

Figure 17A:
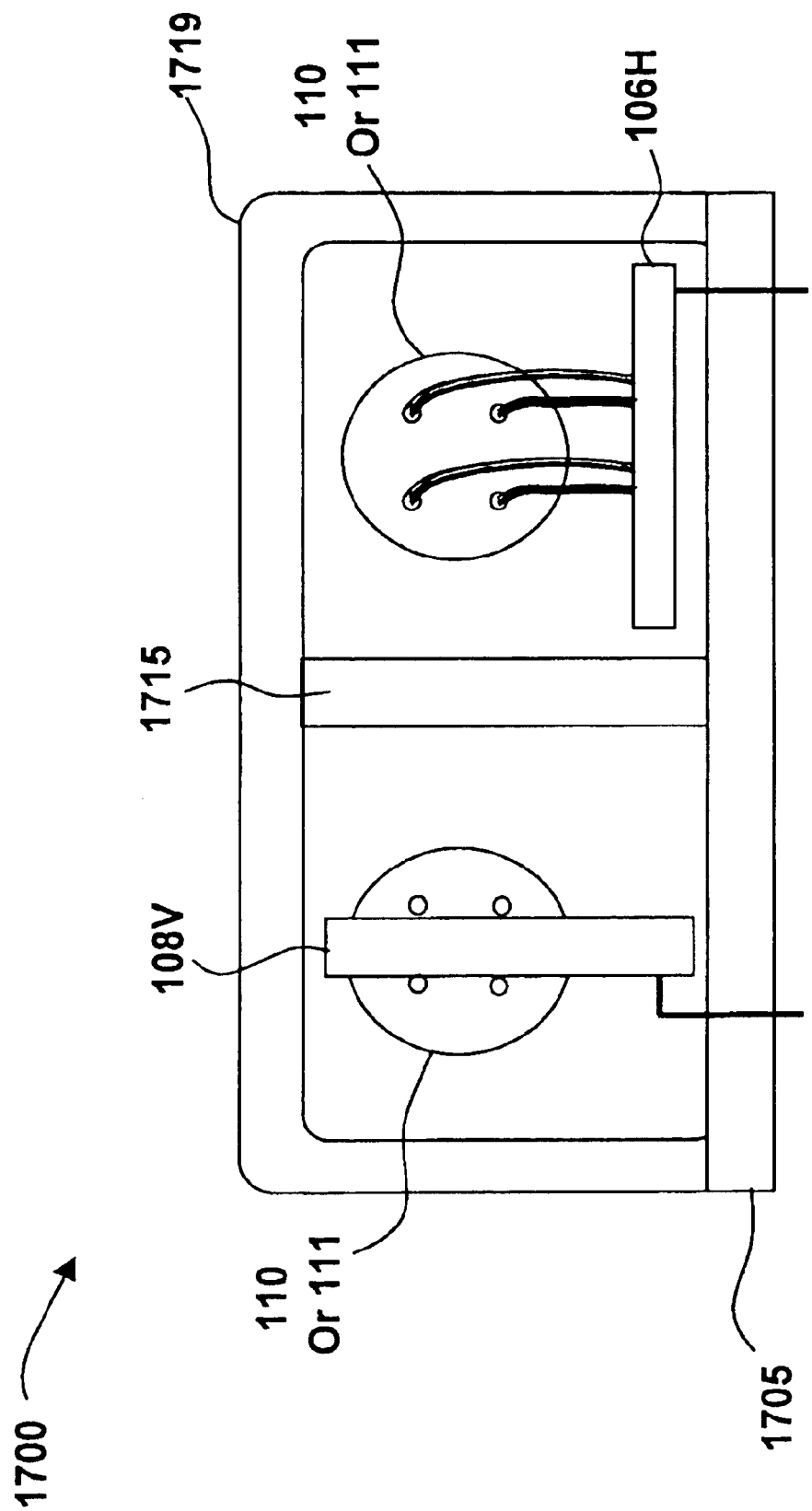
FIGS. 17A–17D illustrate rear cross sectional views of assembled alternate embodiments of the invention.

Referring now to FIG. 17A, fiber optic module 1700 is illustrated. Fiber optic module 1700 includes a vertical board 108V the horizontal board 106H, and an outer housing cover 1719 and a base 1705. The fiber optic modules 1700 may additionally include an optional septum 1715 to shield and separate the electronic circuits on boards 108V and 106H. The board 108V is on one side of the fiber optic module 1700 while the board 106H is on another side of the fiber optic module 1700.

The first printed circuit board 108V has a first optical electronic device with its terminals coupled near to in a straddle mount configuration. The second printed circuit board 106H has an optical electronic device with its terminals coupled there to in a through hole mount configuration. The base 1705 provides support for the first and second printed circuit boards as well as encloses the fiber optic module 1700. In one embodiment the first printed circuit board 108V is a vertical transceiver printed circuit board while the horizontal printed circuit board 106H is a horizontal transceiver board.

Figure 17B:
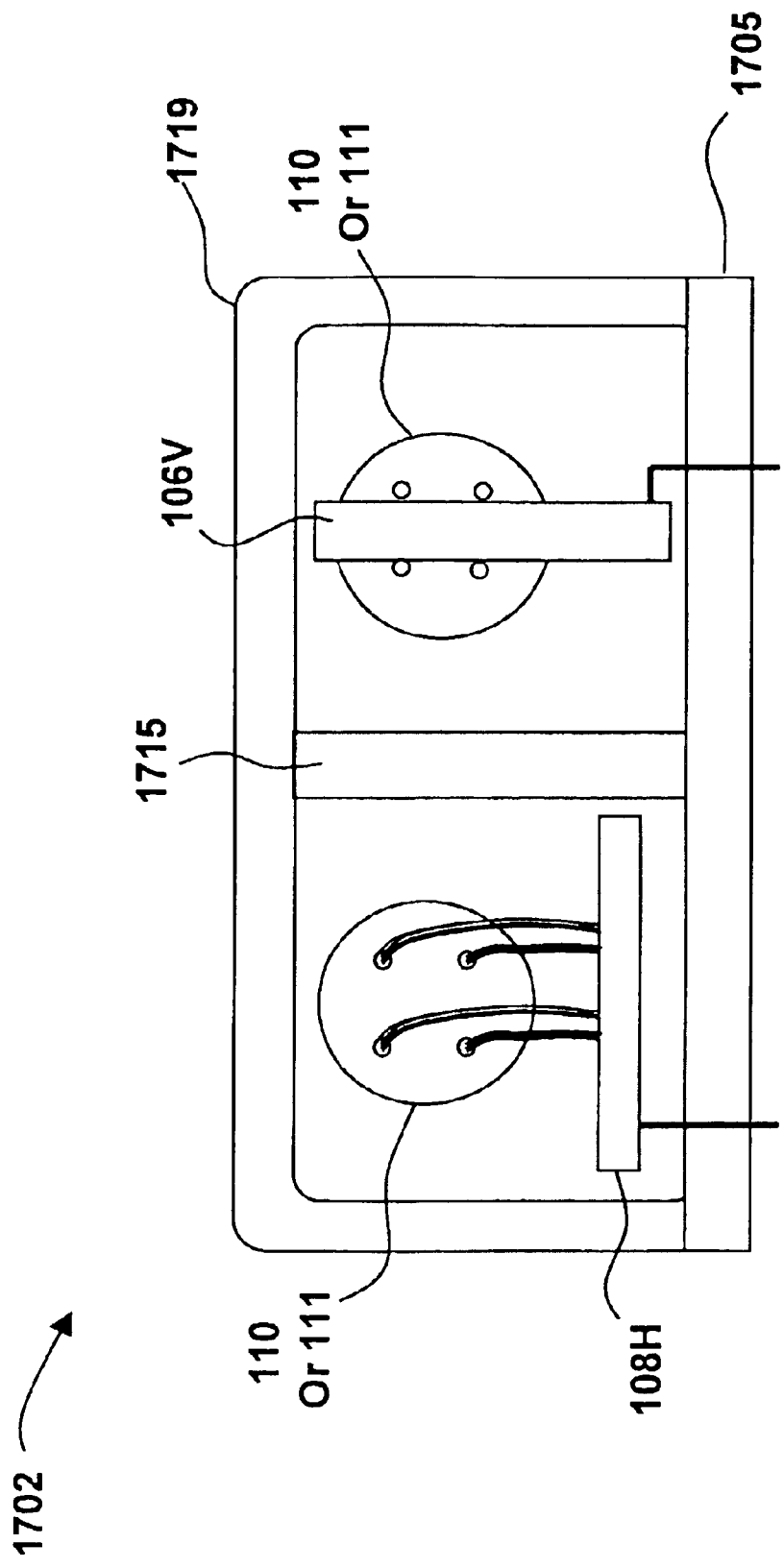

Referring now to FIG. 17B, fiber optic module 1702 is illustrated. Fiber optic module 1702 includes a first horizontal printed circuit board 108H, a second vertical printed circuit board 106V, a base 1705 and a cover or housing 1719. Fiber optic module 1702 may also optionally include a septum 1715. Base 1705 is similar to the base 1505 previously described and may include one or more openings in order to allow a connector or a pin or a plurality of pins to pass there through. In one embodiment, the first horizontal printed circuit board 108H is a transmit printed circuit board and the second vertical board 106V is a receive print circuit board. In FIG. 17B, the first optical electronic device is coupled to the first horizontal printed circuit board 108H in a through hole mount configuration. The second optical electronic device is coupled to the vertical printed circuit board 106V in a straddle mount configuration.

Figure 17C:
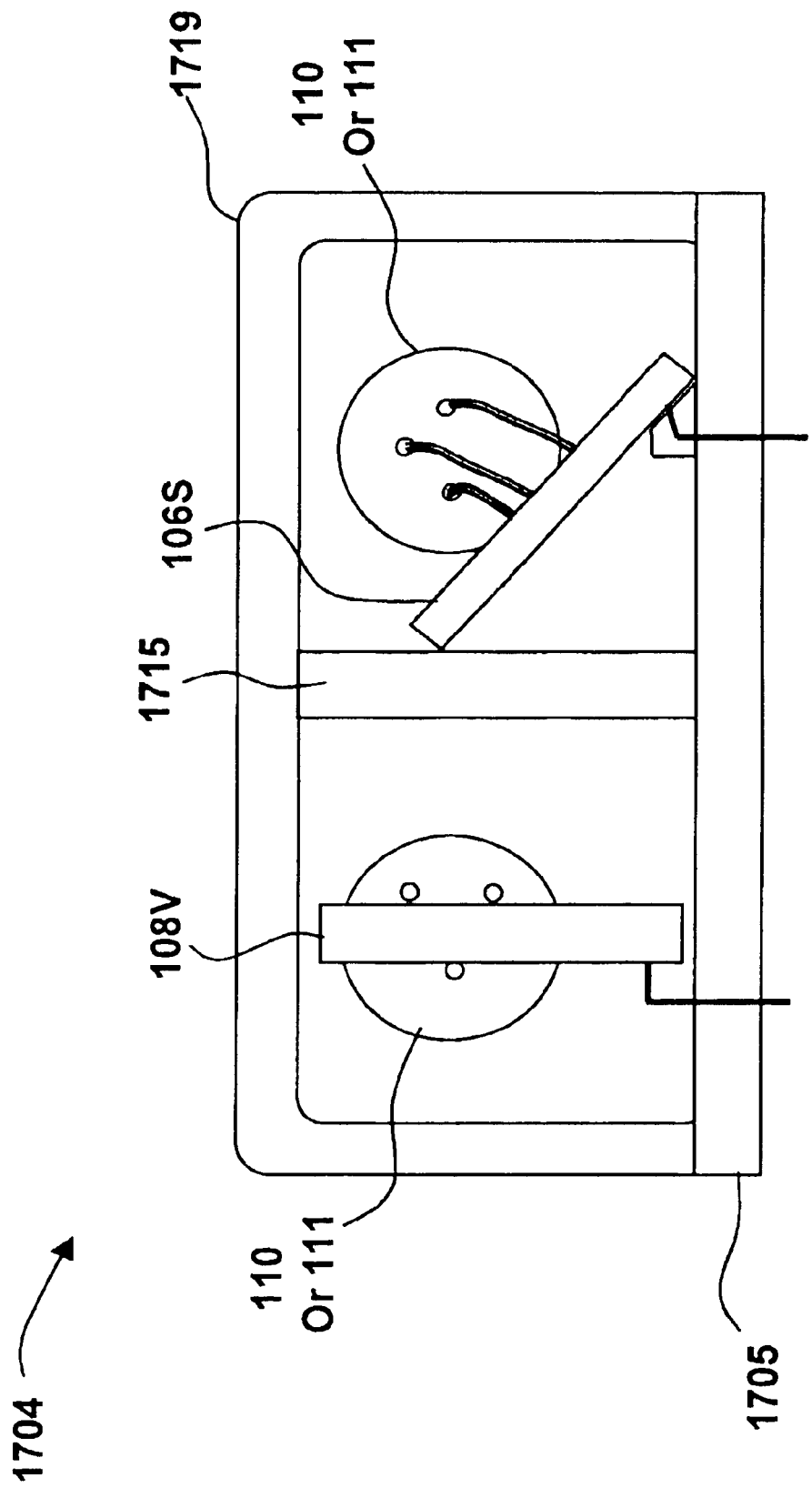

Referring now to FIG. 17C, fiber optic module 1704 illustrated. Fiber optic module 1704 includes housing will cover 1719, a base 1705, a first vertical printed circuit board 108V, and a second slanted printed circuit board 106S. Fiber optic module 1704 may further include septum 1715 to shield electromagnetic radiation from either printed circuit board. The first vertical printed circuit board 108V includes a first optical electronic device 110 or 111. The second slanted printed circuit board 106S includes a second opto electronic device 110 or 111. In one embodiment the first optic electronic device is coupled to the vertical printed circuit 108V in a straddle mount configuration. In one embodiment the second optic electronic device is coupled to the second slanted printed circuit board 106S in through hole mount configuration.

Figure 17D:
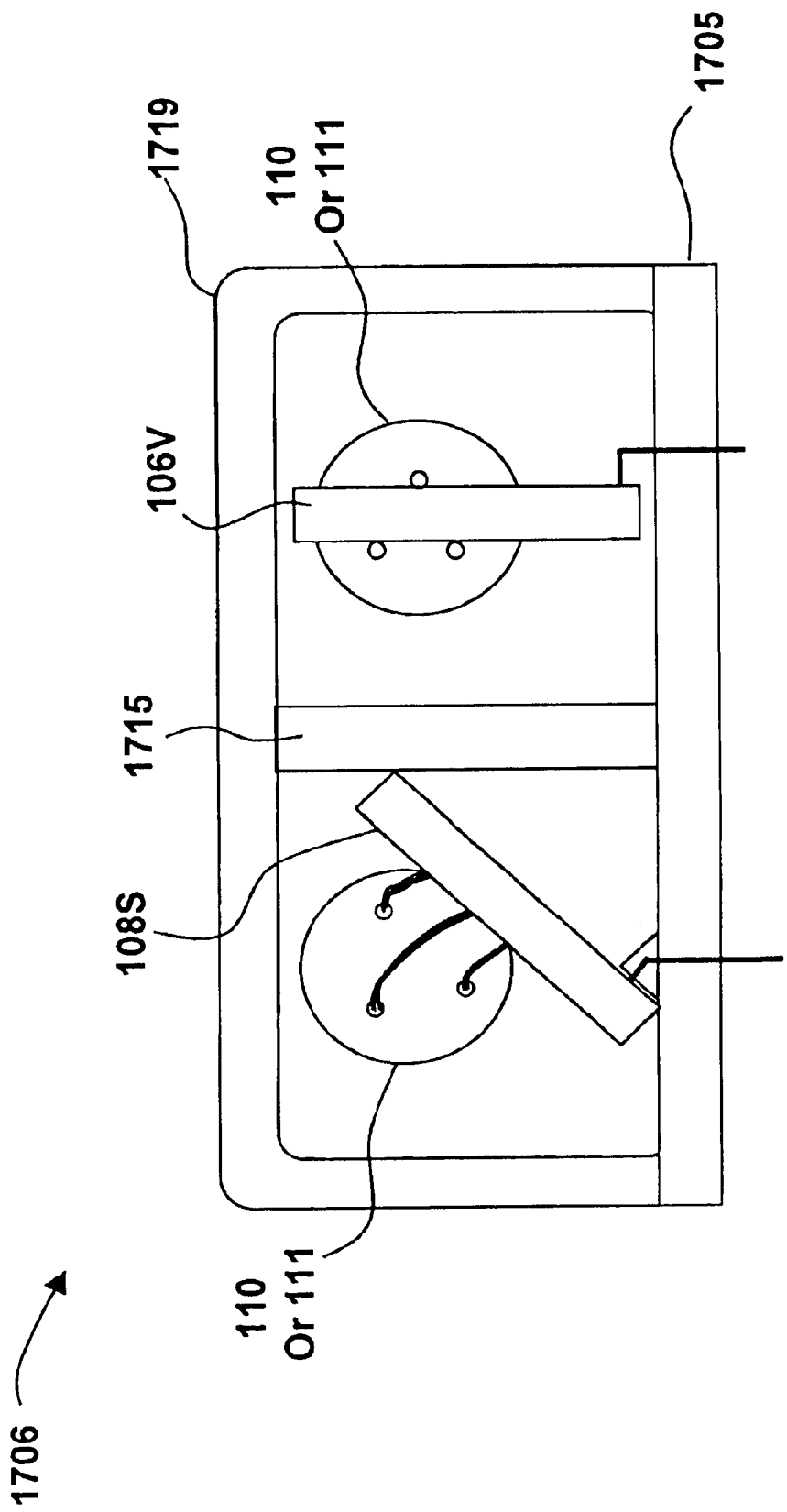

Referring now to FIG. 17D, a fiber optic module 1706 is illustrated. Fiber optic modules 1706 includes a housing or cover 1719, a base 1705, a first slanted printed circuit board 108S, and a second vertical printed circuit board 106V. A first optic electronic device is coupled to the first slanted printed circuit board 108S and a second optic electronic device is coupled to the second vertical printed circuit board 106V. Either the first and/or second optical electronic devices maybe a transmitter or receiver 110 or 111. In one embodiment the first optical electronic device is coupled to the first slanted printed circuit board 108S using a through hole mount configuration. In one embodiment the second optical electronic device 110 or 111 is coupled to the vertical printed circuit board 106V using a straddle mount configuration. The base 1705 may also be referred to as a cover.

Figure 18A:
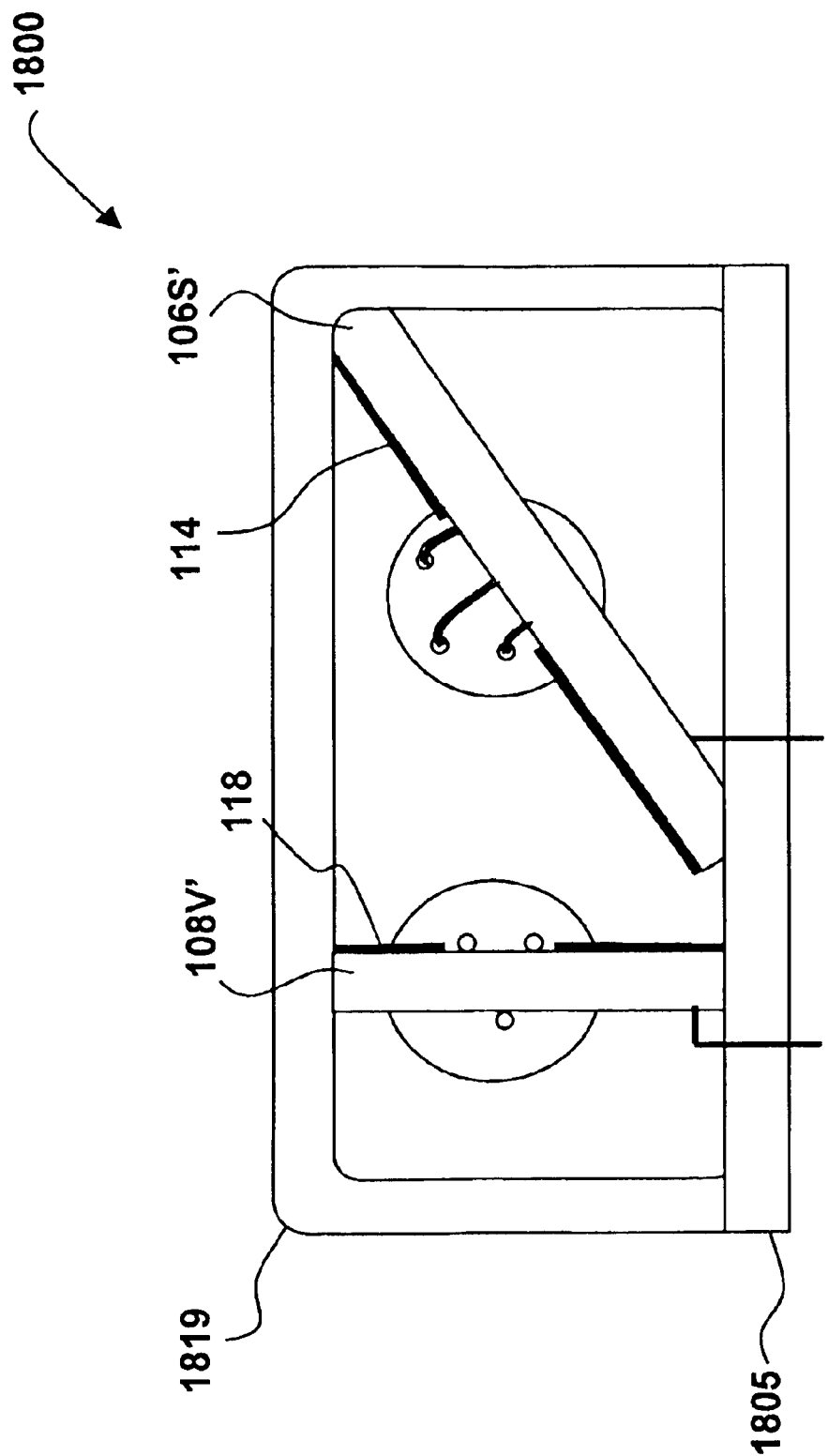
FIGS. 18A–18B illustrate rear cross sectional views of assembled alternated embodiments of the invention.

Referring now to FIG. 18A, a fiber optic module 1800 is illustrated. Fiber optic module 1800 includes a base or cover 1805, a housing or cover 1819, a first vertical printed circuit board 108V-, and a second slanted printed circuit board 106F-. The vertical printed circuit board 108V- includes a ground plane 118. The second slanted printed circuit 106S- includes a ground plane 114. Each of the ground planes provides sufficient shielding.

Figure 18B:
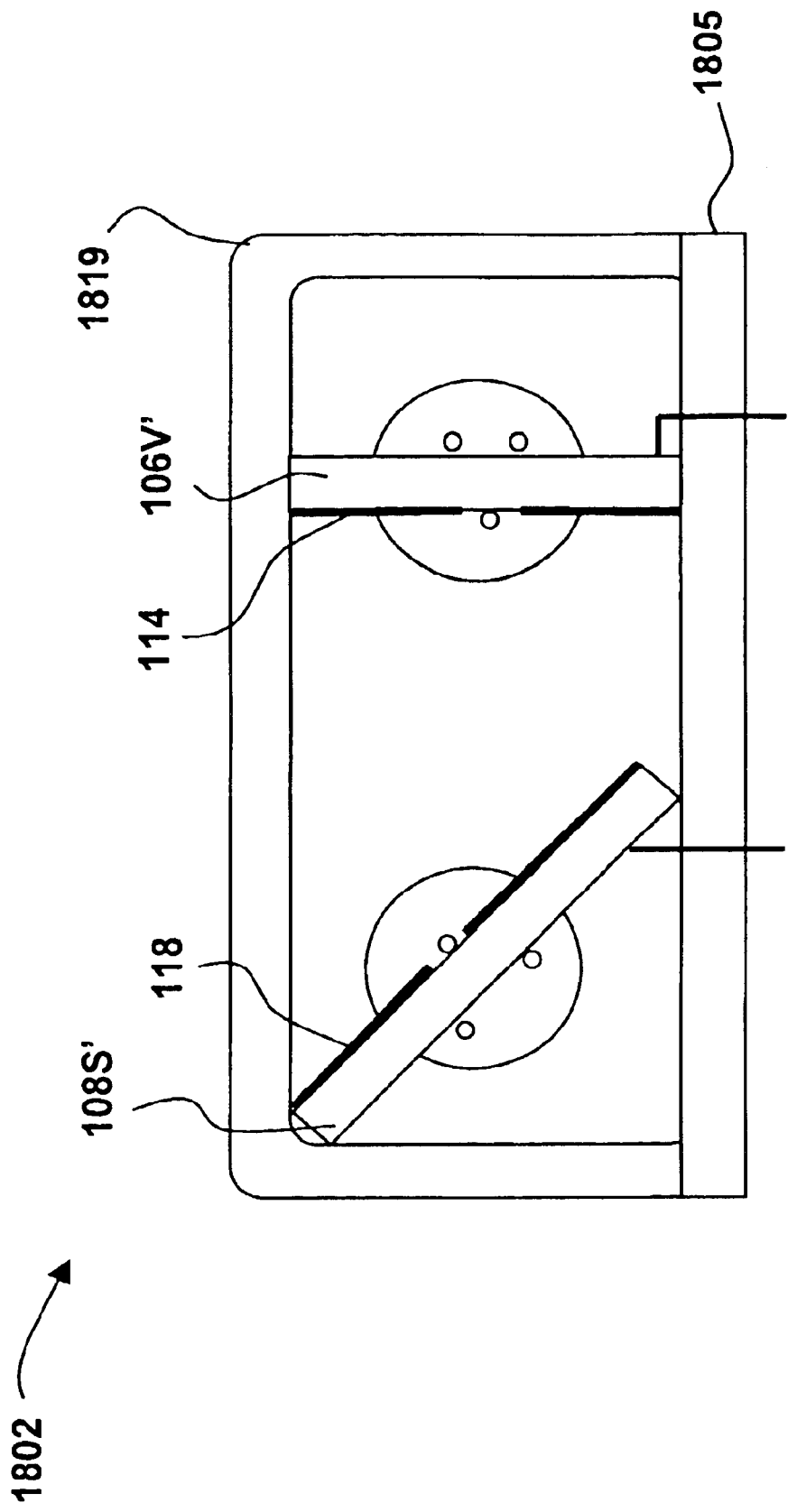

Referring now to FIG. 18B, fiber optic module 1802 is illustrated. Fiber optic module 1802 includes a base or cover 1805, a housing or cover 1819, a first slanted printed circuit board 108S-, and a second vertical printed circuit board 106V-. The first slanted printed circuit board 108S- includes a ground plane 118. The second vertical printed circuit board 106V- includes a ground plane 114. Each of the slanted printed circuit boards in FIGS. 18A and 18B maybe substituted with a horizontal printed circuit board. In FIGS. 18A and 18B each of the first and second printed circuit boards included a ground plane. However, it maybe the case that a single ground plane on one of either of the printed circuit boards is sufficient for shielding purposes.

Figure 19A:
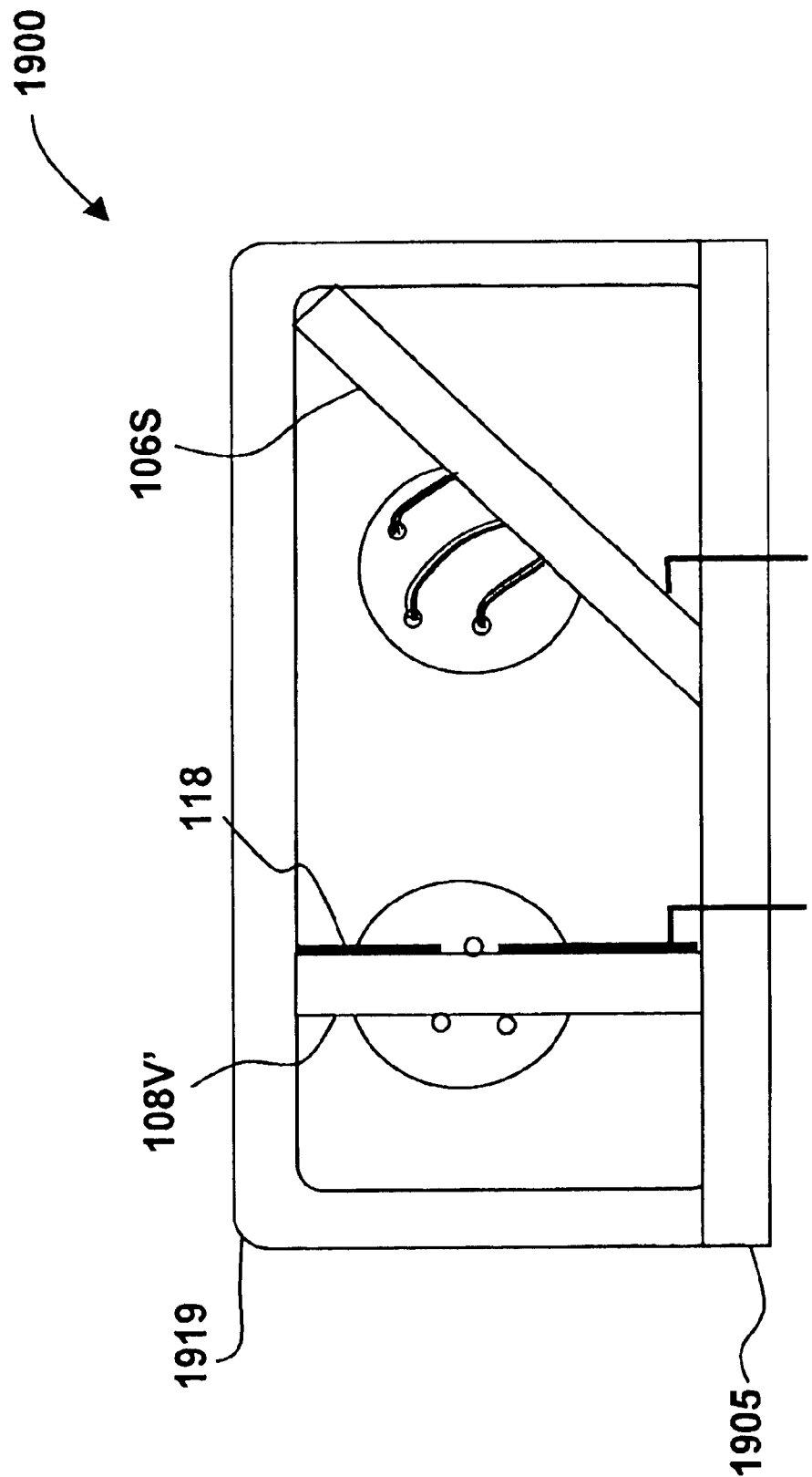
FIGS. 19A–19B illustrate rear cross sectional views of assembled alternated embodiments of the invention.
Figure 19B:
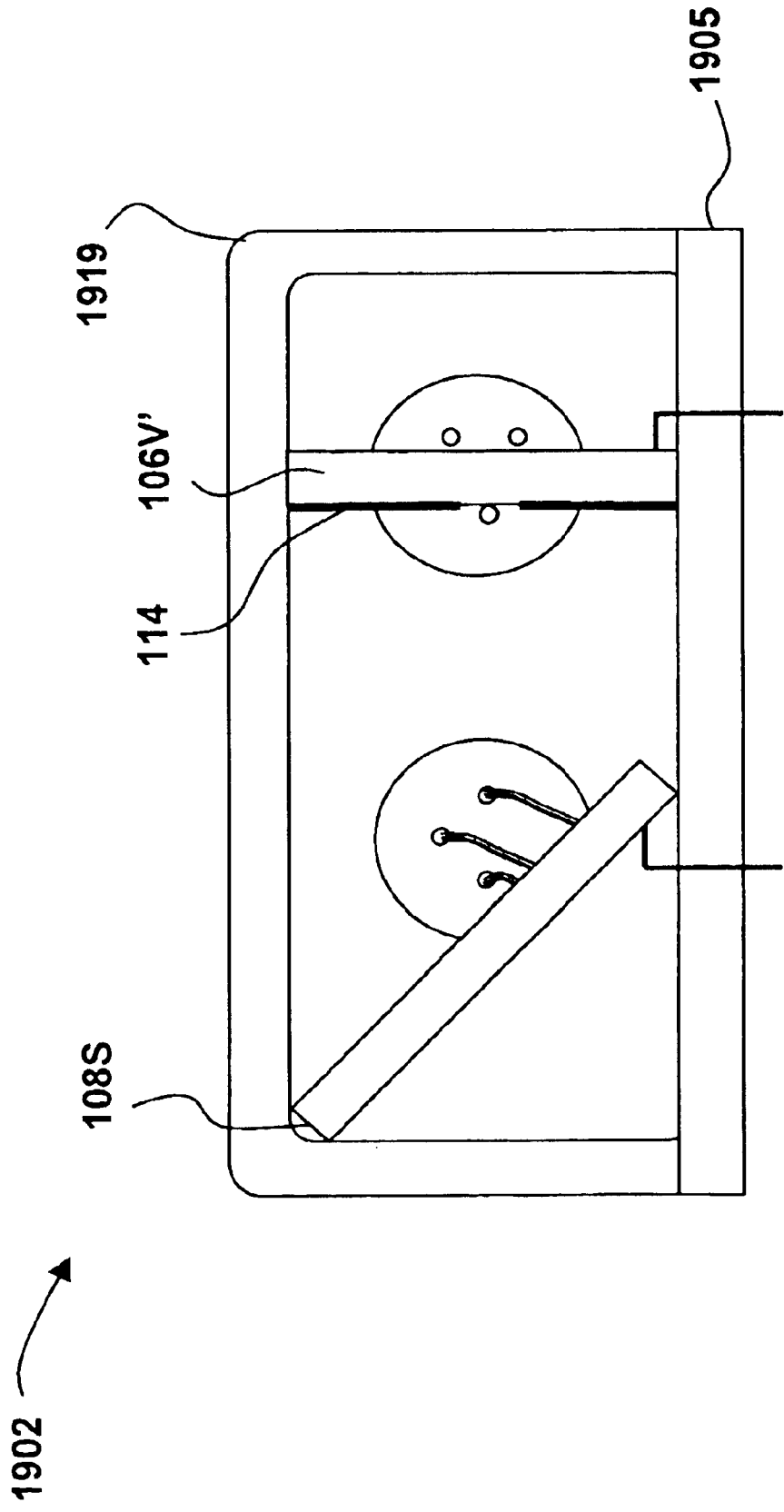

Referring now to FIGS. 19A–19B, a single printed circuit board includes a ground plane to provide shielding to avoid cross talk between channels. Referring now to FIG. 19A, a fiber optic module 1900 is illustrated. Fiber optic module 1900 includes a base or cover 1905, a housing or cover 1919, a first vertical printed circuit board 108V', and a second slanted printed circuit board 106S. In this case, the first vertical printed 108V' includes a ground plane 118 while the second slanted printed circuit board 106S does not.

Referring now to FIG. 19B, a fiber optic module 1902 is illustrated. Fiber optic module 1902 includes a base or cover 1905, a housing or cover 1919, a first slanted printed circuit board 108S and a second vertical printed circuit board 106V-. The second vertical printed circuit board 106V- includes a ground plane 114 while the first slanted printed circuit board 108S does not. In FIGS. 19A–19B, slanted printed circuit boards 106S and 108S were respectfully described which can also be substituted with a horizontal printed circuit board 106H or horizontal printed circuit board 108H respectfully.

Referring now to FIGS. 20A–20E, a three-channel system is illustrated which provides a redundant receiver or transmitter channel. FIGS. 20A–20E illustrate a tri-board embodiments of fiber optic modules to provide a redundant transmit or receive channel. Because of the stress applied to the semiconductor material for the transmitter the more likely the channel to become defective is the transmit channel which includes the emitter. A detector, such as a PIN or PN photodiode commonly used to measure power output in a transmitter, can also be utilized to detect failure of a receiver or a transmitter channel in order to switch to a redundant receiver or transmitter in a fiber optic module. Each receiver in essence would include a redundant photodiode on the same substrate with an extra terminal.

Figure 20A:
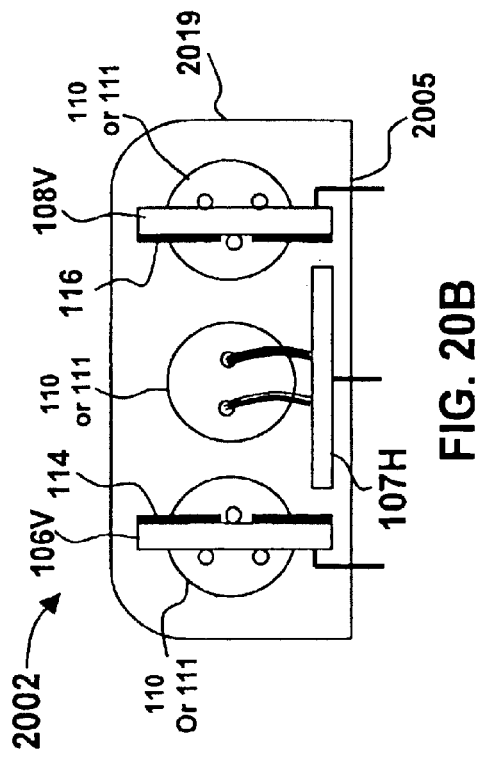

Referring now to FIG. 20A, a fiber optic module 2000 is illustrated. Fiber optic module 2000 includes a base or cover 2005, a housing or cover 2019, a first vertical printed circuit board 106V, a second vertical printed circuit board 107V, a third vertical printed circuit board 108V. Each of the vertical printed circuit boards 106V, 107V, and 108V may include a transmitter or receiver optical electronic device 110 or 111. A first optical electronic device is coupled to the vertical printed circuit board 106V using a straddle mount configuration. A second optical electronic device is coupled to the second vertical printed circuit board 107V in a straddle mount configuration. A third optical electronic device is coupled to the third vertical printed circuit board 108V in a straddle mount configuration as well.

Figure 20B:
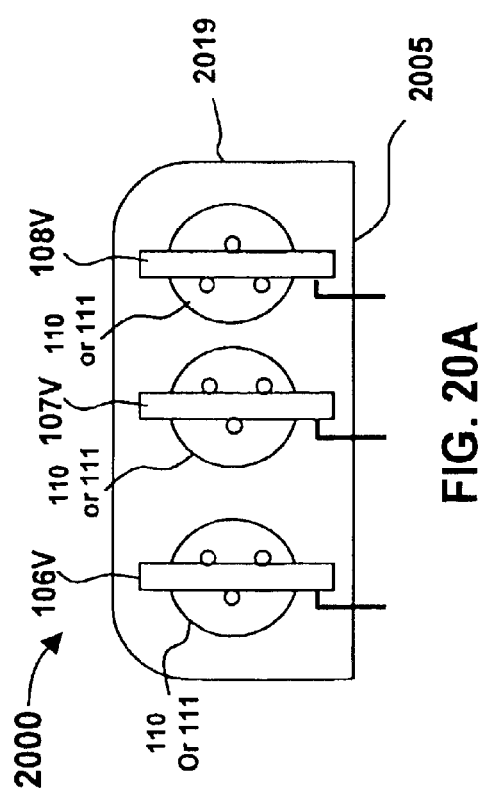

Referring now to FIG. 20B, a fiber optic module 2002 is illustrated. Fiber optic module 2002 includes a base or cover 2005, a housing or cover 2019, a first vertical printed circuit board 106V, a second horizontal printed circuit board 107H, and a third vertical printed circuit board 108V. The vertical printed circuit boards 106V and 108V may include a ground plane 114 and 118 respectfully as illustrated in FIG. 20B. In one embodiment the vertical printed circuit board 106V has a transmitter or receiver 110 or 111 coupled thereto using a straddle mount configuration. In one embodiment the vertical printed circuit board 108V has a transceiver or receiver 110 or 111 coupled thereto using a straddle mount configuration. In one embodiment the horizontal printed circuit board 107H has a transmitter or receiver 110 or 111 coupled thereto using a through hole mount configuration.

Figure 20C:
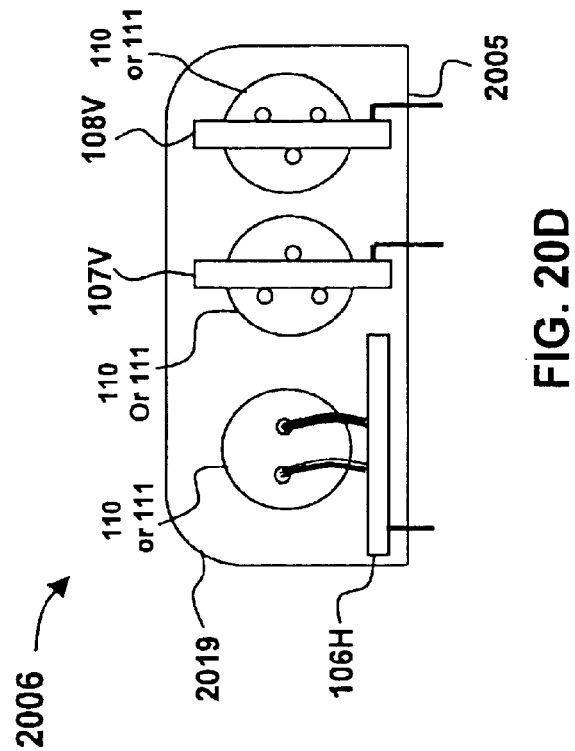

Referring now to FIG. 20C, a fiber optic module 2004 is illustrated. A fiber optic module 2004 includes a base or cover 2005, a housing or cover 2019, a first vertical printed circuit board 106V, a second vertical printed circuit board 107V, and a third horizontal printed circuit board 108H. The first vertical printed circuit board 106V has a first optical electronic device 110 or 111 coupled thereto. A second vertical printed circuit board 107V has a second optical electronic device 110 or 111 coupled thereto. The third horizontal vertical printed circuit board 108H includes a third optical electronic device 110 or 111 coupled thereto. In one embodiment the first vertical printed circuit board and the second vertical printed circuit board 106V and 107V have the first and second optical electronic devices coupled thereto using a straddle mount configuration. In one embodiment the horizontal printed circuit board 108H includes a third optical device coupled thereto using a through hole mount configuration.

Figure 20D:
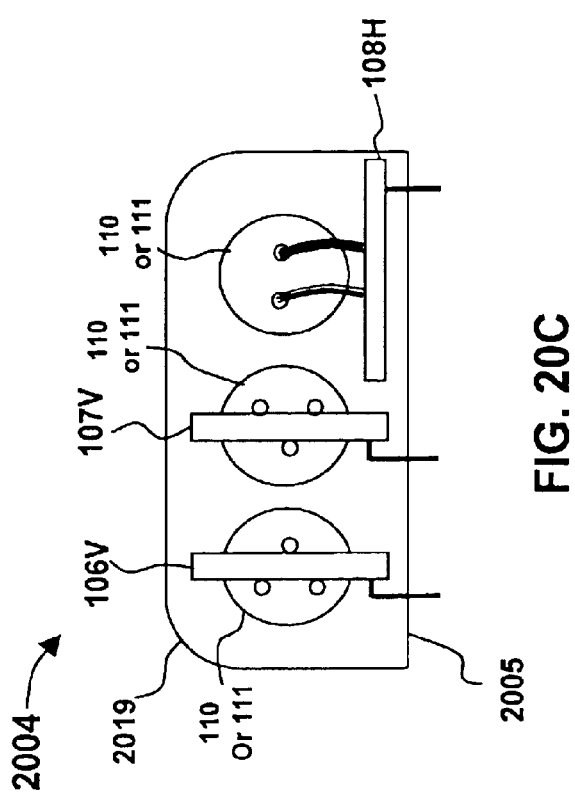

Referring now to FIG. 20D, a fiber optic module 2006 is illustrated. A fiber optic module 2006 includes a base of cover 2005, a housing or cover 2019, a first vertical printed circuit board 106H, a second vertical printed circuit board 107V, and a third horizontal printed circuit board 108V. The first vertical printed circuit board 106H includes a first optical electronic coupled thereto. The second vertical printed circuit board 107V includes a second optical electronic device coupled thereto. The third vertical printed circuit board 108V includes a third optical electronic device coupled thereto. In any of the first, second, or third optical electronic devices can be a transmitter 110 or a receiver 111. In one embodiment the horizontal printed circuit board 106H includes transmitter or receiver coupled thereto using a through-hole mount configuration. The second and third vertical printed circuit boards 107V and 108V include a transmitter or receiver coupled thereto using a straddle mount configuration. In each of the cases FIGS. 20A–20D, the vertical printed circuit boards are parallel to each other in parallel to the optical axis of the transmitter or receiver.

Referring now to FIG. 20E, the fiber optic module 2008 is illustrated. Fiber optic module 2008 includes a first horizontal printed circuit board 106H, a second vertical printed circuit board 107V, a third horizontal printed circuit 108H, a base 2005, and a housing or cover 2019. The first horizontal printed circuit 106H includes a first optical electronic device coupled thereto. The second vertical printed circuit board 107V includes a second optical electronic device coupled thereto. The third horizontal printed circuit board 108H includes a third optical electronic device coupled thereto. The first, second, and third can be a transmitter 110 or a receiver 111. In one embodiment the first optical electronic device is coupled to the printed circuit board 106H in a through hole mount configuration. In one embodiment the second optical electronic device is coupled to the second vertical printed circuit board 107V in a straddle mount configuration. In one embodiment the third optical electronic device is coupled to the third horizontal printed circuit board 108H using a through hole mount configuration.

Referring now to FIG. 20F, the fiber optic module 2010 is illustrated. Fiber optic module 2010 includes a first horizontal printed circuit board 106H, a second horizontal printed circuit board 107H, a third horizontal printed circuit 108H, a base or cover 2005, and a housing or cover 2019. The first horizontal printed circuit 106H includes a first optical electronic device coupled thereto. The second horizontal printed circuit board 107H includes a second optical electronic device coupled thereto. The third horizontal printed circuit board 108H includes a third optical electronic device coupled thereto. The first, second, and third optoelectronic devices can be either a transmitter 110 or a receiver 111. In one embodiment the first optical electronic device is coupled to the printed circuit board 106H in a through hole mount configuration. In one embodiment the second optical electronic device is coupled to the second horizontal printed circuit board 107H in a through hole mount configuration. In one embodiment the third optical electronic device is coupled to the third horizontal printed circuit board 108H using a through hole mount configuration.

In each of the fiber optic modules illustrated in FIGS. 20A–20F, the base or cover 2005 and the housing or cover 2019 may provide shielding by being conductive and formed of a conductive material. In the fiber optic modules illustrated in FIGS. 20A–20F, the printed circuit boards may include pins or connectors coupled thereto in order to make electrical connection to a connector or through holes within a host printed circuit board of a system.

Referring now to FIGS. 21A–21H, a four channel or double redundant fiber optic modules are illustrated. FIGS. 21A–21H illustrate a quad-board embodiment of fiber optic modules. In one case, a redundant transceiver and a redundant receiver for a transceiver fiber optic module can be provided. Alternatively each channel can be provided with redundancy. In another case, a four channel receiver/transceiver or transmitter is provided which can be used to provide four full time communication channels. In another case, a dual redundant system for a transmit channel or a receive channel.

Referring now to FIG. 21A, fiber optic module 2100 is illustrated. Fiber optic 2100 includes a base or cover 2105, a housing or cover 2119, a first vertical printed circuit board 105V, a second vertical printed circuit board 106V, a third vertical printed circuit board 107V, and a fourth vertical printed circuit board 108V. Each of the first, second, third, and fourth vertical printed circuit boards may include a transmitter 110 or a receiver 111. In one embodiment each of the first, second, third, and fourth optical electronic devices coupled to the first, second, third and fourth vertical printed circuit boards respectfully may be coupled thereto using a straddle mount configuration. The base 2105 and/or the housing 2119 maybe conductive in order to shield electromagnetic radiation.

Referring now to FIG. 21B, a fiber optic module 2102 is illustrated. Fiber optic module 2102 includes a first horizontal printed circuit board 105H, a second vertical printed circuit board 106V, a third vertical printed circuit board 107V and a fourth horizontal printed circuit board 108H. Each of the first, second, third, and fourth printed circuit boards include a first, second, third, and fourth optical electronic devices coupled thereto. The first, second, third, and fourth optical electronic devices maybe a transmitter 110 or a receiver 111. In one embodiment the first and fourth optical electronic devices are coupled to the first and fourth horizontal printed circuit boards using a through hole mount configuration. The second and third optical electronic devices are coupled to the second and third vertical printed circuit boards 106V and 107V respectfully using a straddle mount configuration.

Referring now to FIG. 21C, a fiber optic module 2104 is illustrated. Fiber optic module 2104 includes a first vertical printed circuit board 105V, a second horizontal printed circuit board 206H-, and third vertical printed circuit 108V, a base 2105, a housing or cover 2119. The first vertical printed circuit board 105V includes a first optical electronic device coupled thereto. The second horizontal printed circuit board 106H- includes a second and third optical electronic device coupled thereto. The third vertical printed circuit board 108V includes a fourth optical electronic device coupled thereto. In one embodiment the first and fourth optical electronic devices are coupled to respective vertical printed circuit boards 105V and 108V using a straddle mount configuration. In one embodiment the second and third optical electronic devices are coupled to the second horizontal printed circuit board 106H- using a through hole mount configuration. Additionally, the vertical printed circuit boards 105V or 108V may include a ground plane 114 or ground plane 116 respectfully.

Referring now to FIG. 21D, a fiber optic module 2106 is illustrated. Fiber optic module 2106 includes a first vertical printed circuit board 105V, a second horizontal printed circuit board 106H, a third horizontal printed circuit board 107H, a fourth vertical printed circuit board 108V, a base or cover 2105, and a housing or cover 2119. The first vertical printed circuit board 105V has a first optical electronic device coupled thereto. The second horizontal printed circuit board has a second optical electronic device thereto. The third horizontal printed circuit board 107H has third optical electronic device coupled thereto. The fourth vertical circuit board 108V includes a fourth optical electronic device coupled thereto. In one embodiment the first and fourth optical electronic devices are coupled to the vertical printed circuit boards 105V and 108V respectfully using a straddle mount configuration. In one embodiment the second and third optical electronic devices are coupled to the second and third horizontal printed circuit boards respectfully using a through hole mount configuration.

Referring now to FIG. 21E, a fiber optic module 2108 is illustrated. Fiber optic module 2108 includes a first vertical printed circuit board 105V, a second horizontal printed circuit 106H, a third vertical printed circuit board 107V and a fourth horizontal printed circuit board 108H, base or cover 2105, and housing or cover 2119. The first, second, third, and fourth printed circuit boards include a first, second, third, and fourth optical electronic devices coupled thereto respectfully. In one embodiment the first and third optical electronic devices coupled respectfully to the first vertical printed circuit board and third vertical printed circuit using straddle mount configuration. In one embodiment the second and fourth optical electronic device couple respectively to the second horizontal printed circuit board and fourth horizontal printed circuit board using a through hole mount configuration. The first, second, third, and fourth optical electronic devices maybe a receiver or a transmitter optical electronic device.

Referring now to FIG. 21F, a fiber optic module 2110 is illustrated. Fiber optic module 2110 includes a first vertical printed circuit board 105V, a second vertical printed circuit board 106V, a third vertical printed circuit board 107V, a fourth horizontal printed circuit board 108H, a base or cover 2105, and a housing or cover 2119. In this case three printed circuit boards are vertical and parallel to one another. A first, second, third, and fourth optical electronic devices are coupled respectively to the first, second, third, and fourth printed circuit boards. In one embodiment the first optical electronic device, second optical electronic device, and third optical electronic device are coupled to the first vertical printed circuit board 105V, the second 106V and the third vertical circuit board 107V using a straddle mount configuration. In one embodiment the fourth optical electronic device is coupled to the four horizontal printed circuit boards 108H using a through hole mount configuration. The first, second, third, and fourth optical electronic devices maybe a receiver or transmitter 110 or 111.

Referring now to 21G, the fiber optic module 2112 is illustrated. The fiber optic module 2112 includes a first vertical printed circuit board 105V, a second vertical printed circuit board 106V, a third horizontal printed circuit board 108H, a base or cover 2105, and a housing or cover 2119. The first and second printed circuit boards are vertical printed circuit boards parallel with one another and the optical axes of the first and second optical electronic devices coupled thereto. The third horizontal printed circuit board 108H includes a third and fourth optical electronic devices coupled thereto. In one embodiment the first and second optical electronic devices are coupled respectively to the first vertical printed circuit board 105V and the second vertical printed circuit board 106V using a straddle mount configuration. In one embodiment the third and fourth optical electronic devices are coupled to the third horizontal printed circuit board 108H- using a though hole mount configuration.

Referring now to FIG. 21H, the fiber optic module 2114 is illustrated. Fiber optic module 2114 includes a first horizontal printed circuit board 105H, a second horizontal printed circuit board 106H, a third vertical printed circuit board 107V, a fourth vertical printed circuit board 108V, a base or cover 2105, and a housing or cover 2119. The third and fourth vertical printed circuit boards 107V and 108V are parallel to one another and the optical axes of the third and fourth optical electronic devices. The first printed circuit board and second printed circuit board include a first optical electronic devices coupled respectively thereto. In one embodiment the first and second optical electronic devices are coupled respectively to the horizontal printed circuit board 105H and 106H using a through hole mount configuration. In one embodiment the third and fourth optical electronic devices are respectively coupled to the third and fourth vertical printed circuit boards 107V and 108V respectively using a straddle mount configuration.

In each of the fiber optic modules illustrated in FIGS. 21A–21H, the printed circuit boards may respectively include pins or electronically connectors in order to make connection to a host printed circuit board of a system. In each of the fiber optic modules illustrated in 21A–21H at least two vertical printed circuit boards are included in parallel together. In this manner, either four channels can be utilized or a redundancy for each channel maybe provided. In each of the fiber optic modules 2100–2114 illustrated in FIGS. 21A–21H, one or more of the printed circuit boards may include ground planes to reduce cross talk and reduce electromagnetic interference. Additionally, combinations of three horizontal printed circuit boards and one vertical printed circuit board can form alternate embodiments of fiber optic modules as well as four horizontal printed circuit boards can form alternate embodiments of four channel fiber optic modules that can provide four channels or dual redundancy.

While previous embodiments of fiber optic modules have been described as pluggable, solderable or embedded utilizing pins or electrical connections, a miniature back plane can be introduced into fiber optic modules in order to allow an individual fiber optic channel and the associated printed circuit board to be replaced.

Figure 22A:
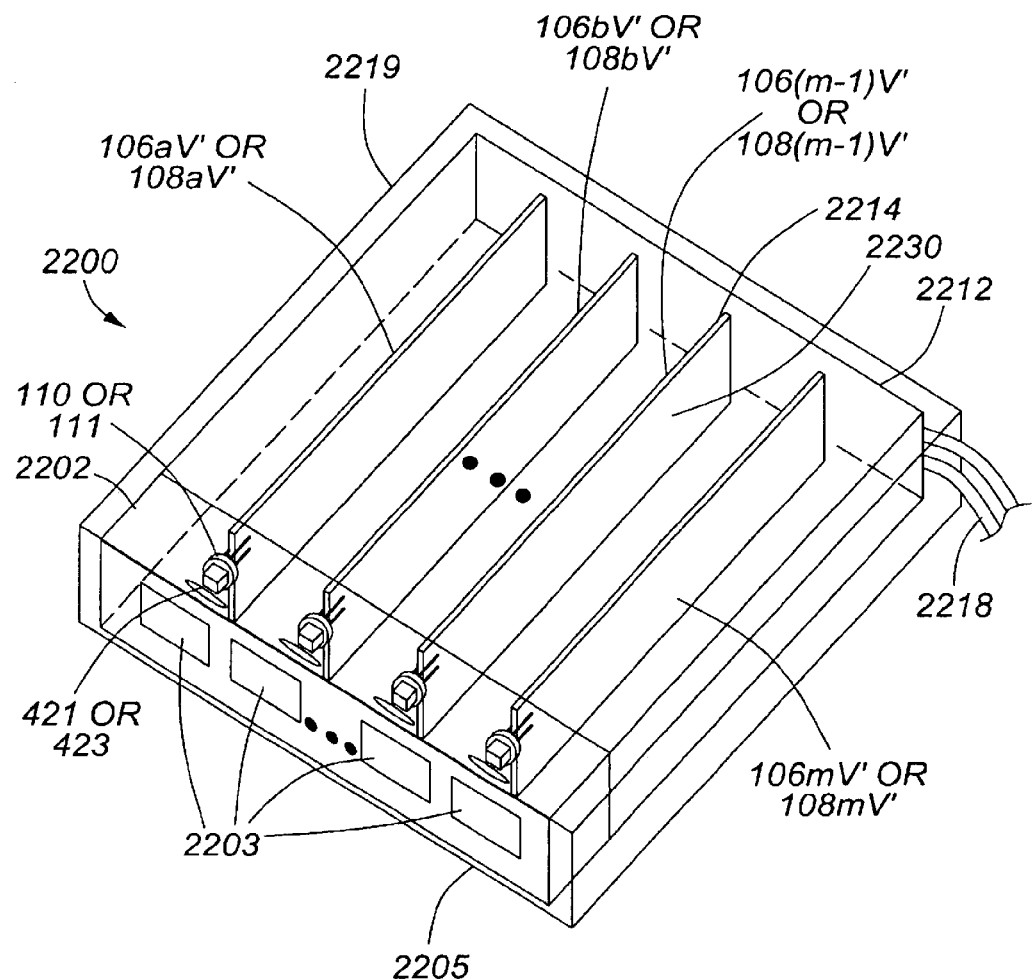
FIG. 22A illustrates a top perspective view of an assembled alternate embodiment of the invention including a miniature back plane.
Figure 22B:
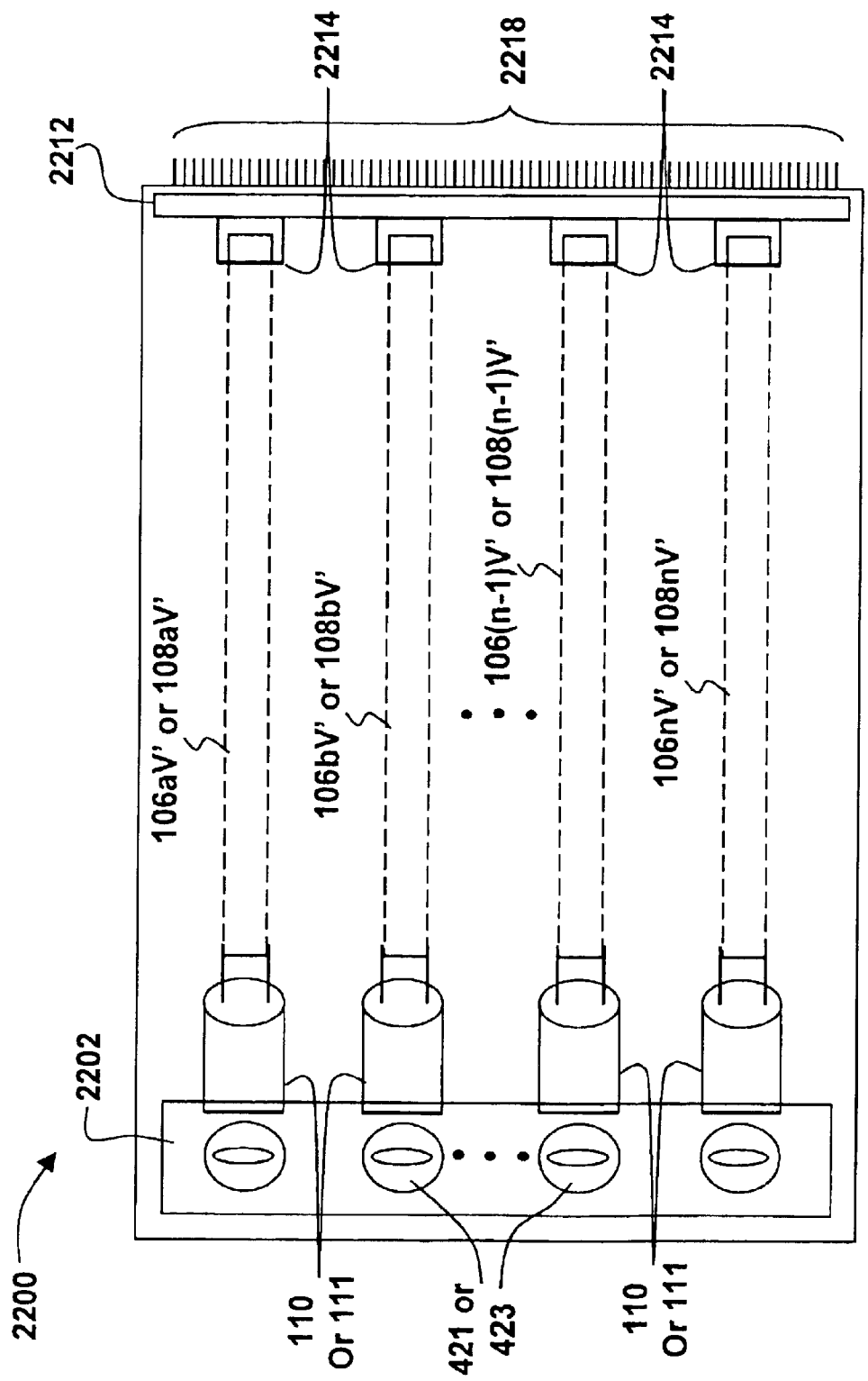
FIG. 22B illustrates a top cut-away view of the invention illustrated in 22A.
Figure 22C:
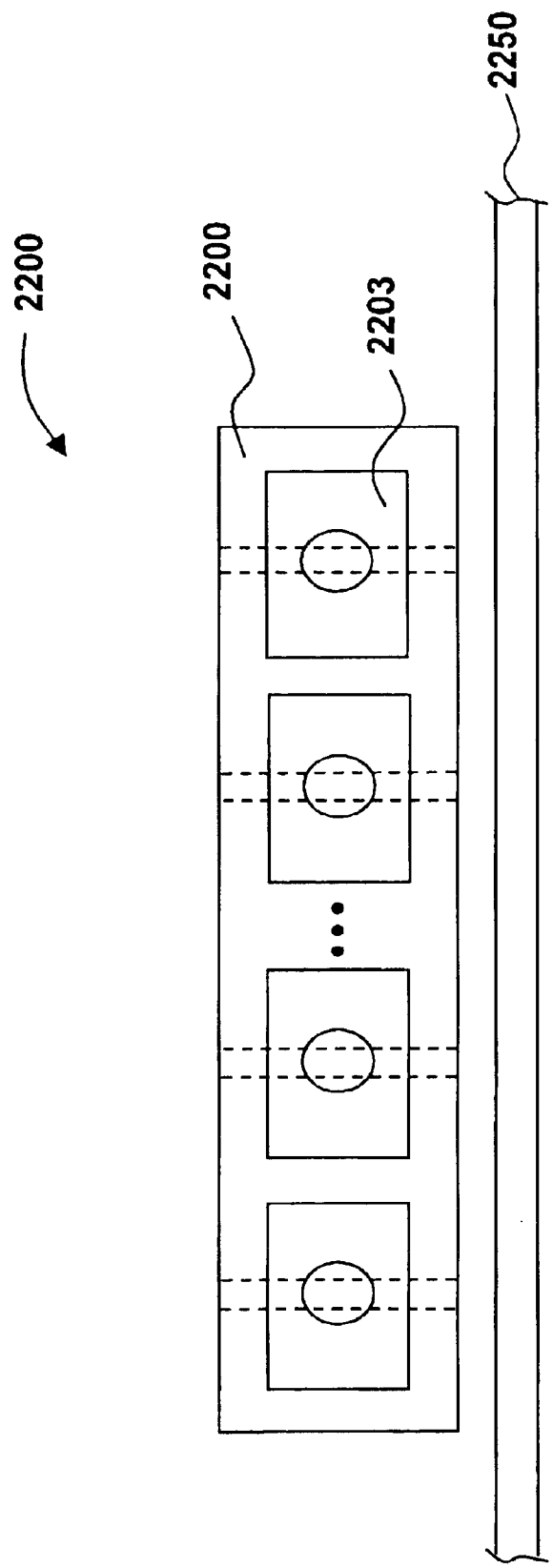
FIG. 22C illustrates a front view of the embodiment of the invention illustrated in FIG. 22A showing a horizontal array of fiber optics communication channels.

Referring now to FIGS. 22A, 22B and 22C, a horizontal array of fiber optic channels is illustrated in a fiber optic module including a miniature back plane.

Referring now to FIG. 22A, fiber optic module 2200 is illustrated. The fiber optic module 2200 includes a plurality of n vertical printed circuit boards 106aV' and/or 108aV' through 106nV' and/or 108nV', a miniature back plane 2212, an optical block 2202, a housing 2219, and a base recover

2205. The plurality of vertical printed circuit boards 106aV' and/or 108aV' through 106nV' and/or 108nV' include an opto-electronic device 110 or 111 coupled thereto and an edge connector 2230. Each of the edge connectors 2230 of the vertical printed circuit boards couple into an edge connector 2214 of the miniature back plane 2212. The miniature back plane 2212 includes pins or an electrical connector 2218 for coupling to a host printed circuit board of a system. The one or more vertical printed circuit boards are arranged in a horizontal array with respect to the system printed circuit board. The optical block 2202 includes open ends to receive the opto electronic devices of the vertical printed circuit boards and a plurality of lenses 421 or 423 lined with the optical axes of the plurality of opto electronic devices and open ends 2203 to mate with optical fiber connectors.

Referring now to FIG. 22B, the top view of the fiber optic module 2200 is illustrated. The plurality of optoelectronic devices 110 or 111 coupled to each respective printer circuit board using a straddle mount configuration in one embodiment. The back plane 2212 includes a plurality of female edge connectors 2214 or male edge connectors 2214 as the case may be to interface to the edge connector of the plurality of printed circuit boards 106 and/or 108. The miniature back plane 2212 includes traces or busses to couple between the edge connectors 2214 and the pins or electrical connector 2218. Fiber optic module 2200 provides support for two or more channels. The one or more vertical boards 106aV' and/or 108aV' through 106nV' and/or 108nV' can be slid in and out of the fiber optic module 2200 to replace them as necessary by decoupling them from the miniature back plane 2212. The base 2205 provides support through a slot of through other means described previously.

The optical block 2202 may be a single optical block 2202 in order to access the plurality of printed circuit boards 106 or 108 at a time or may be individual optical blocks for each respective printed circuit board. In the fiber optic module 2200, each of the printed circuit boards 106 or 108 are vertical printed circuit boards in parallel with each other and the optical axes of the respective optoelectronic electronic device. The printed circuit boards may alternatively be slanted at an angle with respect to the printed circuit board 2250 in parallel with each other and in parallel with the optical axes of the respective opto-electric device. Optionally, each channel may be horizontal with respect to the system or host printed circuit board such that a plurality of horizontal printed circuit boards are provided. However, the horizontal configuration of the printed circuit boards are expected to use additional horizontal space.

Referring now to FIG. 22C, the front view of the fiber optic module 2200 is illustrated. Fiber optic module 2200 is a horizontal array of fiber optic channels with respect to the host parent circuit board 2250 of a system.

Figure 23A:
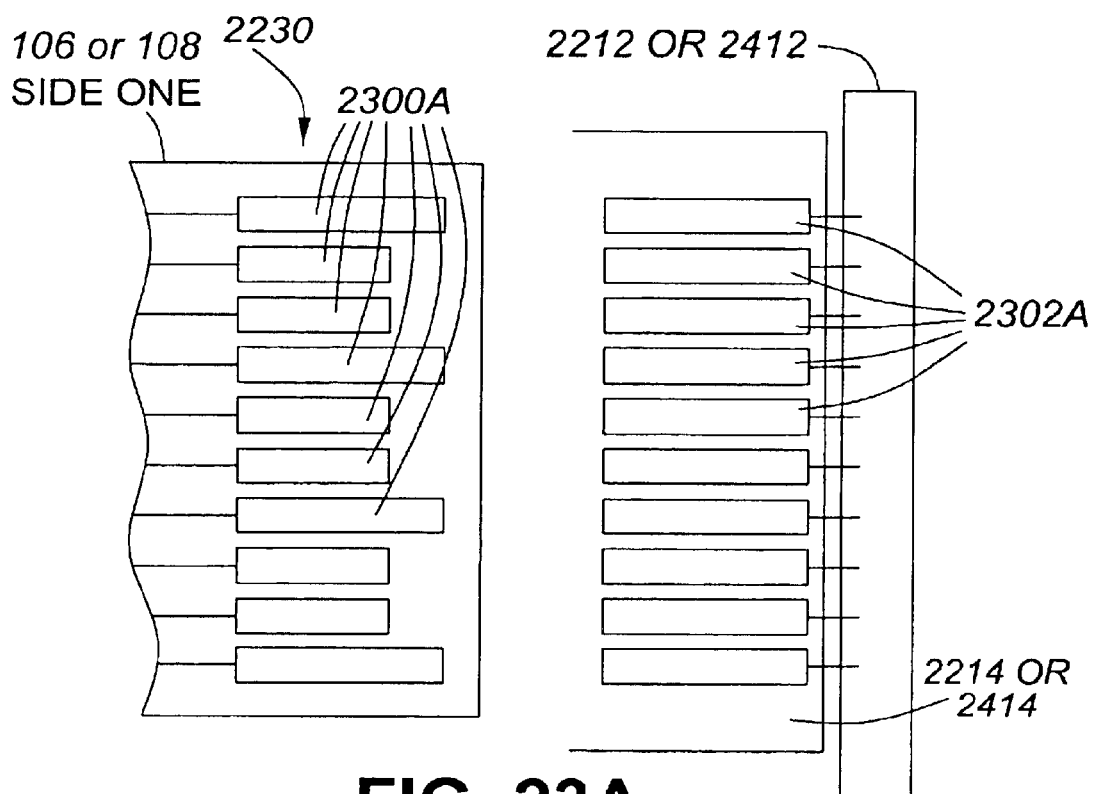
FIGS. 23A–23C illustrate the electronic connection between printed circuit boards and the miniature back planes.
Figure 23B:
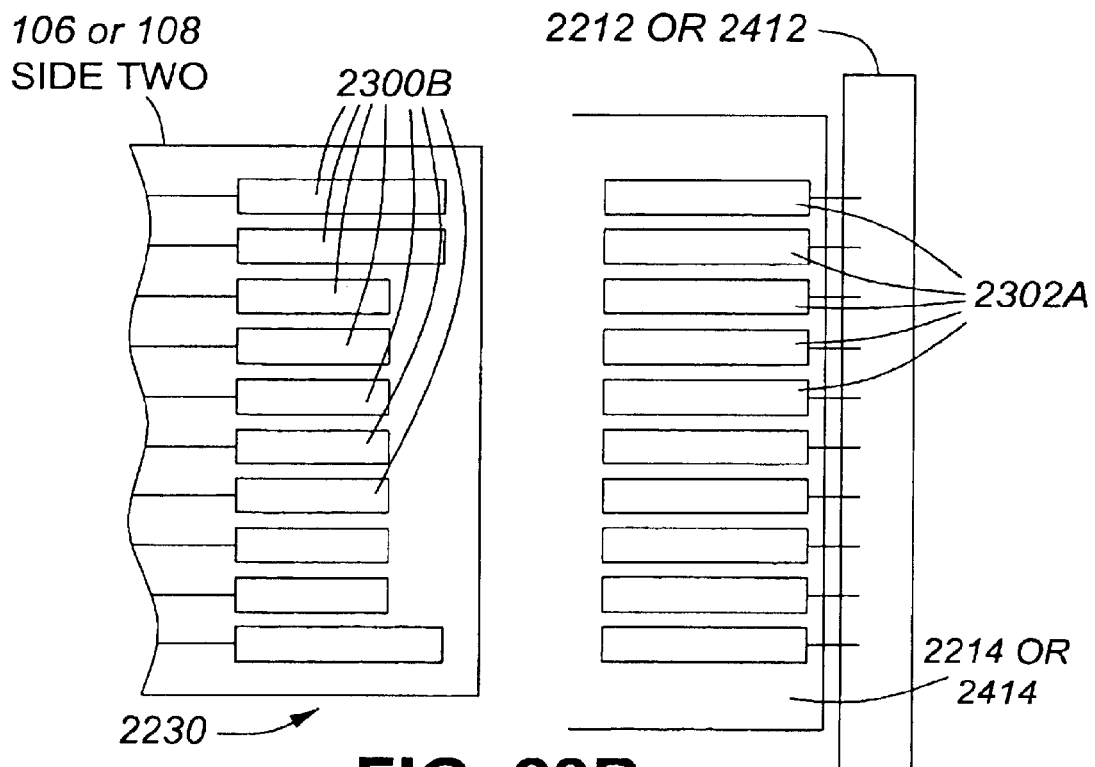
Figure 23C:
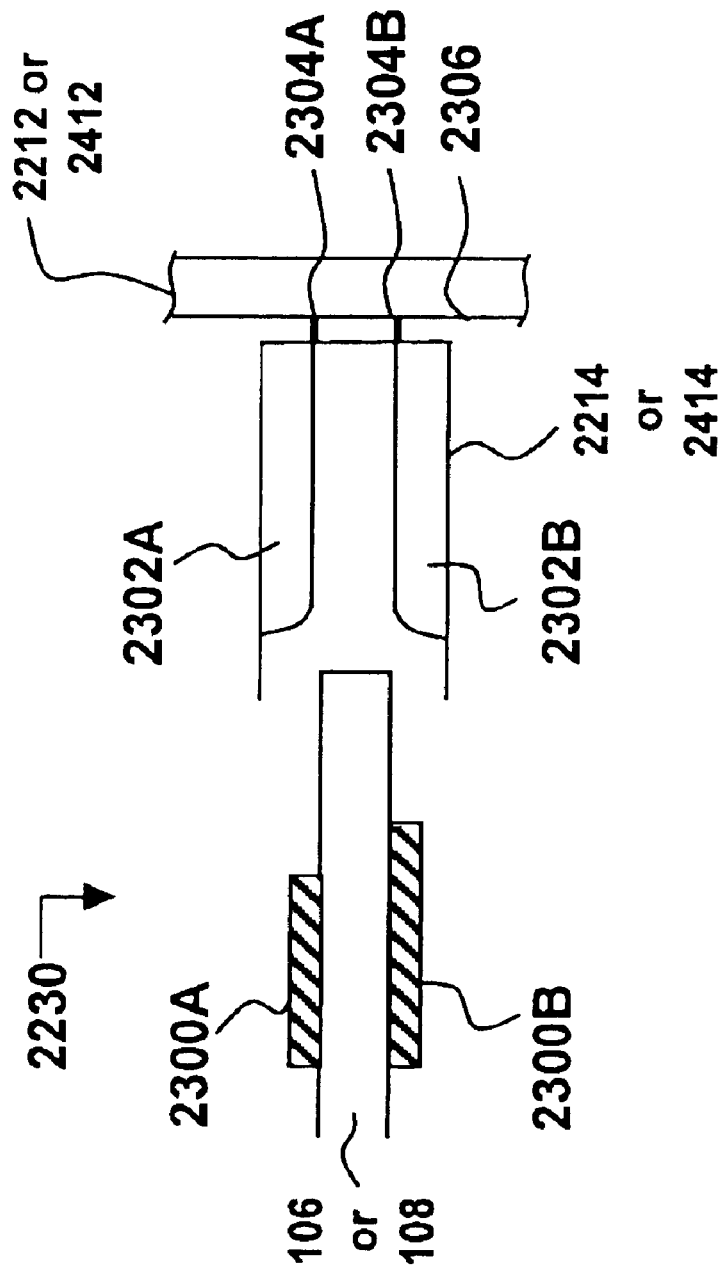

Referring now to FIGS. 23A and 23B, a magnified view of sides of the printed circuit board 106 through 108 and the edge connectors 2214 or 2414 and the miniature back plane are illustrated. FIGS. 23A–23C illustrate how the printed circuit boards 106 and 108 coupled to the back plane. The edge connector 2230 of the printed circuit board 106 or 108 includes one or more pads 2300A on one side and one or more pads 2300B on another side of the printed circuit board. The edge connector 2214 or 2414 of the back plane 2212 or 2412 include a plurality of pins 2302A on one side, a plurality of pins 2302B on another side.

Referring now to FIG. 23C, the pads 2300A and 2300B are on opposite sides of the edge connector 2230 of the printed circuit board 106 or 108 is more clearly illustrated. The pins 2302A and 2302B of the edge connector 2214 or 2414 are also illustrated more clearly in FIG. 23C. The edge connector 2214 or 2414 includes pins 2304A and 2304B coupled to traces of the miniature back plane 2212 or 2412. A number of the pads 2300A and/or 2300B can be staggered in order that ground may be provided first and power may be provided prior to make connections for signal lines. In this case the printed circuit boards 106 or 108 may be hot-pluggable into the back plane 2212 or 2412. In this manner, power can be maintained to the other fiber optic channels while a single channel is replaced.

FIGS. 24A–24J illustrate horizontal arrays of fiber optic channels for a fiber optic module.

Figure 24A:
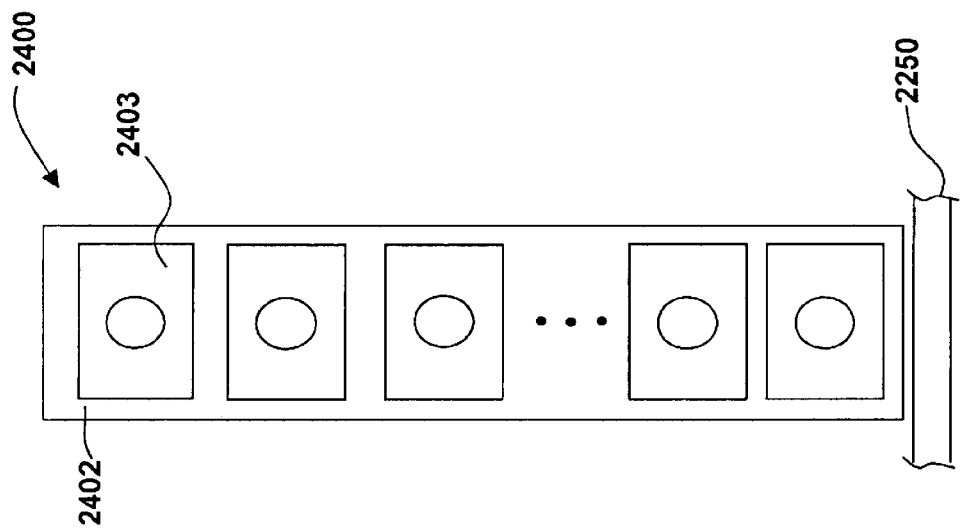

Referring now to FIG. 24A, fiber optic module 2400 is illustrated. Fiber optic module 2400 is a vertical array of fiber optic channels with respect to the host printed circuit board 2250.

Figure 24B:
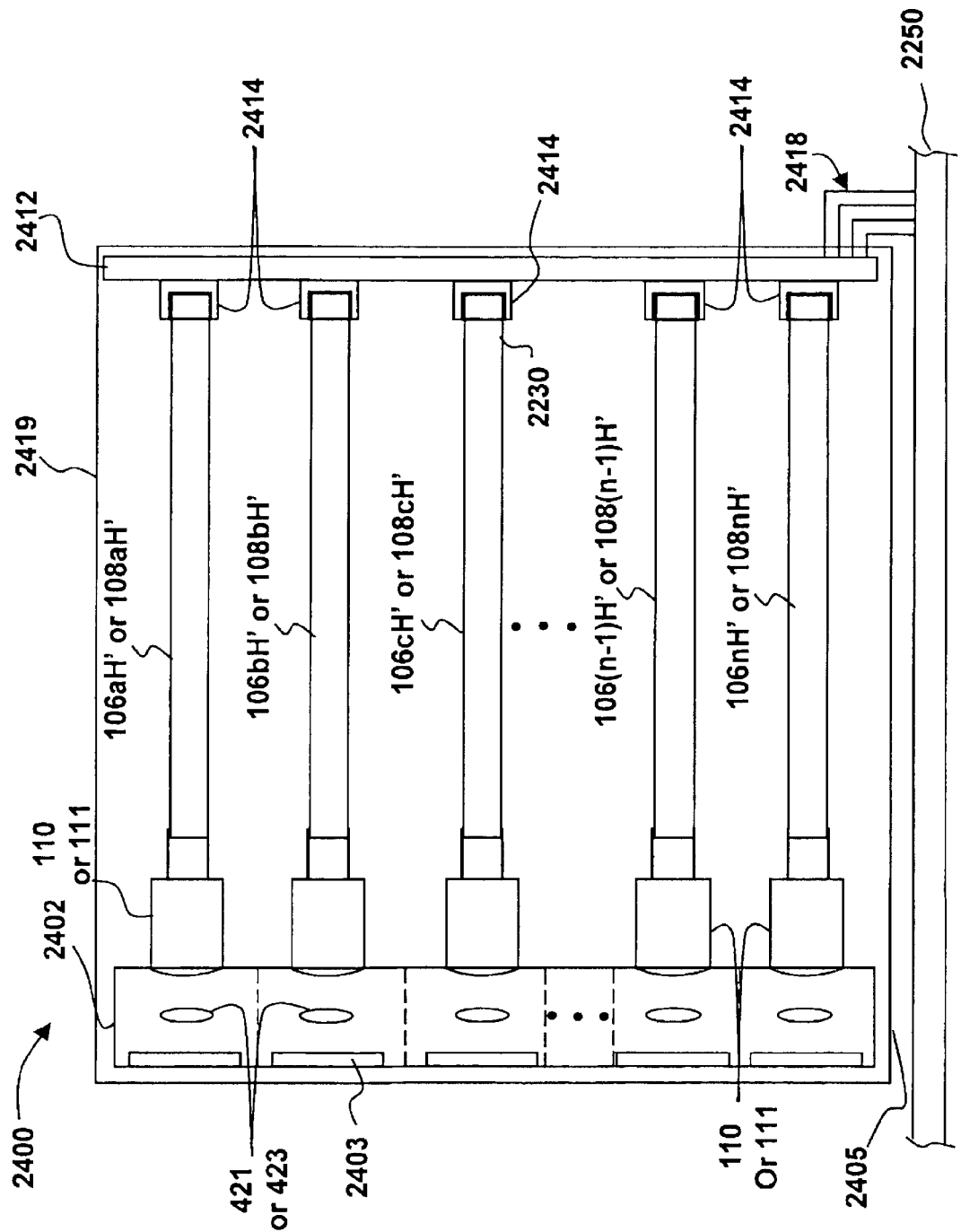

Referring now to FIG. 24B, the fiber optic module 2400 includes an optical block 2402, a plurality of horizontal print circuit boards 106aH' or 108aH' through 106nH' or 108nH', a miniature back plane 2412, a housing or cover 2419, and a base or cover 2405. The plurality of horizontal printed circuit boards includes a plurality of opto-electronic devices coupled thereto. The miniature back plane 2412 includes a plurality of edge connectors 2414 for coupling to the edge connectors 2230 of the horizontal printed circuit boards. The optical block 2402 includes a plurality of lenses 421 or 423, openings for the receipt of the opto-electronic devices 110 and 111, and openings 2403 to receive fiber optic connector. Back plane 2412 further includes pins or an electrical connector 2418 for coupling to the host printed circuit board 2250.

Referring now to FIG. 24C, a rear cross-sectional view of the fiber optic module 2400 is illustrated. The plurality of horizontal printed circuit boards 106H or 108H are horizontal with respect to the host printed circuit board 2250 and in parallel with each other and in line and in parallel with the optical axes of the opto-electronic devices. Referring now to FIGS. 24D–24J, alternate embodiments of the vertical array of fiber optic channels is illustrated.

Referring to FIG. 24D, the plurality of printed circuit boards are now slanted such that slanted printed circuit boards 106S or 108S are in each respective channel and slanted with respect to the host printed circuit board 2250. Each of the respective embodiments 24D–24J of fiber optic modules includes the components illustrated in 24B including the optical block 2402 and the miniature back plane 2412 but for the angle of the edge connectors 2414 with respect to the angle of the printed circuit boards and the respective edge connectors 2230.

Referring to FIG. 24E, fiber optic module 2454 is illustrated incorporating one or more horizontal printed circuit boards 106H or 108H and one or more slanted printed circuit boards 106S or 108S with respect to the host printed circuit board 2250.

Figure 24H:
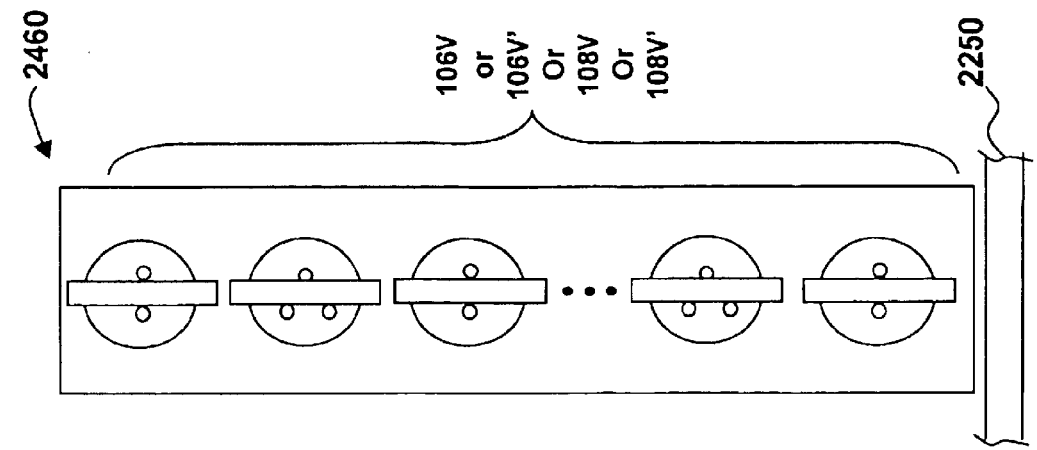
Figure 24G:
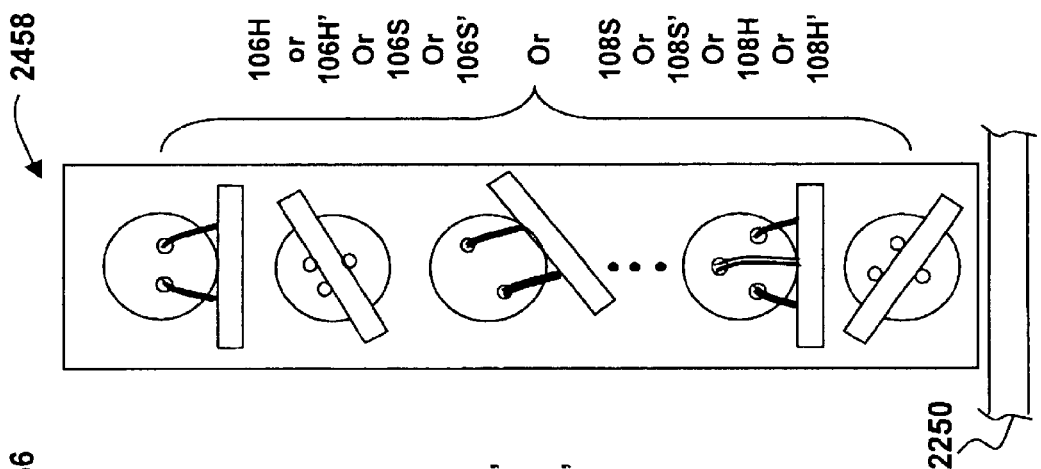
Figure 24F:
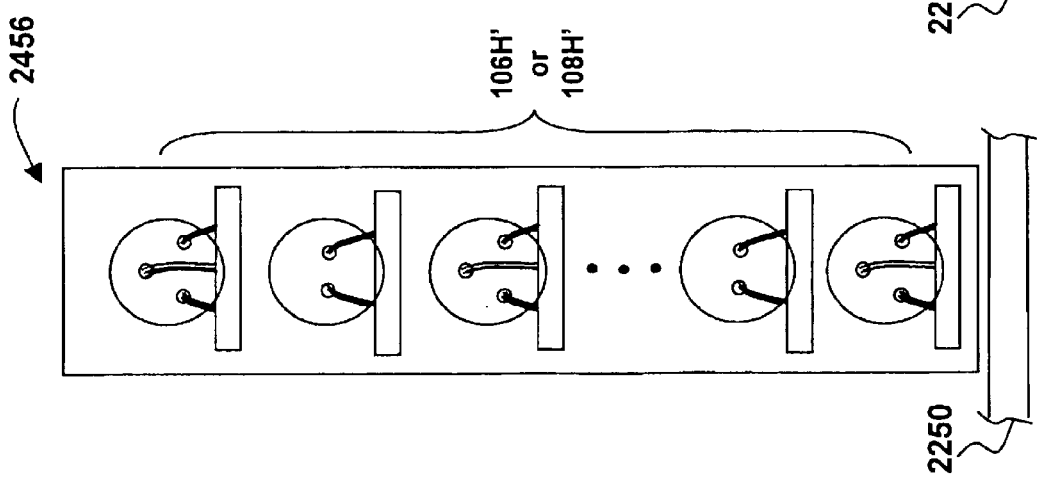

Referring now to FIG. 24F, a plurality of horizontal printed circuit board 106H' or 108H' are illustrated with the respective opto-electronic devices coupled thereto using a straddle mount configuration. Referring back to FIG. 24C, the horizontal printed circuit boards 106H or 108H have the respective opto-electronic devices coupled thereto using a straddle-mount configuration.

Referring now to FIG. 24G, a plurality of printed circuit boards using a mixture of straddle mount and through hole mount configurations are illustrated including horizontal printed circuit boards 106H or 106H' or slanted printed circuit boards 106S or 106S' or 108S' or 108S or 108H or 108H'.

Referring now to FIG. 24H, a plurality of vertical printed circuit boards using straddle mount or through hole mount configurations are illustrated. The plurality of printed circuit boards illustrated in FIG. 24H may be vertical printed circuit boards 106V or 106V' or 108V or 108V' for respective transmit or receive printed circuit boards in a straddle mount or through hole mount configuration.

Figure 24J:
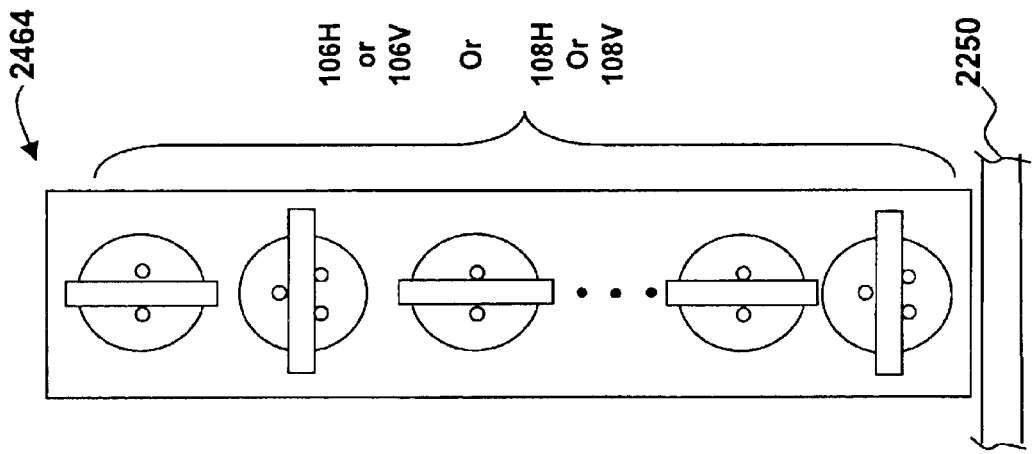
Figure 24I:
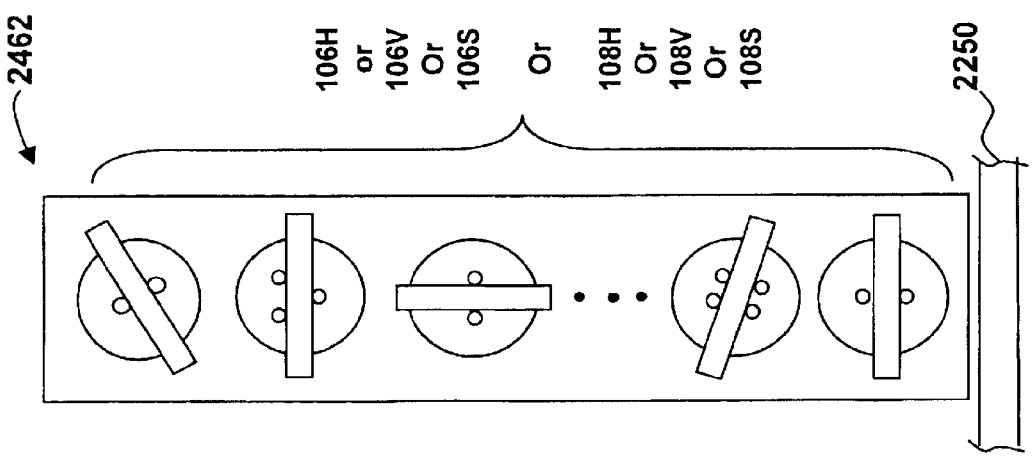

Referring now to FIG. 24I, fiber optic module 2462 is illustrated. Fiber optic module 2462 includes a plurality of printed circuit boards in a horizontal, vertical or slanted configuration. Fiber optic module 2462 may include horizontal, vertical or slanted receiver printed circuit boards 106H, 106V, 106S respectively and/or one or more transmit printed circuit boards horizontal, vertical or slanted 108H, 108V, or 108S respectively.

Referring now to FIG. 24J, fiber optic module 2464 is illustrated including a mixture of horizontal and vertical of printed circuit boards. Printed circuit boards may be horizontal or vertical transmit boards 106H, or 106V and/or horizontal or vertical receive printed circuit boards 108H or 108V. While FIGS. 24A–24J illustrate a vertical array of fiber optic channels, a horizontal array and a vertical array may be combined together.

FIGS. 25A–25I illustrate a 2×2 array of fiber optic channels for fiber optic module.

Referring now to FIG. 25A, the fiber optic module 2500 is illustrated having a two-by-two array of fiber optic channels with respect to the host printed circuit board 2250.

Referring now to FIG. 25B, the fiber optic module 2500 includes an optical block 2502, the plurality of printed circuit boards 106 or 108, the miniature back plane 2212 or 2412, the housing 2519 and a base 2505. The plurality of printed circuit boards 106 or 108 may be slanted printed circuit boards 106S or 108S or horizontal printed circuit boards 106H or 108H or vertical printed circuit boards 106V or 108V for transmit and receive respectively. Each of the respective printed circuit boards 106 or 108 include an edge connector 2230 for coupling into the edge connectors 2214 or 2414 of the miniature back plane 2212 or 2412 respectively. The miniature back plane 2212 or 2412 further includes pins or an electrical connector 2218 or 2418 for coupling to the host printed circuit board 2250. The edge connectors 2214 or 2414 are arranged in the two-by-two array associated with the configuration of the printed circuit boards 106 or 108 in a slanted, horizontal or vertical configuration.

Figure 25C:
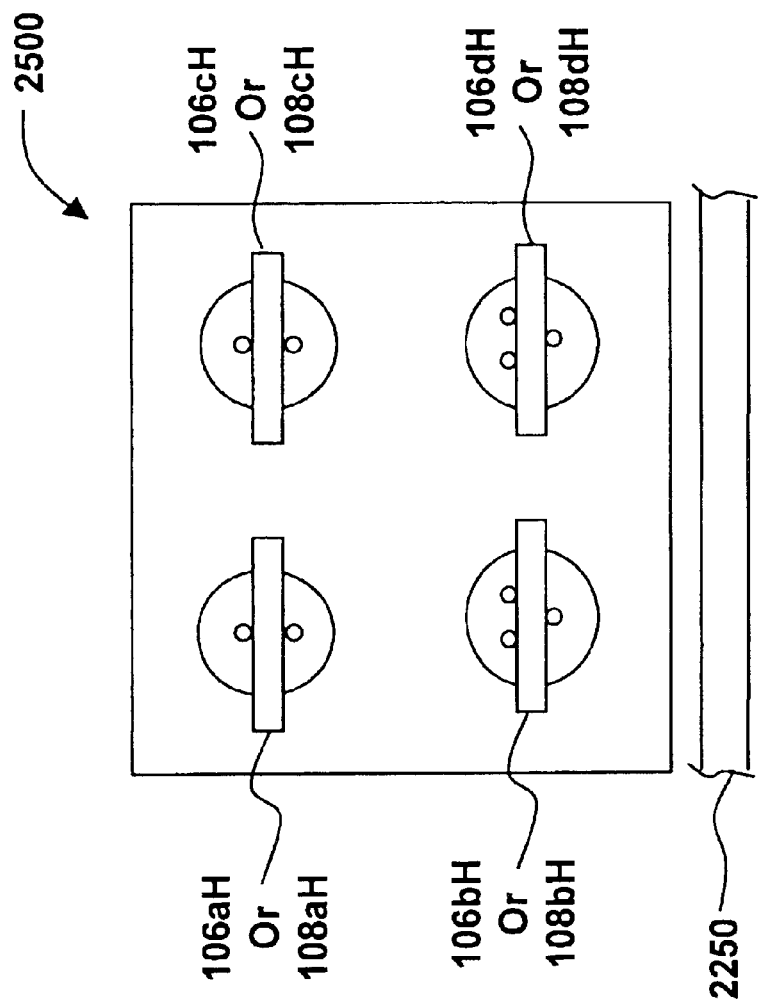

In FIG. 25C, the fiber optic module 2500 includes horizontal printed circuit boards 106$a$H–106$d$H and/or horizontal printed circuit boards 108$a$H–108$d$H. In FIG. 25D, the printed circuit boards 106, 108 are illustrated in a horizontal configuration.

Referring now to FIGS. 25D–25I, alternate configurations of the printed circuit boards are in a two-by-two array as illustrated. In FIG. 25D, fiber optic module 2552 is illustrated. Fiber optic module 2552 includes a two-by-two array of vertical printed circuit boards 106$a$V–106$d$V and/or 108$a$V–108$d$V with respect to the first printed circuit board 2250. Fiber optic modules illustrated in FIGS. 25D–25I include components illustrated in FIG. 25A–25C but for the orientation of the printed circuit boards and the edge connectors 2214 or 2414.

Referring now to FIG. 25E, a fiber optic module 2554 is illustrated. Fiber optic module 2554 includes a plurality of slanted printed circuit boards including receiver printed circuit boards 106$a$S–106$d$S and/or transmit printed circuit boards 108$a$S–108$d$S with respect to the host printed circuit board 2250.

Referring now to FIG. 25F, fiber optic module 2556 is illustrated. Fiber optic module 2556 includes a plurality of slanted printed circuit boards including receiver printed circuit boards 106$a$S'–106$d$S' and/or transmit printed circuit boards 108$a$S'–108$d$S'. Each of the printed circuit boards illustrated in FIGS. 25D–25I include an opto-electronic device coupled thereto in either a straddle mount configuration and/or a through hole mount configuration. Additionally, the two-by-two array of printed circuit boards may include the ground plane 114 or 116 coupled respectively thereto to shield in reduced cross channel or cross talk interference. In FIG. 25F, the printed circuit boards are slanted in such a way that the back sides may include ground planes to shield cross-talk or cross-channel interference.

Referring now to FIG. 25G, a pair of printed circuit boards are vertical and parallel with each other with respect to the cross printed circuit board 2250 and their respective optical axes of the opto-electronic devices. Another pair of printed circuit boards are horizontal and parallel with respect to each other and with respect to the host printed circuit board 2250. The host printed circuit boards 106$a$V or 108$a$V and 106$c$V or 108$c$V are the vertical printed circuit boards. The printed circuit boards 106$b$H or 108$b$H and 106$d$H or 108$d$H are the horizontal printed circuit boards.

Figures 25H, 25I:
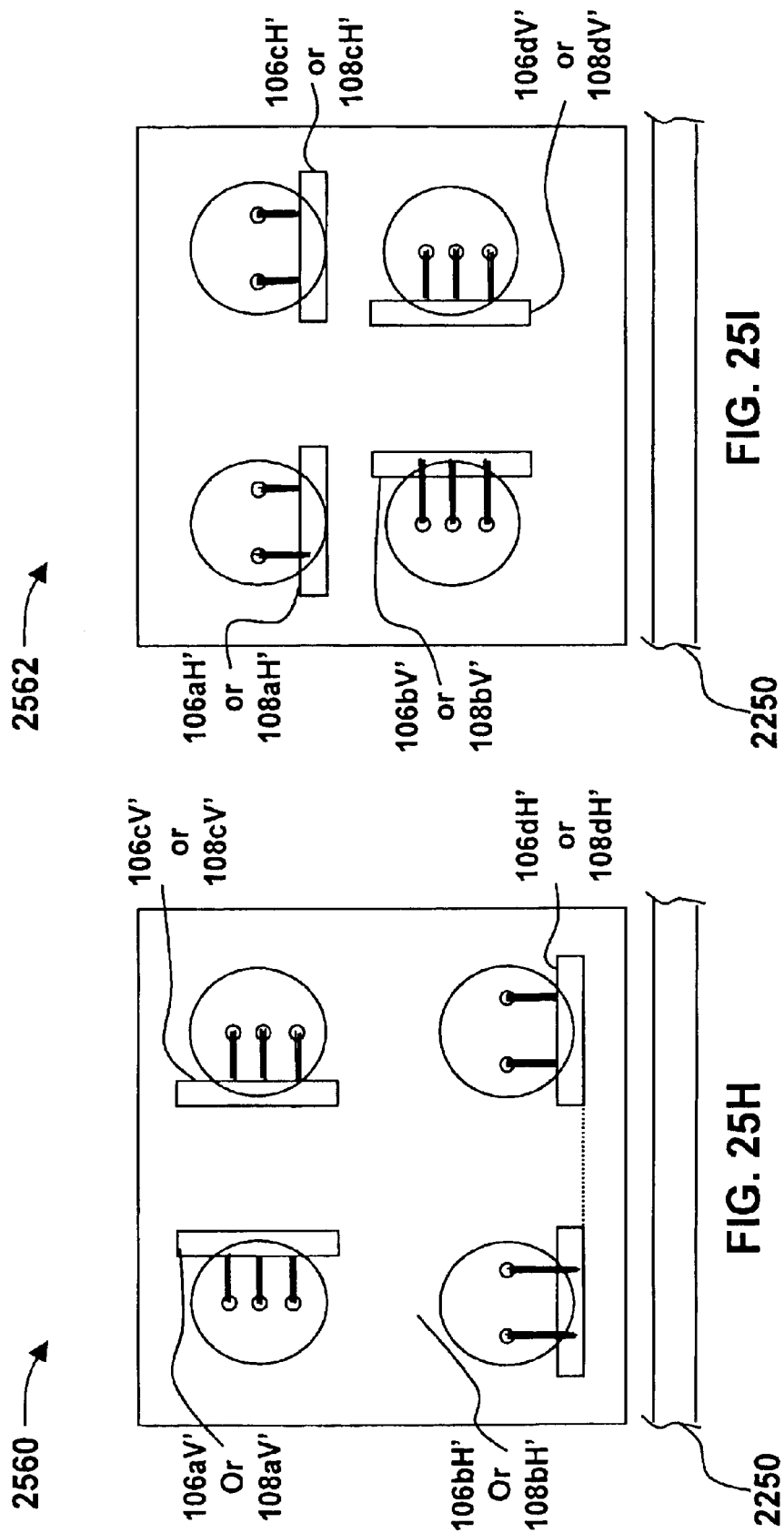

Referring now to FIG. 25H, fiber optic module 2560 is illustrated. The fiber optic module 2560 includes a pair of vertical printed circuit boards 106$a$V' or 108$a$V' and 106$c$V' or 108$c$V' including opto-electronic devices mounted thereto in a through-hole configuration. Fiber optic module 2560 further includes horizontal printed circuit boards 106$b$H' or 108$b$H' and 106$d$H' or 108$d$H' with opto-electronic devices coupled thereto in straddle mount configuration.

Referring now to FIG. 25I, fiber optic module 2562 is illustrated. Fiber optic module 2562 includes a pair of horizontal printed circuit boards 106AH' or 108AH' and 106$c$H' or 108$c$H'. Fiber optic module 2562 further includes vertical printed circuit boards 106$b$V' or 108$b$V' and 106$d$V' or 108$d$V' including opto-electronic devices coupled thereto in a through hole mount configuration.

While a two-by-two array of fiber optic channels was illustrated within the fiber optic modules illustrated in FIGS. 25A–25I, an n-by-n array of fiber optic channels may be incorporated into a fiber optic module.

FIGS. 26A–26B, 27A–27B, 28, and 29 illustrate n-by-n arrays of fiber optic channels for fiber optic modules.

Figure 26A:
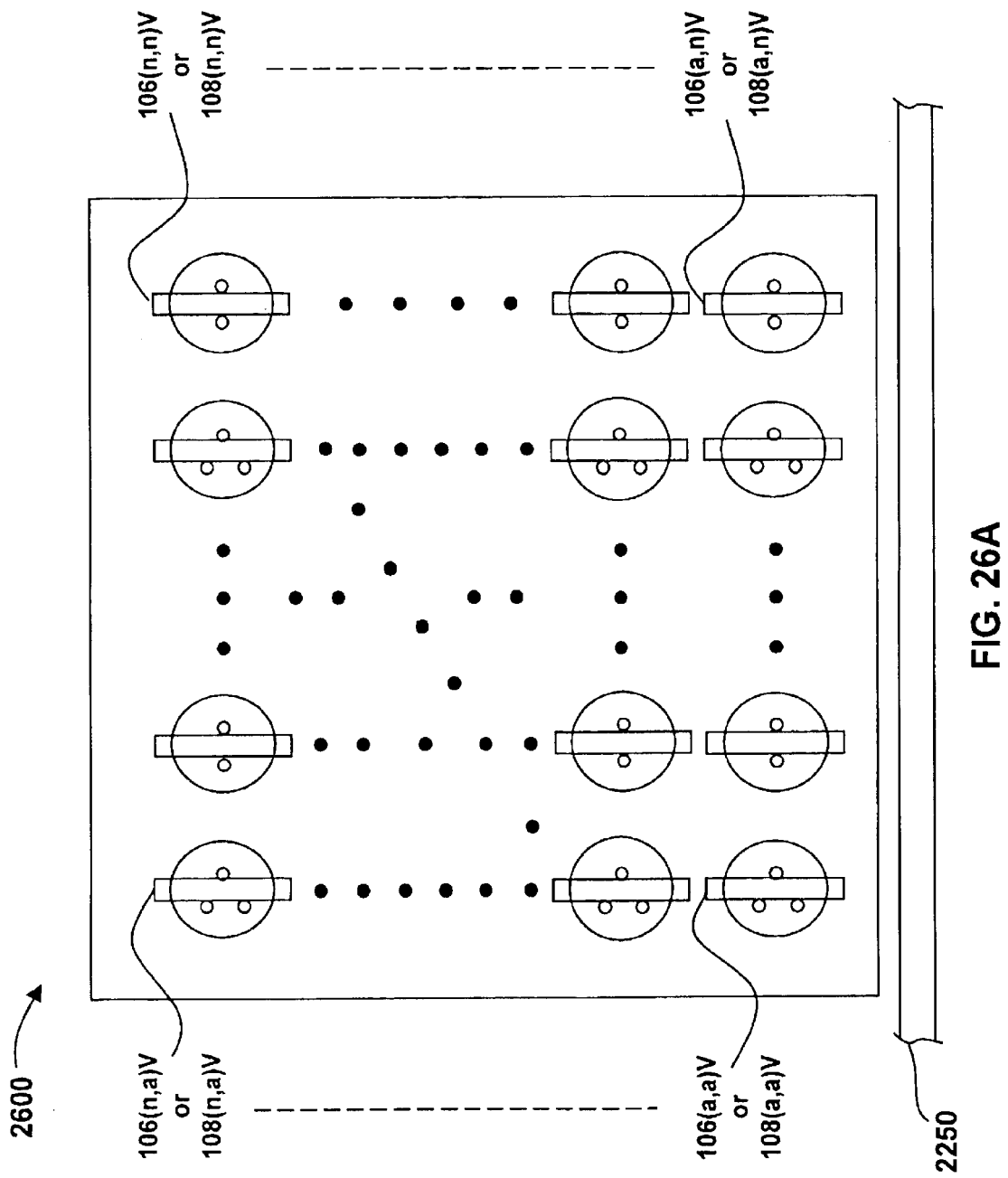
FIG. 26A illustrates a rear cross sectional view of an end by end array fiber optic communication channels as an alternate embodiment of the invention.
Figure 26B:
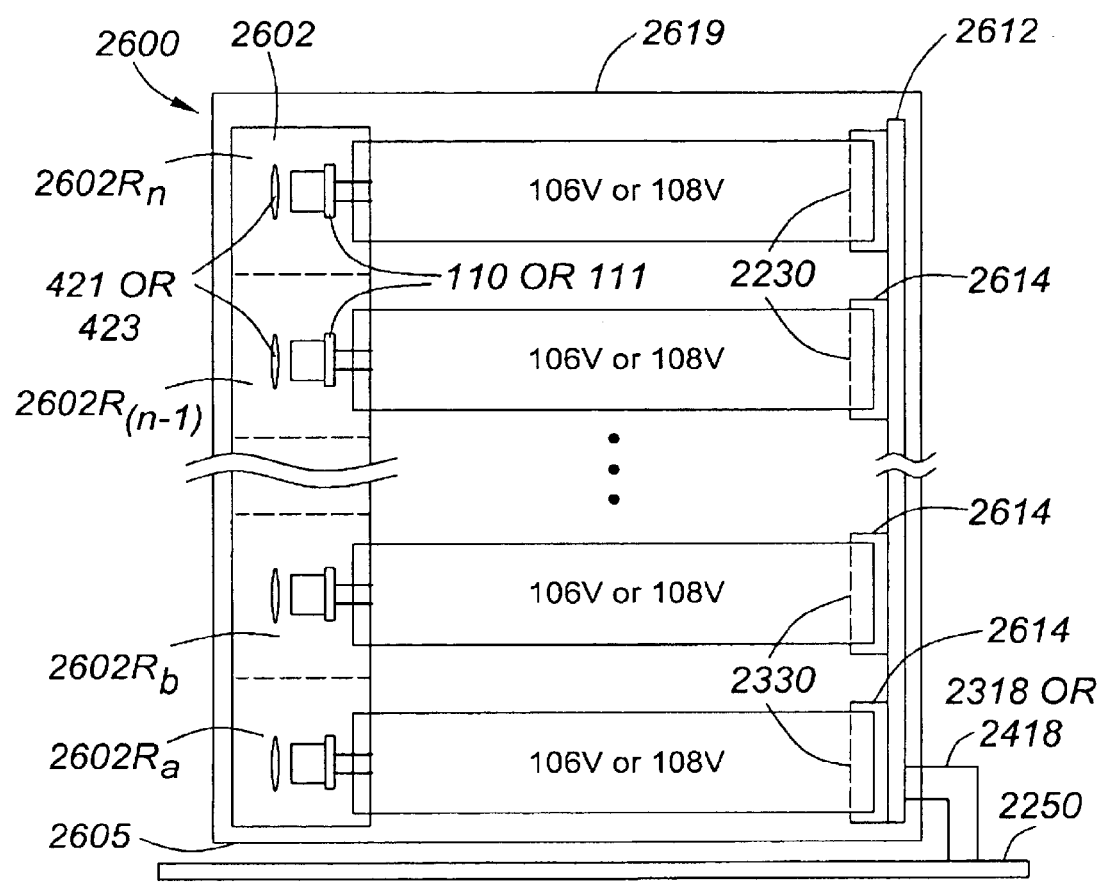
FIG. 26B illustrates a side cut-away view of the invention of FIG. 26A.

Referring now to FIG. 26A and 26B, an n-by-n array of fiber optic channels is illustrated in a fiber optic module 2600. The fiber optic module 2600 includes n-by-n vertical printed circuit boards 106$(a,a)$V or 108$(a,a)$V through 106$(n,n)$V or 108$(n,n)$V. Fiber optic module 2600 includes a plurality of n-by-n vertical printed circuit boards 106V or 108V. Each of the plurality of n-by-n vertical printed circuit boards 106V or 108V are respectively in parallel with one another and the optical axes of the respective optoelectronic devices coupled thereto. The opto-electronic device may be straddle mount mounted as shown in FIG. 2600 or may be through hole mounted as shown and described in previous Figures.

Referring now to FIG. 26B, a cross-sectional side view of the fiber optic module 2600 is illustrated. Fiber optic module 2600 includes a housing or cover 2619, a base or cover 2605, an optical block 2602, a miniature back plane 2612 and a plurality of vertical printed circuit boards 106V or 108V for the respective receive or transmit channel. The optical block 2602 may be separated into individual rows or individual optical blocks for each respective fiber optic channel. In one embodiment the optical block is in the form of a plurality of rays of optical blocks 2602Ra–2602Rn. Each of the rows including the plurality of lenses 421 and 423 align with the optical axes of the respective receive 110 or transmitter 111 of the opto-electronic device. The plurality of vertical printed circuit boards includes an edge connector 2230 coupling into edge connectors 2614 of the back plane 2612. The edge connectors 2614 and edge connection of the printed circuit boards 2230 are similar to the edge connectors previously described with reference to FIGS. 23A–23C. The back plane 2612 further includes pins and an electrical connector 2318 or 2418 for coupling to the host printed circuit board 2250. The optical blocks 2602 further include openings to receive the opto-electronic devices of each respective printed circuit board and may include a slot to align and couple with the edge of the printed circuit boards.

Figure 27A:
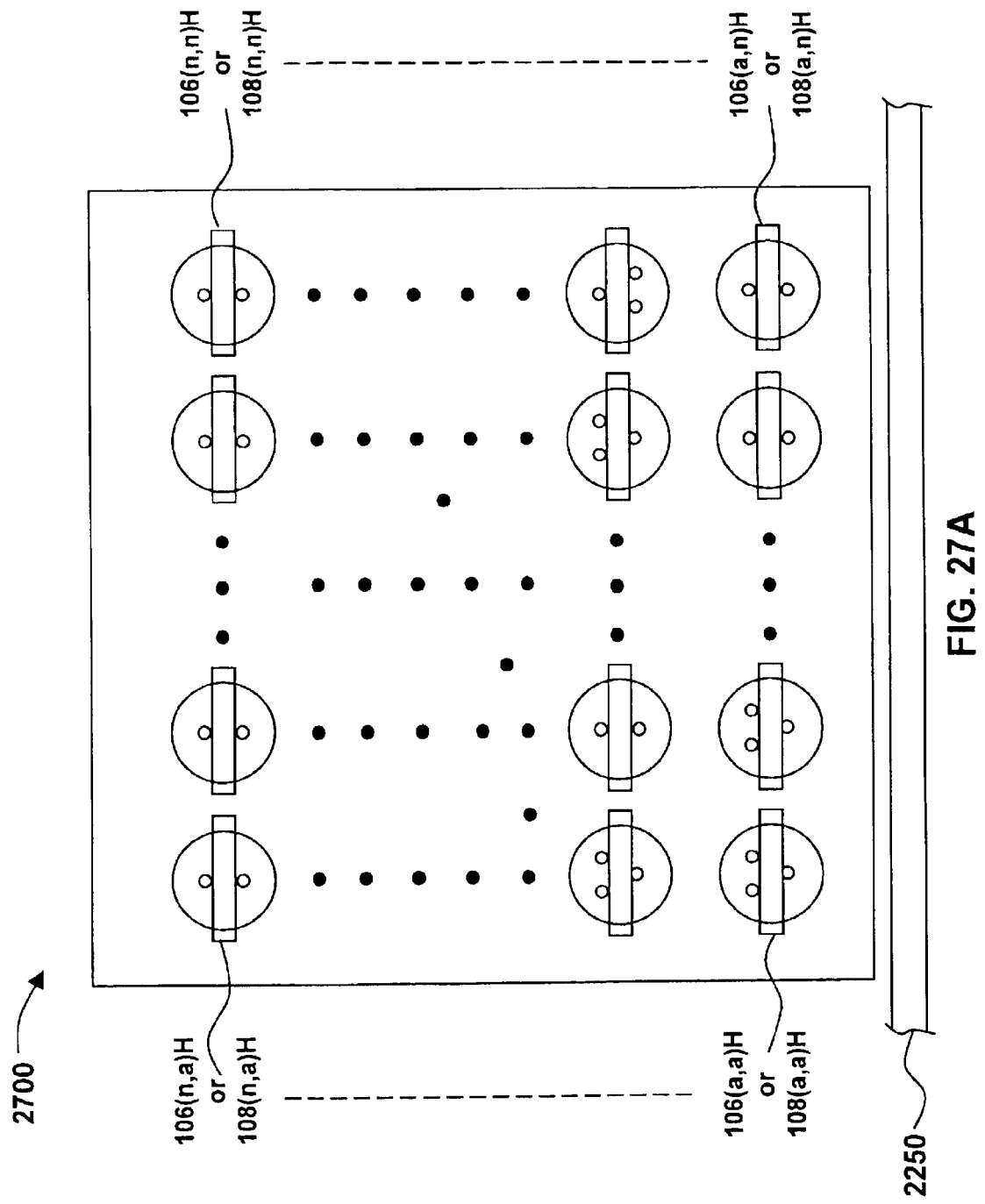
FIG. 27A illustrates a rear cross sectional view of an assembled alternate embodiment of the invention of FIG. 26A.

Referring now to FIG. 27A, an alternate embodiment of the n-by-n fiber optic module is illustrated. In FIG. 27A fiber optic module 2700 is illustrated including an n-by-n array of horizontal printed circuit boards and their respective opto-electronic devices coupled thereto. The horizontal printed circuit boards may be receiver or transmit boards 106(a,a)H or 108(a,a)H through 106(n,n)H or 108(n,n)H.

Figure 27B:
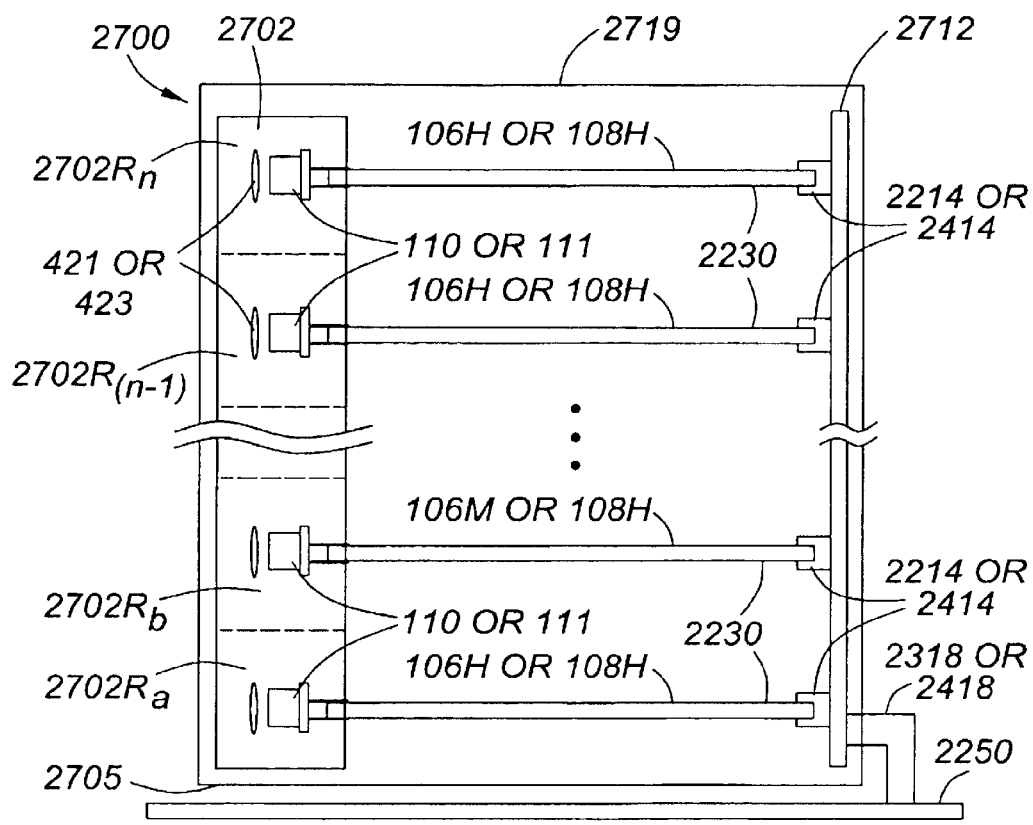
FIG. 27B illustrates a side view of the invention of FIG. 27A.

Referring now to FIG. 27B, a cross-sectional side view of the fiber optic module 2700 is illustrated. Fiber optic module 2700 includes an optical block 2702, a plurality of printed circuit boards 106H or 108H arrayed in an n-by-n array, a miniature back plane 2712, a housing 2719 and a base 2705. The optical block 2702 may be arranged into a plurality of rays of optical blocks including rays 2702Ra-27Rn. Each of the rows including a plurality of lenses 421 or 423 for coupling respectively to the optical axis of the optoelectronic devices. Each of the plurality of horizontal printed circuit boards includes an opto-electronic device coupled thereto at one end and a nudge connector at the other end. Each of the edge connectors 2230 of the respective printed circuit boards couples to the edge connector 2214 or 2414 of the back plane 2712. The back plane 2712 includes a plurality of edge connectors 2214 or 2414, a plurality of traces coupled thereto for coupling between the edge connectors 2414 and pins or electrical connector 2218 or 2418.

The pins or electrical connector 2218 or 2418 are coupled to openings or a connector of the host printed circuit board 2250.

Figure 28:
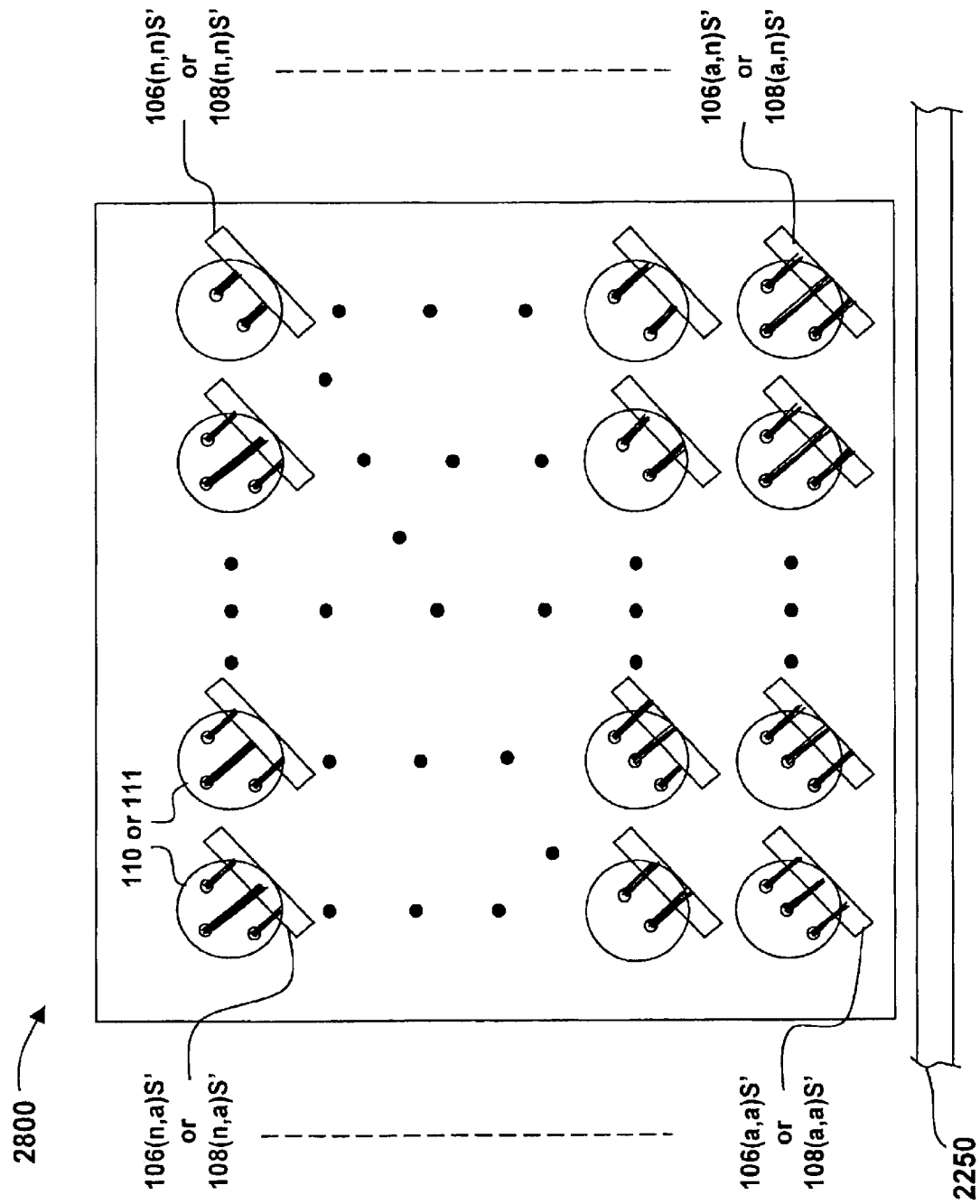
FIG. 28 illustrates a cross-sectional view of an assembled alternate embodiment of the invention.

Referring now to FIG. 28, an alternate embodiment of the n-by-n array of fiber optic channels is illustrated by the fiber optic module 2800. The fiber optic module 2800 includes an n-by-n array of slanted printed circuit boards 106(a,a)S' or 108(a,a)S' through 106(n,n)S' or 108(n,n)S'. Each of the plurality of slanted printed circuit boards includes an opto-electronic device 110 or 111 coupled thereto in a through hole mount configuration. The plurality of printed circuit boards are slanted with respect to the host printed circuit board is 2250 as illustrated in FIG. 28.

Figure 29:
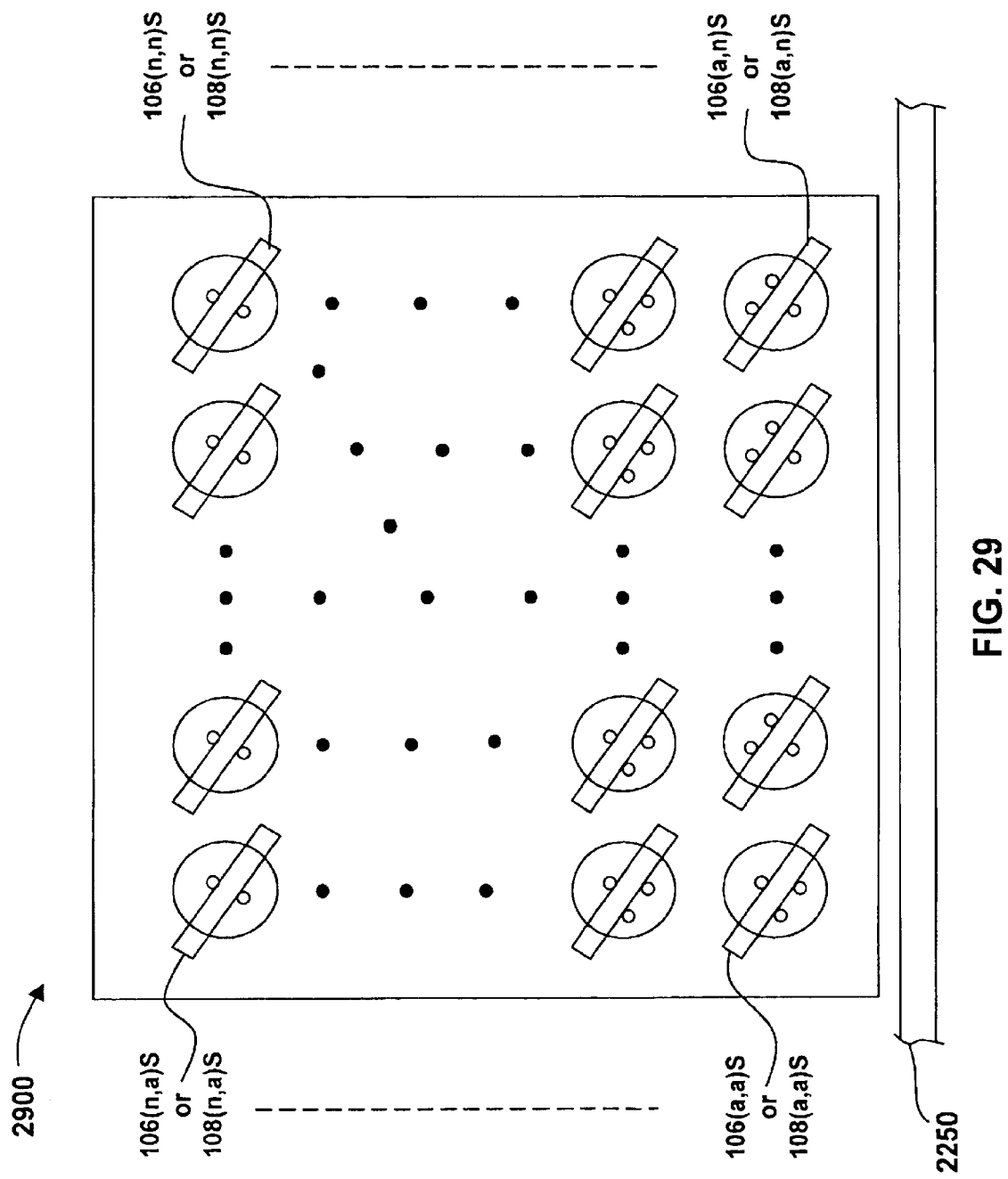
FIG. 29 illustrates a rear cross sectional view of an assembled alternate embodiment of the invention.

Referring now to FIG. 29, an alternate embodiment of an n-by-n array of fiber optic channels for a fiber optic module are illustrated. In FIG. 29, fiber optic module 2900 is illustrated including an n-by-n array of slanted printed circuit boards. The n-by-n array of slanted printed circuit boards include opto-electronic devices coupled thereto using a straddle mount configuration. Fiber optic module 2900 includes slanted printed circuit boards 106(a,a)S or 108(a, a)S through 106(n,n)S or 108(n,n)S for the respective receive or transmit printed circuit boards. In this manner, an n-by-n array of fiber optic channels can be supported within a fiber optic module. In the alternate embodiments of the n-by-n array, the fiber optic modules include elements illustrated in FIGS. 26B and 27B but for the angle and orientation of the printed circuit boards and the edge connectors 2214 or 2414.

Figure 30:
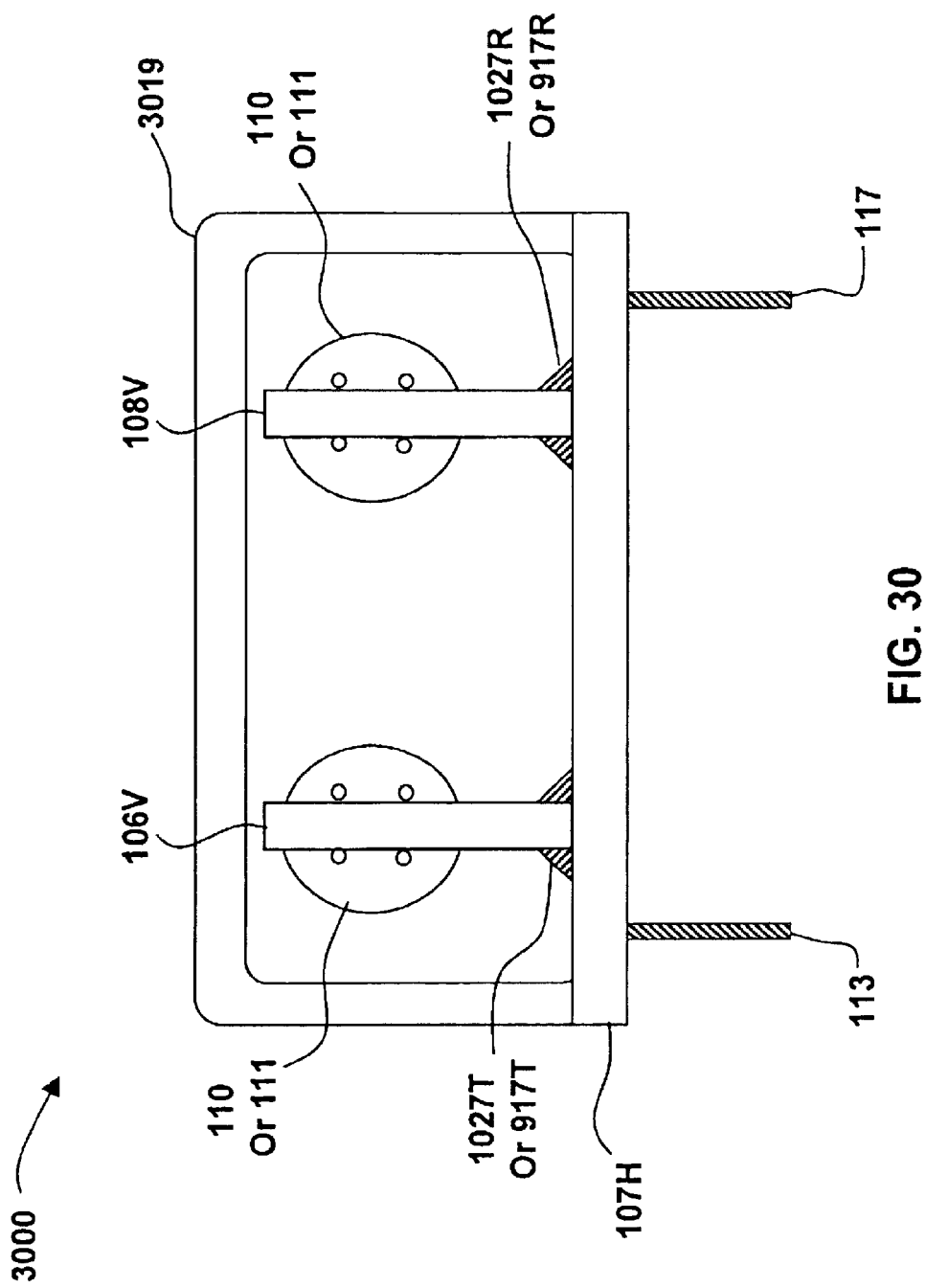
FIG. 30 is a cross-sectional view of a fiber optic module according to another embodiment of the present invention.

Referring now to FIG. 30, fiber optic module 3000 is illustrated. Fiber optic module 3000 includes two vertical printed circuit boards and a horizontal printed circuit board without a base. Fiber optic module 3000 includes a cover or housing 3019, a vertical printed circuit board 106V, a vertical printed circuit board 108V, and a horizontal printed circuit board 107H. A horizontal printed circuit board 107H acts similar to a base plate providing support for the vertical printed circuit boards 106V and 108V. The horizontal printed circuit board 107H includes pins 113 and 117 to couple to a host printed circuit board. The vertical printed circuit boards 106V and 108V couple electrically to the horizontal printed circuit board 107H similarly to that previously described when connecting one printed circuit board to another. The vertical printed circuit board 106V includes a first optic electronic device 110 or 111 coupled thereto. The vertical printed circuit board 108V includes a second optic electronic device 110 or 111 coupled thereto. In one embodiment in the first and second optical electronic devices are coupled to the respective vertical printed circuit boards using a straddle mount configuration. The cover or housing 3019 maybe formed of a metal or connector material in order to shield the electronics of the printed circuit boards of electro magnetic interference. The cover or housing 3019 couples to the horizontal printed circuit board 107H.

Figure 31:
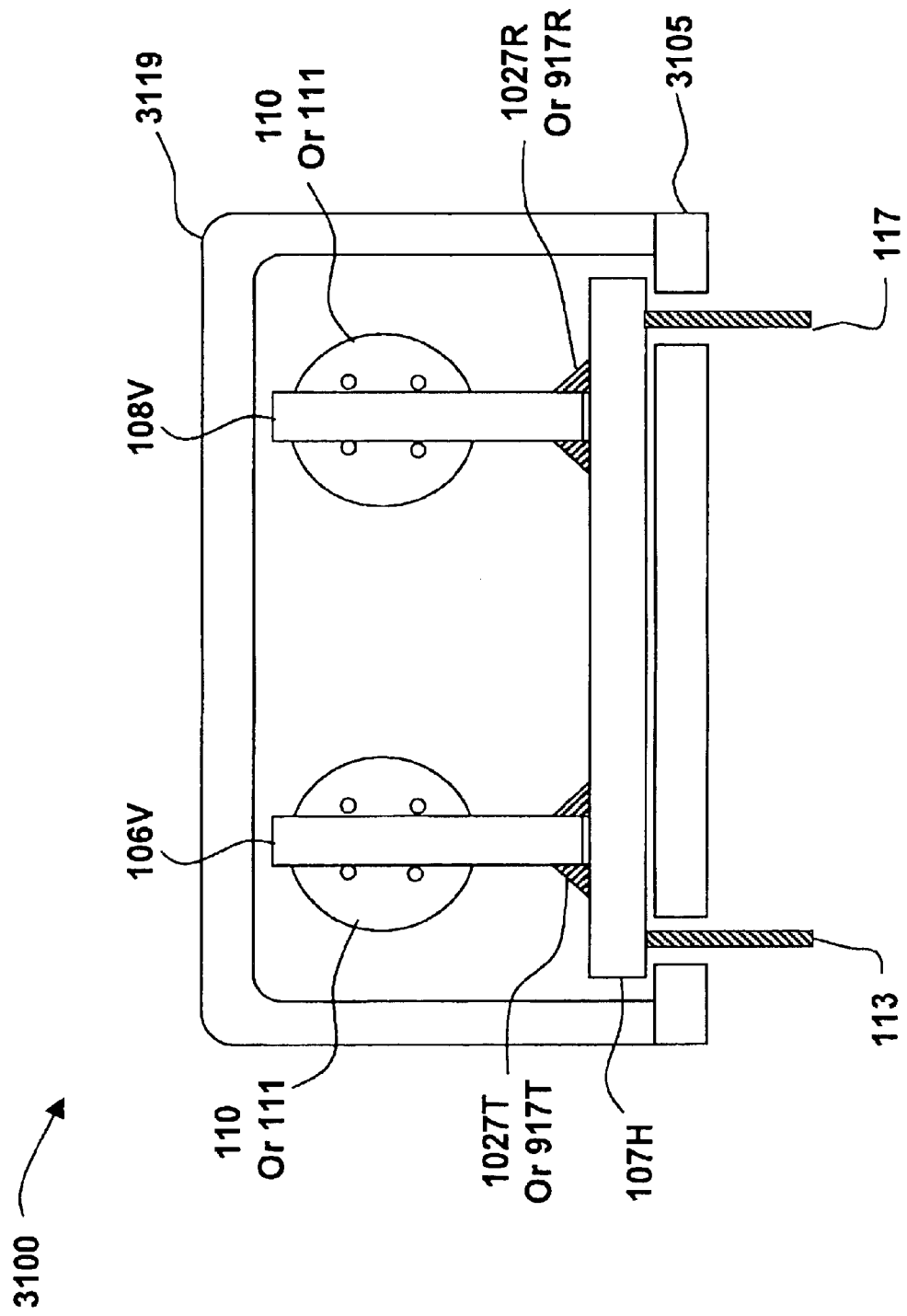
FIG. 31 is a cross-sectional view of a fiber optic module according to another embodiment of the present invention.

Referring now to FIG. 31, fiber optic module 3100 is illustrated. Fiber optic module 3100 includes two vertical printed circuit boards with a horizontal printed circuit board and a base plate or base. Fiber optic module 3100 includes a cover or housing 3019, a base 3105, a vertical printed circuit board 106V, a vertical printed circuit board 108V, and a horizontal printed circuit board 107H. The vertical printed circuit board 106V and 108V couple electrically to the horizontal printed circuit board 107H. The horizontal printed circuit 107H pins 113 and 117 protruded through openings in the base 3105. The first vertical printed circuit board 106V includes a first optic electronic device 110 or 111 coupled thereto. The second vertical printed circuit board 108V includes a second optic electronic device 110 or 111 coupled thereto. In one embodiment the optic electronic devices are coupled to the vertical printed circuit boards using a straddle mount configuration. The cover or housing 3119 couples to the base 3105.

Figure 32:
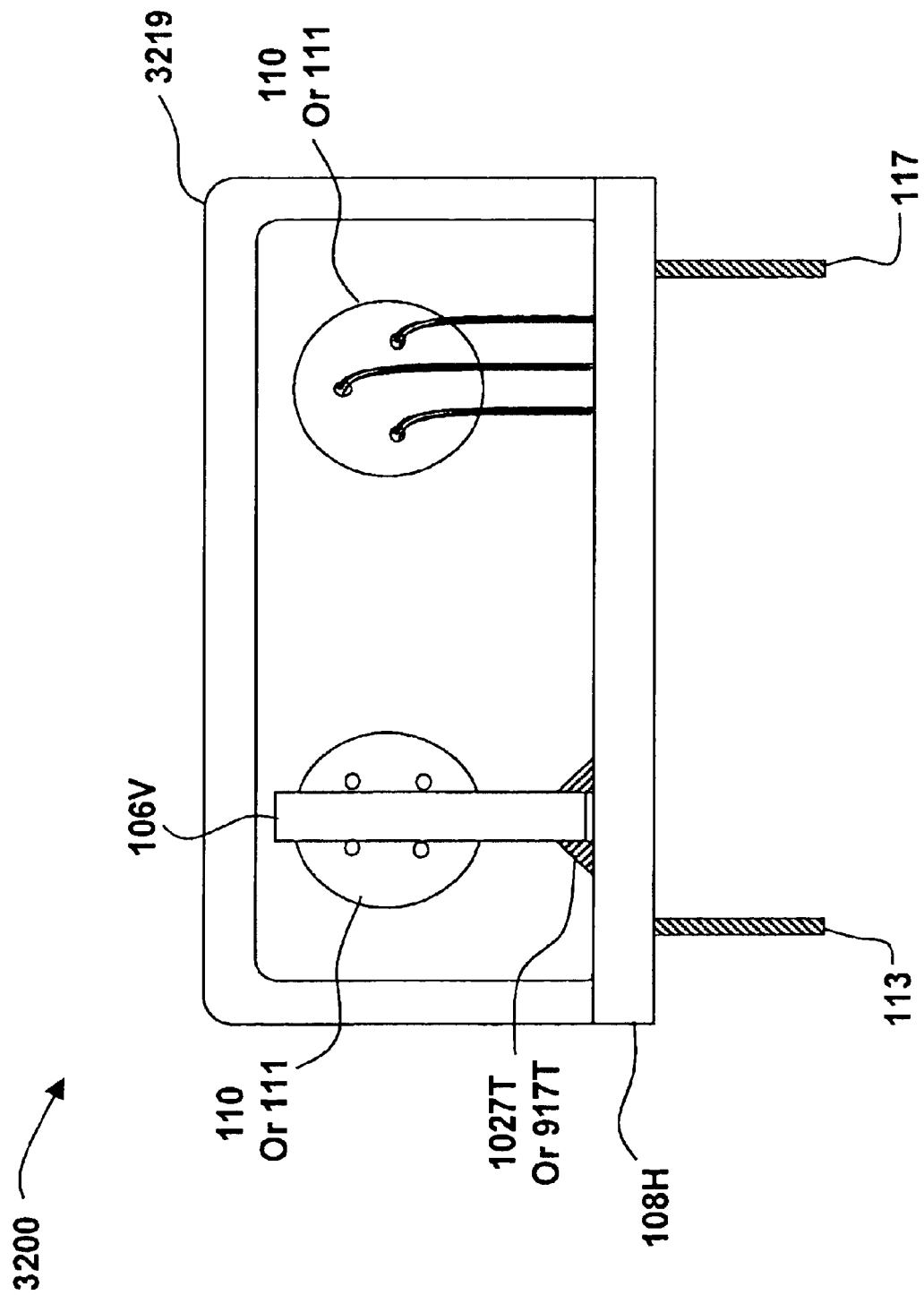
FIG. 32 is a cross-sectional view of a fiber optic module according to another embodiment of the present invention.

Referring now to FIG. 32, fiber optic module 3200 is illustrated. Fiber optic module 3200 includes one vertical printed circuit board and one horizontal printed circuit board without a base plate or base. Fiber optic module 3200 includes a cover or housing 3019, a vertical printed circuit board 106V, and a horizontal printed circuit board 108H. The vertical printed circuit board 106V includes a first optic electronic device 110 or 111 coupled thereto. A horizontal printed circuit board 108H includes a second optic electronic device 110 or 111 coupled thereto. A horizontal printed circuit board 108H includes pins 113 and 117 coupled to a host printed circuit board. In one embodiment the first optic electronic device is couple to the vertical printed circuit board 106V using a straddle mount configuration. In one embodiment the second optic electronic device is coupled to the horizontal printed circuit board 108H using a through hole mount configuration. The vertical printed circuit board 106V couples to the horizontal printed circuit board 108H or signals to pass between the pins and the vertical printed circuit board 106V. The cover or housing 3219 couples to the horizontal printed circuit board 108H.

Figure 33:
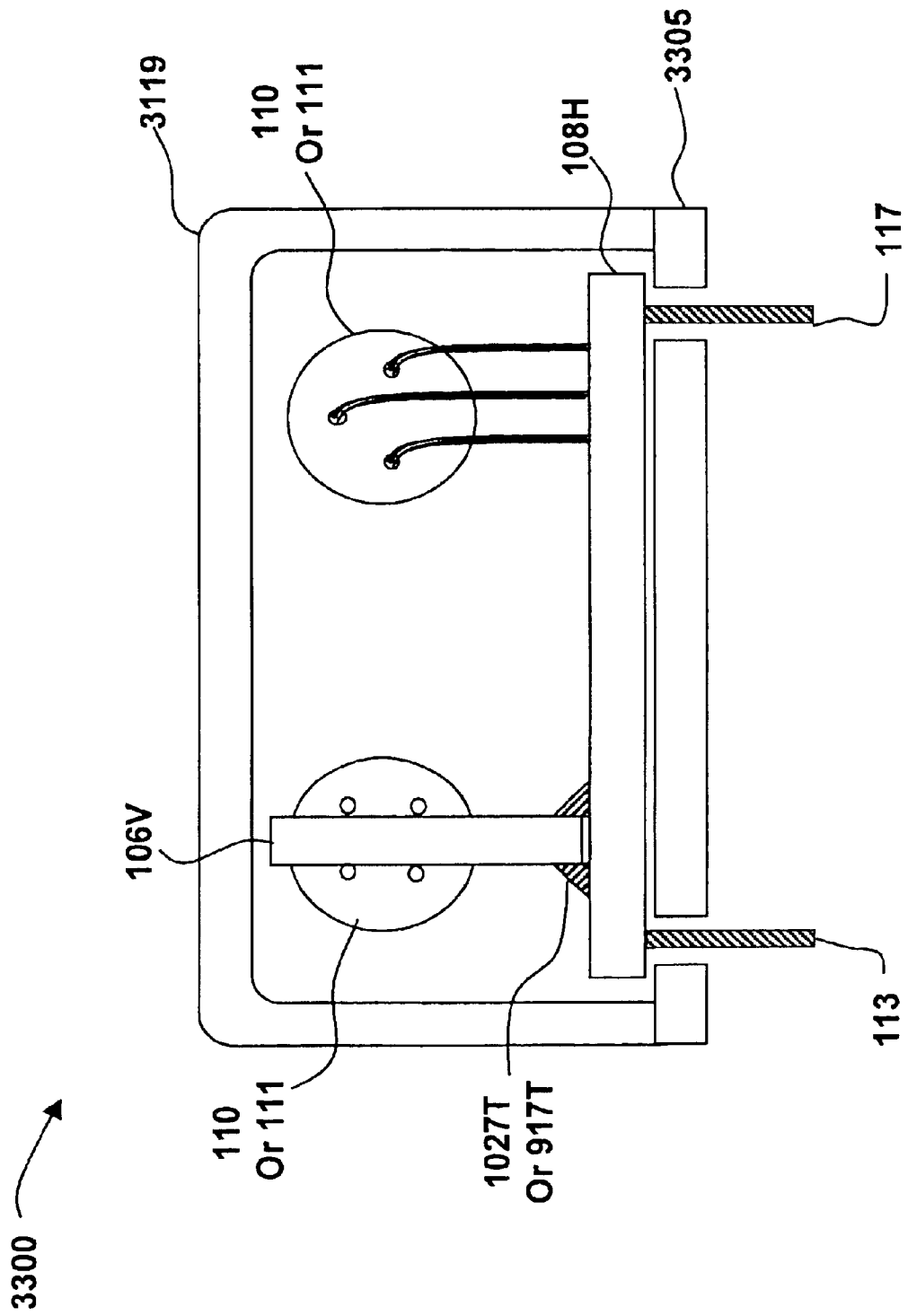
FIG. 33 is a cross-sectional view of a fiber optic module according to another embodiment of the present invention.

Referring now to FIG. 33, fiber optic module 3300 is illustrated. Fiber optic module 3300 includes one vertical printed circuit, one horizontal printed circuit board and a base plate. Fiber optic module 3300 includes a base 3305, a cover or housing 3319, a vertical printed circuit board 106V, and a horizontal printed circuit board 108H. The vertical printed circuit 106V includes a first optic electronic device 110 or 111 coupled thereto. The horizontal printed circuit board 108H includes a second optic electronic device 110 or 111 coupled thereto. The horizontal printed circuit board includes pins 113 and 117 protruding through openings in the base 3305. The cover or housing 3319 couples to the base 3305.

The vertical printed boards in FIGS. 30–33 couple to the horizontal printed circuit board using an electrical connection such as solder joints 917R or 917T previously described herein with reference to FIGS. 9A and 9B or pin headers 1027R and 1027T previously described with reference to FIGS. 10A–10B. The solder joints or pin headers can be on one side or both sides of the vertical printed circuit board coupling to the horizontal printed circuit board.

The previous detailed description describes fiber optic modules as including a receiver and transmitter. However, one of ordinary skill can see that a fiber optic module may be a receiver only or a transmitter only such that only one board type is used. Additionally, the previous detailed description described one receive channel and one transmit channel. However, the invention may be extended to a plurality of channels in parallel which can be all transmit channels, all receive channels or both receive and transmit channels into multiple fiber optic cables.

As those of ordinary skill will recognize, the invention has a number of advantages over the prior art.

The preferred embodiments of the invention are thus described. While the invention has been described in particular embodiments, the invention should not be construed as limited by such embodiments, but rather construed according to the claims that follow below.

What is claimed is:

1. A fiber optic module for coupling photons between optoelectronic devices and optical fibers, the fiber optic module comprising:
 a base;
 a first horizontal printed circuit board (PCB) arranged horizontally with the base and parallel to a first optical axis of a first optoelectronic device, the first optoelectronic device having terminals coupled to the first horizontal printed circuit board; and
 a second vertical printed circuit board (PCB) coupled to the first horizontal PCB arranged at a perpendicular angle with the base and parallel to a second optical axis of a second optoelectronic device, the second optoelectronic device having terminals coupled to the second vertical printed circuit board.

2. The fiber optic module of claim 1 further comprising: a housing coupled to the base.

3. The fiber optic module of claim 2 wherein, the housing is a shielded housing to encase the first and second printed circuit boards to reduce electromagnetic interference (EMI).

4. The fiber optic module of claim 3 wherein, the housing has an inner septum to separate the fiber optic module into a first side and a second side and the inner septum is a conductive shield to reduce crosstalk electromagnetic radiation.

5. The fiber optic module of claim 1 wherein, the base has a first and second opening;
 the first horizontal printed circuit board has a plurality of pins extending through the first opening in the base to couple to a host printed circuit board; and
 the second vertical printed circuit board has a plurality of pins extending through the second opening in the base to couple to the host printed circuit board.

6. The fiber optic module of claim 5 wherein, the first and second opening in the base are a plurality of pin holes in the base.

7. The fiber optic module of claim 5 wherein, the first and second opening in the base are a first and second cutout in the base.

8. The fiber optic module of claim 5 wherein, the first horizontal and second vertical printed circuit boards further comprise:
 electrical components coupled between the first optoelectronic device and the plurality of pins of the first printed circuit board and between the second optoelectronic device and the plurality of pins of the second printed circuit board, the electrical components for controlling the first and second optoelectronic devices.

9. the fiber optic module of claim 1 wherein, the first horizontal printed circuit board further comprises:
 a ground plane to reduce electro-magnetic fields generated by the electrical components.

10. The fiber optic module of claim 1 wherein, the second vertical printed circuit board further comprises:
 a ground plane to reduce electro-magnetic fields generated by the electrical components.

11. The fiber optic module of claim 1 further comprising:
 a first optical block coupled to the first optoelectronic device, the first optical block having a first opening to receive the first optoelectronic device, and
 a first lens to couple photons between the first optoelectronic device and an optical fiber.

12. The fiber optic module of claim 11 further comprising: a nose coupled to the base, the nose to receive an optical fiber connector and to hold an optical fiber substantially fixed and aligned with an optical opening of the optical block.

13. The fiber optic module of claim 12 further comprising: a nose shield surrounding the nose to reduce electromagnetic interference.

14. The fiber optic module of claim 1 further comprising:
 a second optical block coupled to the second optoelectronic device, the second optical block having
 a second opening to receive the second optoelectronic device, and
 a second lens to couple photons between the second optoelectronic device and an optical fiber.

15. The fiber optic module of claim 11 further comprising:
 a second optical block coupled to the second optoelectronic device, the second optical block having
 a second opening to receive the second optoelectronic device, and
 a second lens to couple photons between the second optoelectronic device and an optical fiber.

16. The fiber optic module of claim 1 further comprising:
 an optical block coupled to the first and second optoelectronic devices, the optical block having first and second openings to receive the first and second optoelectronic devices, a first lens to couple photons between the first optoelectronic device and a first optical fiber, and a second lens to couple photons between the second optoelectronic device and a second optical fiber.

17. The fiber optic module of claim 16, wherein, the first lens of the optical block to launch photons into the first optical fiber from the first optoelectronic device.

18. The fiber optic module of claim 16, wherein, the second lens of the optical block is a focusing lens to receive photons from the second optical fiber and to couple them to the second optoelectronic device.

19. The fiber optic module of claim 16 further comprising: a nose coupled to the base, the nose to receive an optical fiber connector and to hold an optical fiber substantially fixed and aligned with an optical opening of the optical block.

20. the fiber optic module of claim 19 further comprising: a nose shield surrounding the nose to reduce electromagnetic interference.

21. The fiber optic module of claim 13, wherein, the first optoelectronic device is a photodetector.

22. The fiber optic module of claim 13, wherein, the second optoelectronic device is an emitter.

23. The fiber optic module of claim 22, wherein, the emitter is a vertical cavity surface emitting laser (VCSEL).

24. A fiber optic module for coupling photons between optoelectronic devices and optical fibers, the fiber optic module comprising:

a horizontal printed circuit board (PCB) arranged horizontally having a first plurality of pins and a second plurality of pins to couple to a host printed circuit board and a first optoelectronic device having terminals coupled to the horizontal printed circuit board, a vertical printed circuit board (PCB) coupled to the horizontal printed circuit board arranged at a perpendicular angle and parallel to a second optical axis of a second optoelectronic device, the second optoelectronic device having terminals coupled to the vertical printed circuit board; and a housing coupled to the horizontal printed circuit board.

25. The fiber optic module of claim 24 wherein, the housing is a shielded housing to encase the horizontal and the vertical printed circuit boards to reduce electromagnetic interference (EMI).

26. The fiber optic module of claim 24 wherein, the horizontal printed circuit board is arranged parallel to a first optical axis of the first optoelectronic device.

27. A fiber optic module for coupling photons between optoelectronic devices and optical fibers, the fiber optic module comprising:

a base having a first opening and a second opening;

a horizontal printed circuit board (PCB) arranged horizontally having a first plurality of pins protruding through the first opening and a second plurality of pins protruding through the second opening to couple to a host printed circuit board and a first optoelectronic device having terminals coupled to the horizontal printed circuit board, a vertical printed circuit board (PCB) coupled to the horizontal printed circuit board arranged at a perpendicular angle and parallel to a second optical axis of a second optoelectronic device, the second optoelectronic device having terminals coupled to the vertical printed circuit board; and a housing coupled to the base.

28. The fiber optic module of claim 27 wherein, the housing is a shielded housing to encase the horizontal and the vertical printed circuit boards to reduce electromagnetic interference (EMI).

29. The fiber optic module of claim 27 wherein, the horizontal printed circuit board is arranged parallel to a first optical axis of the first optoelectronic device.

* * * * *